US012587214B2

(12) United States Patent
Berman et al.

(10) Patent No.: US 12,587,214 B2
(45) Date of Patent: Mar. 24, 2026

(54) ADAPTIVE GENERALIZED CONCATENATED CODES FOR LOW POWER ECC WITH VARYING OVERHEAD

(71) Applicant: SAMSUNG ELECTRONICS CO., LTD., Suwon-si (KR)

(72) Inventors: Amit Berman, Binyamina (IL); Ariel Doubchak, Hertsliya (IL); Avner Dor, Kfar Saba (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 63 days.

(21) Appl. No.: 18/734,663

(22) Filed: Jun. 5, 2024

(65) Prior Publication Data

US 2025/0379598 A1      Dec. 11, 2025

(51) Int. Cl.
*H03M 13/35*      (2006.01)
*H03M 13/15*      (2006.01)
*H03M 13/29*      (2006.01)

(52) U.S. Cl.
CPC ....... *H03M 13/35* (2013.01); *H03M 13/1515* (2013.01); *H03M 13/2906* (2013.01)

(58) Field of Classification Search
None
See application file for complete search history.

(56) References Cited

U.S. PATENT DOCUMENTS

| | | | |
|---|---|---|---|
| 11,581,906 B1 | 2/2023 | Berman et al. | |
| 2002/0119803 A1* | 8/2002 | Bitterlich .............. | H04L 1/0066 455/552.1 |

| | | | |
|---|---|---|---|
| 2006/0107161 A1* | 5/2006 | Varshney .......... | H03M 13/6362 714/746 |
| 2009/0040081 A1* | 2/2009 | Yang ................... | H03M 13/033 341/94 |
| 2009/0232408 A1* | 9/2009 | Meany .................. | H04N 19/91 714/751 |

(Continued)

FOREIGN PATENT DOCUMENTS

| | | |
|---|---|---|
| WO | 2017/061892 A1 | 4/2017 |

OTHER PUBLICATIONS

O. Bredtmann and A. Czylwik, "Linear unequal error protection codes based on terminated convolutional codes, " in Journal of Communications and Networks, vol. 17, No. 1, pp. 12-20, Feb. 2015, (Year: 2015).*

(Continued)

*Primary Examiner* — Daniel F. McMahon
(74) *Attorney, Agent, or Firm* — Sughrue Mion, PLLC

(57)      ABSTRACT

Methods, devices, and systems for controlling a storage system, including: a storage device configured to store a plurality of code words; and at least one processor configured to: obtain information bits; encode the information bits using a first code to obtain a first plurality of code words; encode the first plurality of code words using a second code to generate a second plurality of code words; update the first plurality of code words based on the second plurality of code words to generate an adaptive generalized concatenated code (A-GCC) code word; and store the A-GCC code word in the storage device, wherein each code word of the first plurality of code words is encoded using a different error protection level.

20 Claims, 26 Drawing Sheets

(56)                   References Cited

U.S. PATENT DOCUMENTS

| | | | |
|---|---|---|---|
| 2012/0051208 A1* | 3/2012 | Li | H04J 13/0011 |
| | | | 370/208 |
| 2012/0096330 A1* | 4/2012 | Przybylski | H03M 13/036 |
| | | | 714/763 |
| 2015/0039970 A1 | 2/2015 | Sharon et al. | |
| 2015/0295593 A1* | 10/2015 | Trifonov | H03M 13/3746 |
| | | | 714/776 |
| 2016/0072527 A1* | 3/2016 | Suzuki | H03M 13/3738 |
| | | | 714/755 |

OTHER PUBLICATIONS

R. V. Cox and C. E. W. Sundberg, "An efficient adaptive circular Viterbi algorithm for decoding generalized tailbiting convolutional codes," in IEEE Transactions on Vehicular Technology, vol. 43, No. 1, pp. 57-68, Feb. 1994, (Year: 1994).*

Extended European Search Report dated Oct. 18, 2025, issued by the European Patent Office in European Application No. 25180179. 1.

Al-Askary et al. "Rate Adaptive Generalized Concatenated Codes for Wireless Communication", IEEE, 2005, XP031332934, pp. 1-6 (6 pages total).

* cited by examiner

Figure 12A:
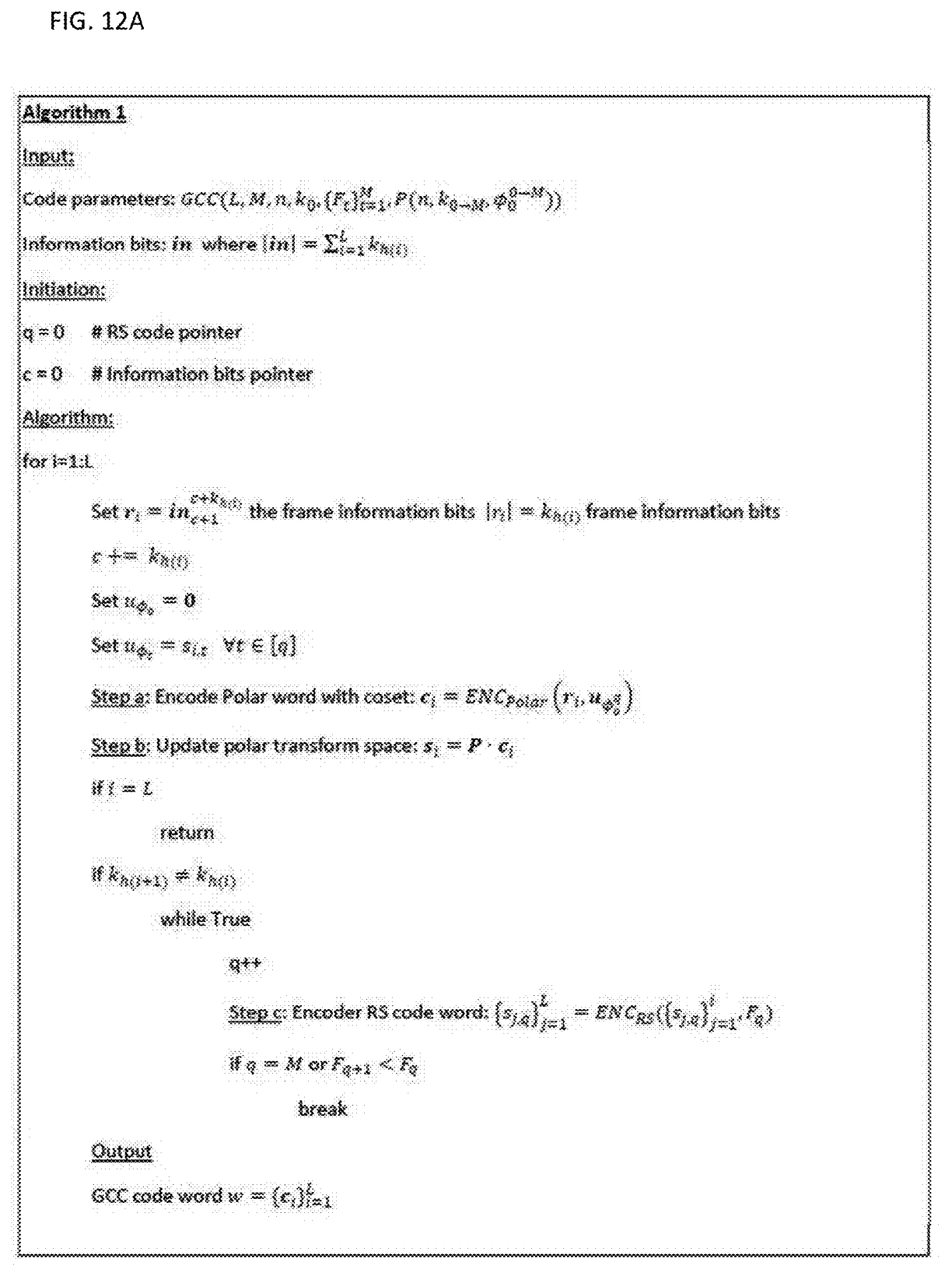

Algorithm 1

Input:

Code parameters: $GCC(L, M, n, k_0, \{F_c\}_{c=1}^M, P(n, k_{0 \to M}, \phi_0^{0-M}))$ Information bits: $in$ where $|in| = \sum_{i=1}^{L} k_{h(i)}$

Initiation:

$q = 0$    # RS code pointer $c = 0$    # Information bits pointer

Algorithm:

for i=1:L

Set $r_i = in_{c+1}^{c+k_{h(i)}}$ the frame information bits $|r_i| = k_{h(i)}$ frame information bits $c \mathrel{+}= k_{h(i)}$ Set $u_{\phi_0} = 0$ Set $u_{\phi_t} = s_{i,t} \;\; \forall t \in [q]$ <u>Step a</u>: Encode Polar word with coset: $c_i = ENC_{Polar}\left(r_i, u_{\phi_0^q}\right)$ <u>Step b</u>: Update polar transform space: $s_i = P \cdot c_i$ if $i = L$ return if $k_{h(i+1)} \neq k_{h(i)}$ while True q++

<u>Step c</u>: Encoder RS code word: $\{s_{j,q}\}_{j=1}^{L} = ENC_{RS}(\{s_{j,q}\}_{j=1}^{i}, F_q)$ if $q = M$ or $F_{q+1} < F_q$ break <u>Output</u>

GCC code word $w = \{c_i\}_{i=1}^{L}$

FIG. 12C

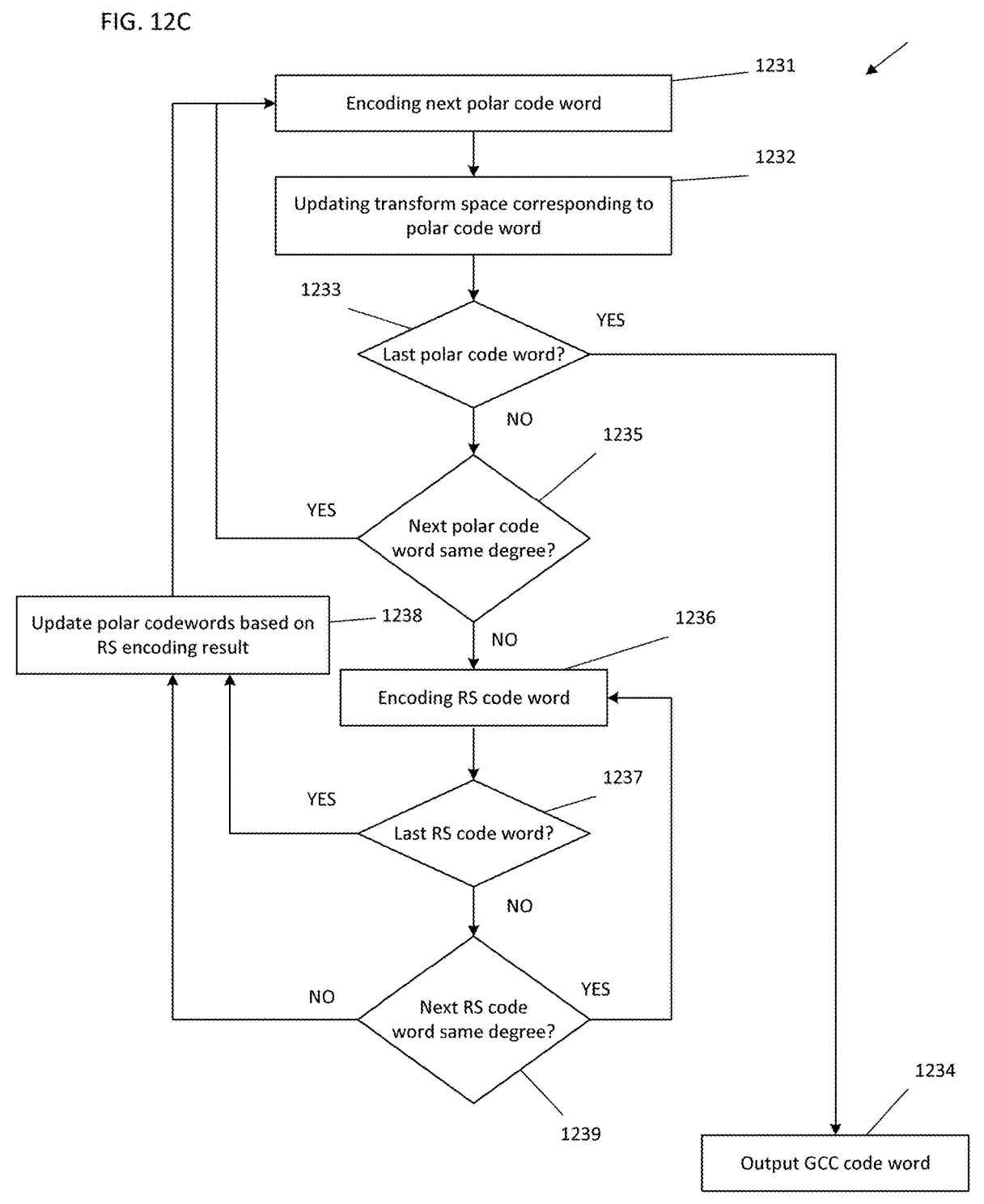

Encoding next polar code word — 1231

Updating transform space corresponding to polar code word — 1232

1233 — Last polar code word?
YES

NO

1235 — Next polar code word same degree?
YES

NO

Update polar codewords based on RS encoding result — 1238

Encoding RS code word — 1236

1237 — Last RS code word?
YES

NO

Next RS code word same degree?
NO    YES
1239

Output GCC code word — 1234

FIG. 13A

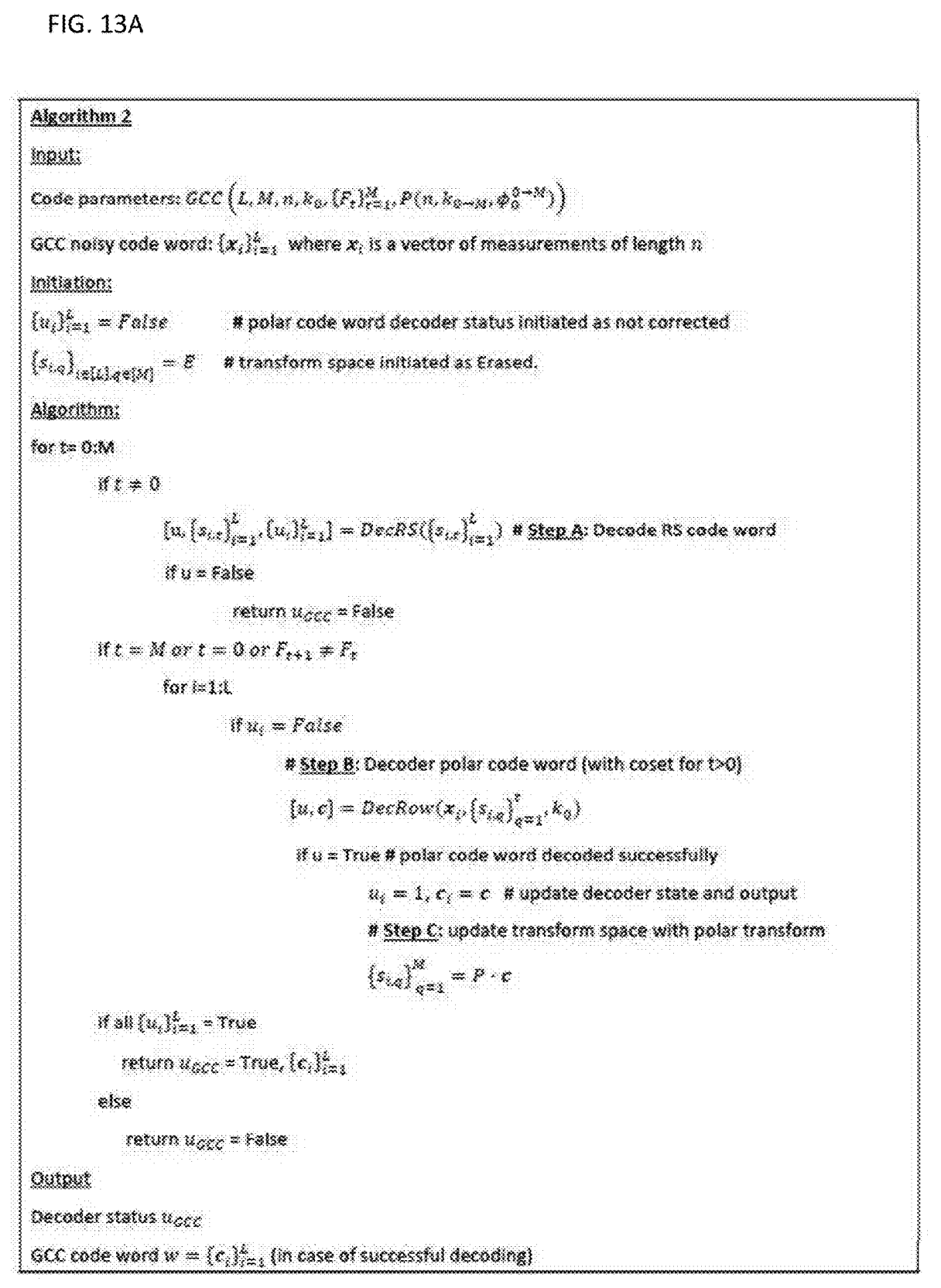

Algorithm 2

Input:

Code parameters: $GCC\left(L, M, n, k_0, \{F_t\}_{t=1}^M, P(n, k_{0 \to M}, \phi_q^{0 \to M})\right)$ GCC noisy code word: $\{x_i\}_{i=1}^L$ where $x_i$ is a vector of measurements of length $n$ Initiation:

$\{u_i\}_{i=1}^L = False$       # polar code word decoder status initiated as not corrected $\{s_{i,q}\}_{i\in[L],q\in[M]} = \varepsilon$   # transform space initiated as Erased.

Algorithm:

for t= 0:M if $t \ne 0$ $[u, \{s_{i,t}\}_{i=1}^L, \{u_i\}_{i=1}^L] = DecRS(\{s_{i,t}\}_{i=1}^L)$ # Step A: Decode RS code word if u = False return $u_{GCC}$ = False if $t = M$ or $t = 0$ or $F_{t+1} \ne F_t$ for i=1:L if $u_i = False$

Step B: Decoder polar code word (with coset for t>0)

$[u, c] = DecRow(x_i, \{s_{i,q}\}_{q=1}^t, k_0)$ if u = True # polar code word decoded successfully $u_i = 1, c_i = c$  # update decoder state and output

Step C: update transform space with polar transform $\{s_{i,q}\}_{q=1}^M = P \cdot c$ If all $\{u_i\}_{i=1}^L$ = True return $u_{GCC}$ = True, $\{c_i\}_{i=1}^L$ else return $u_{GCC}$ = False Output Decoder status $u_{GCC}$ GCC code word $w = \{c_i\}_{i=1}^L$ (in case of successful decoding)

Figure 15A:
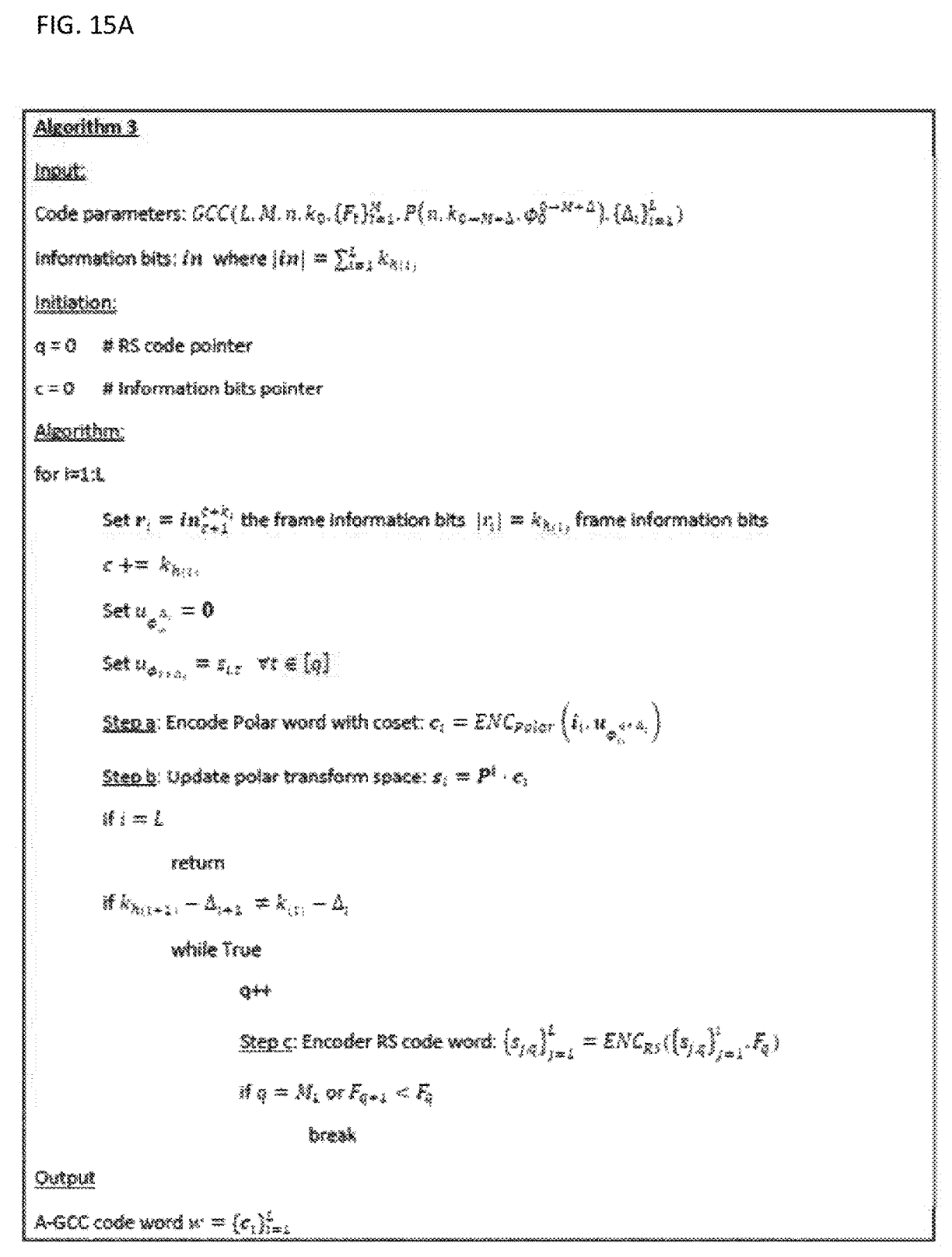

Algorithm 3

Input:

Code parameters: $GCC(L, M, n, k_0, \{F_t\}_{t=1}^{N}, P(n, k_0 - N - \Delta, \Phi_\delta^{-N + \Delta}), \{\Delta_i\}_{i=1}^{L})$ Information bits: $In$ where $|In| = \sum_{i=1}^{L} k_{N(i)}$

Initiation:

$q = 0$    # RS code pointer $c = 0$    # Information bits pointer

Algorithm:

for i=1:L

Set $r_i = In_{c+1}^{c+k_i}$ the frame information bits $|r_i| = k_{N(i)}$, frame information bits $c += k_{N(i)}$ Set $u_{\Phi_\delta^{\Delta_i}} = 0$ Set $u_{\Phi_{t+\Delta_i}} = s_{i,t}$   $\forall t \in [q]$ <u>Step a</u>: Encode Polar word with coset: $c_i = ENC_{Polar}\left(i_i, u_{\Phi_i^{q+\Delta_i}}\right)$ <u>Step b</u>: Update polar transform space: $s_i = P^i \cdot c_i$ if $i = L$ return if $k_{N(i+1)} - \Delta_{i+1} \neq k_{(i)} - \Delta_i$ while True q++

<u>Step c</u>: Encoder RS code word: $\{s_{j,q}\}_{j=i}^{L} = ENC_{RS}(\{s_{j,q}\}_{j=1}^{i}, F_q)$ if $q = N_i$ or $F_{q+1} < F_q$ break

Output

A-GCC code word $w = \{c_i\}_{i=1}^{L}$

Figure 16:
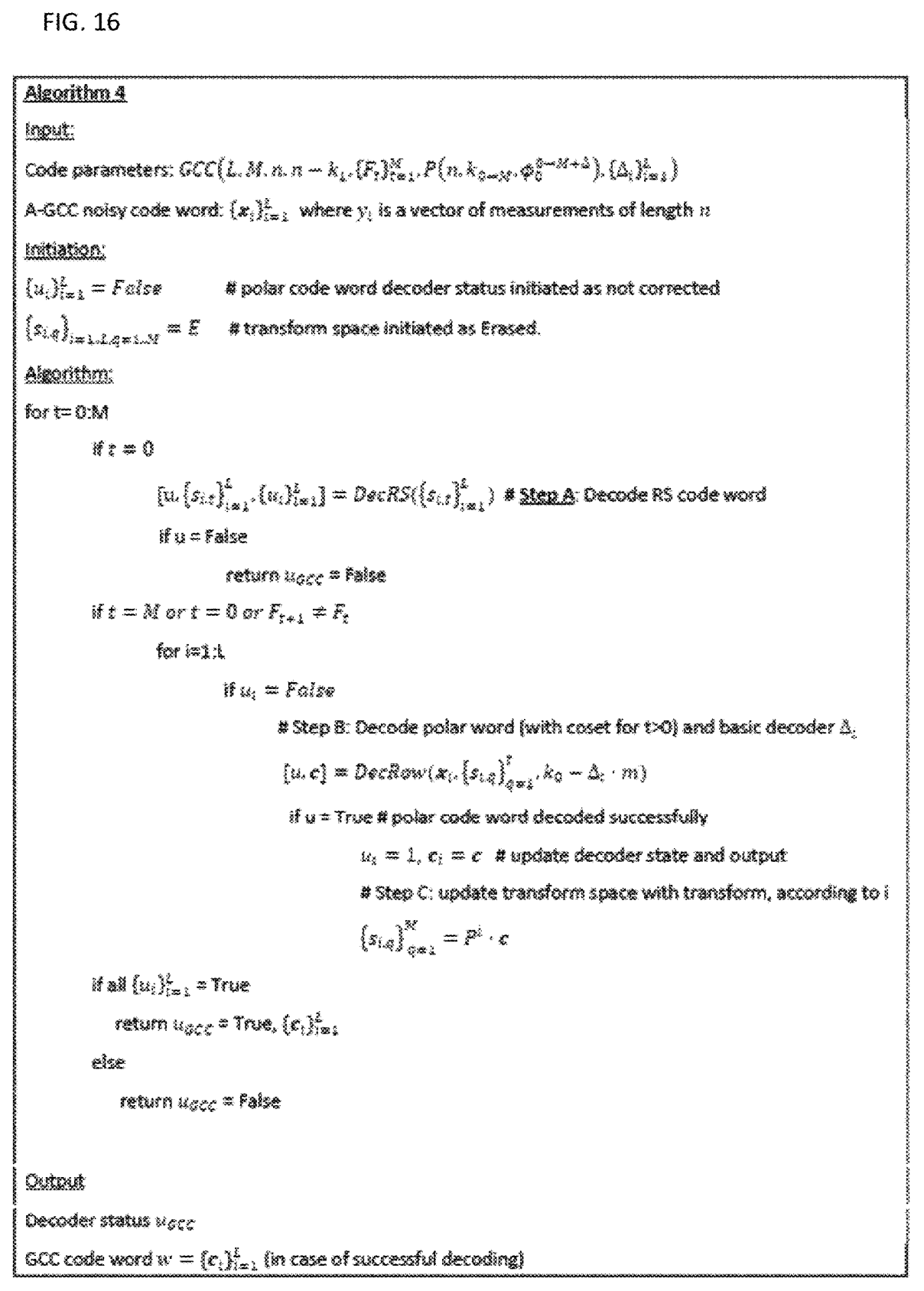

<u>Algorithm 4</u>

<u>Input:</u>

Code parameters: $GCC\left(L, M, n, n - k_t, \{F_t\}_{t=1}^{M}, P\left(n, k_{0\rightarrow M}, \phi_0^{0\rightarrow M+\Delta}\right), \{\Delta_i\}_{i=1}^{L}\right)$ A-GCC noisy code word: $\{x_i\}_{i=1}^{L}$ where $y_i$ is a vector of measurements of length $n$ <u>Initiation:</u>

$\{u_i\}_{i=1}^{L} = False$         # polar code word decoder status initiated as not corrected $\{s_{i,q}\}_{i=1,L,q=1,M} = E$     # transform space initiated as Erased.

<u>Algorithm:</u> for t = 0:M if $t = 0$ $[u, \{s_{i,t}\}_{i=1}^{L}, \{u_i\}_{i=1}^{L}] = DecRS(\{s_{i,t}\}_{i=1}^{L})$   # <u>Step A</u>: Decode RS code word if u = False return $u_{GCC} = False$ if $t = M$ or $t = 0$ or $F_{t+1} \neq F_t$ for i=1:L if $u_i = False$

Step B: Decode polar word (with coset for t>0) and basic decoder $\Delta_i$.

$[u, c] = DecRow\left(x_i, \{s_{i,q}\}_{q=1}^{t}, k_0 - \Delta_i \cdot m\right)$ if u = True # polar code word decoded successfully $u_i = 1, c_i = c$  # update decoder state and output

Step C: update transform space with transform, according to i $\{s_{i,q}\}_{q=1}^{M} = P^i \cdot c$ if all $\{u_i\}_{i=1}^{L} = True$ return $u_{GCC} = True, \{c_i\}_{i=1}^{L}$ else return $u_{GCC} = False$ <u>Output</u>

Decoder status $u_{GCC}$

GCC code word $w = \{c_i\}_{i=1}^{L}$ (in case of successful decoding)

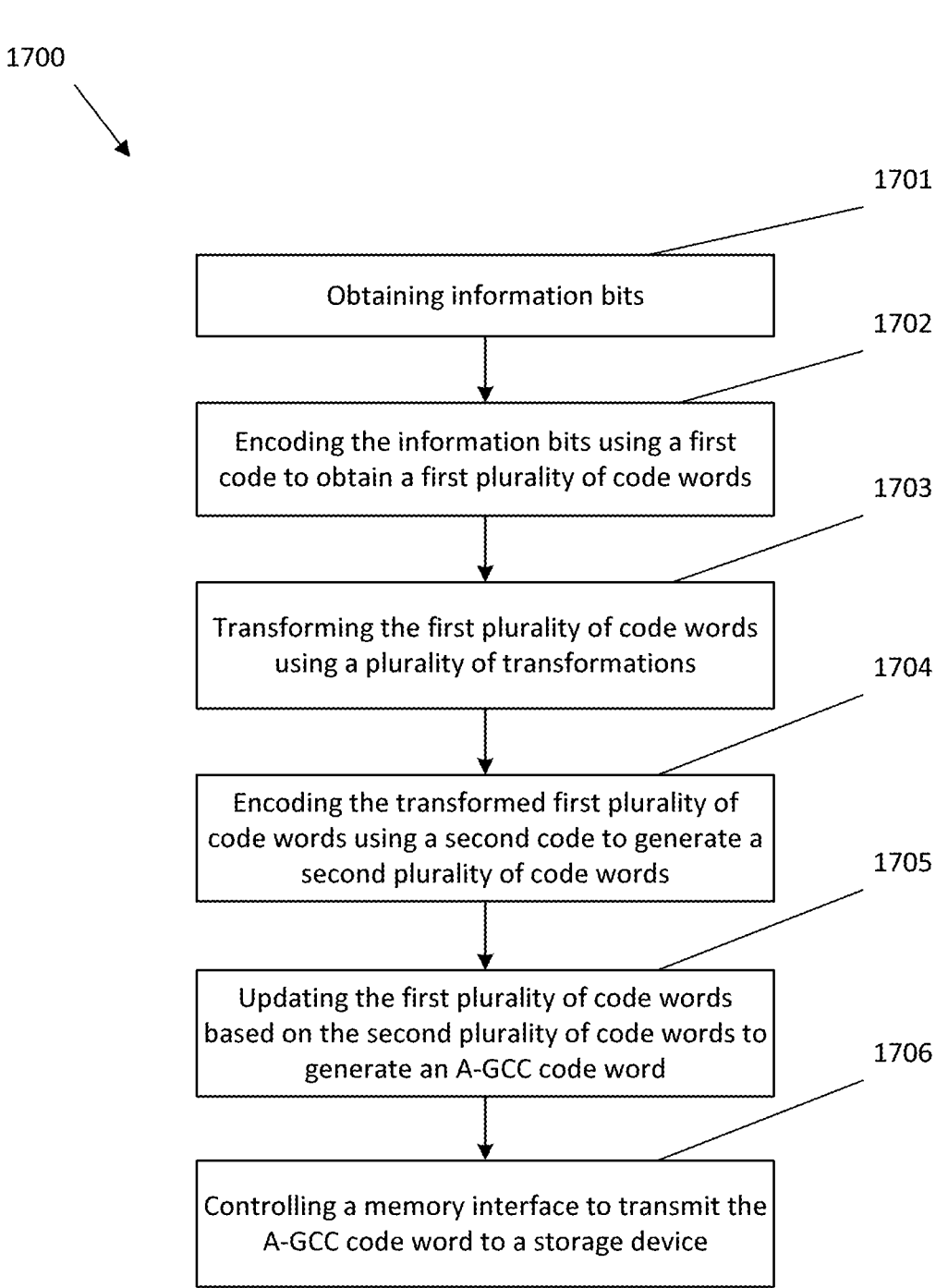

1701

Obtaining information bits

1702

Encoding the information bits using a first code to obtain a first plurality of code words

1703

Transforming the first plurality of code words using a plurality of transformations

1704

Encoding the transformed first plurality of code words using a second code to generate a second plurality of code words

1705

Updating the first plurality of code words based on the second plurality of code words to generate an A-GCC code word

1706

Controlling a memory interface to transmit the A-GCC code word to a storage device

ADAPTIVE GENERALIZED CONCATENATED CODES FOR LOW POWER ECC WITH VARYING OVERHEAD

BACKGROUND

1. Field

Apparatuses and methods consistent with embodiments relate to managing a storage device, more particularly error correction coding using adaptive generalized concatenated codes.

2. Description of Related Art

In general, a flash memory device may have a structure which includes blocks of word lines (WLs), where each WL includes bit lines (BLs). A memory cell may be formed at the intersection of a WL and a BL. To allow fast access, each WL may be broken up into random access units (RAUs). To allow high reliability access, each RAU may be protected with an Error Correction Code (ECC).

Within the flash memory device, some memory cells may have different behavior than others. For example, one or more memory cells may have higher error probability, and one or more other memory cells may have lower error probability.

Generalized concatenated codes (GCC) may refer to a family of ECCs which may be used in flash memory. A GCC code may have a symmetric behavior, and may therefore provide the same protection for each bit (or symbol) in a code word. This behavior may be sub-optimal in real applications, such as flash memory devices, and may cause performance loss.

SUMMARY

In accordance with an aspect of the disclosure, a storage system includes: a storage device configured to store a plurality of code words; and at least one processor configured to: obtain information bits; encode the information bits using a first code to obtain a first plurality of code words; encode the first plurality of code words using a second code to generate a second plurality of code words; update the first plurality of code words based on the second plurality of code words to generate an adaptive generalized concatenated code (A-GCC) code word; and store the A-GCC code word in the storage device, wherein each code word of the first plurality of code words is encoded using a different error protection level.

In accordance with an aspect of the disclosure, a device for encoding information bits for storage in a storage device includes: a memory interface configured to communicate with the storage device; and at least one processor configured to: obtain the information bits; encode the information bits using a first code to obtain a first plurality of code words; transform the first plurality of code words using a plurality of transformations, wherein each code word from among the first plurality of code words is transformed using a different transformation from among the plurality of transformations; encode the transformed first plurality of code words using a second code to generate a second plurality of code words; update the first plurality of code words based on the second plurality of code words to generate an adaptive generalized concatenated code (A-GCC) code word; and control the memory interface to transmit the A-GCC code word to the storage device.

In accordance with an aspect of the disclosure, a method of controlling a storage system, is executed by at least one processor and includes: obtaining information bits; encoding the information bits using a first code to obtain a first plurality of code words; encoding the first plurality of code words using a second code to generate a second plurality of code words; updating the first plurality of code words based on the second plurality of code words to generate an adaptive generalized concatenated code (A-GCC) code word; and storing the A-GCC code word in the storage device, wherein each code word of the first plurality of code words is encoded using a different error protection level.

In accordance with an aspect of the disclosure, a method for encoding information bits for storage in a storage device is executed by at least one processor and includes: obtaining the information bits; encoding the information bits using a first code to obtain a first plurality of code words; transforming the first plurality of code words using a plurality of transformations, wherein each code word from among the first plurality of code words is transformed using a different transformation from among the plurality of transformations; encoding the transformed first plurality of code words using a second code to generate a second plurality of code words; updating the first plurality of code words based on the second plurality of code words to generate an adaptive generalized concatenated code (A-GCC) code word; and controlling a memory interface to transmit the A-GCC code word to a storage device.

BRIEF DESCRIPTION OF DRAWINGS

The above and other aspects, features, and advantages of certain embodiments of the present disclosure will be more apparent from the following description taken in conjunction with the accompanying drawings, in which:

FIG. 12A illustrates an example of a sequential encoding algorithm which may be used to perform GCC encoding, according to embodiments;

FIG. 12C is a flowchart of an encoding process, according to embodiments;

FIG. 13A illustrates an example of a sequential decoding algorithm which may be used to perform GCC decoding, according to embodiments;

FIG. 15A illustrates an example of a sequential encoding algorithm which may be used to perform A-GCC encoding, according to embodiments;

FIG. 15C is a flowchart of an encoding process, according to embodiments;

FIG. 16 illustrates an example of a sequential decoding algorithm which may be used to perform A-GCC decoding, according to embodiments;

FIG. 17 is a flowchart of a process for controlling a storage system, according to embodiments.

DETAILED DESCRIPTION

Figure 1:
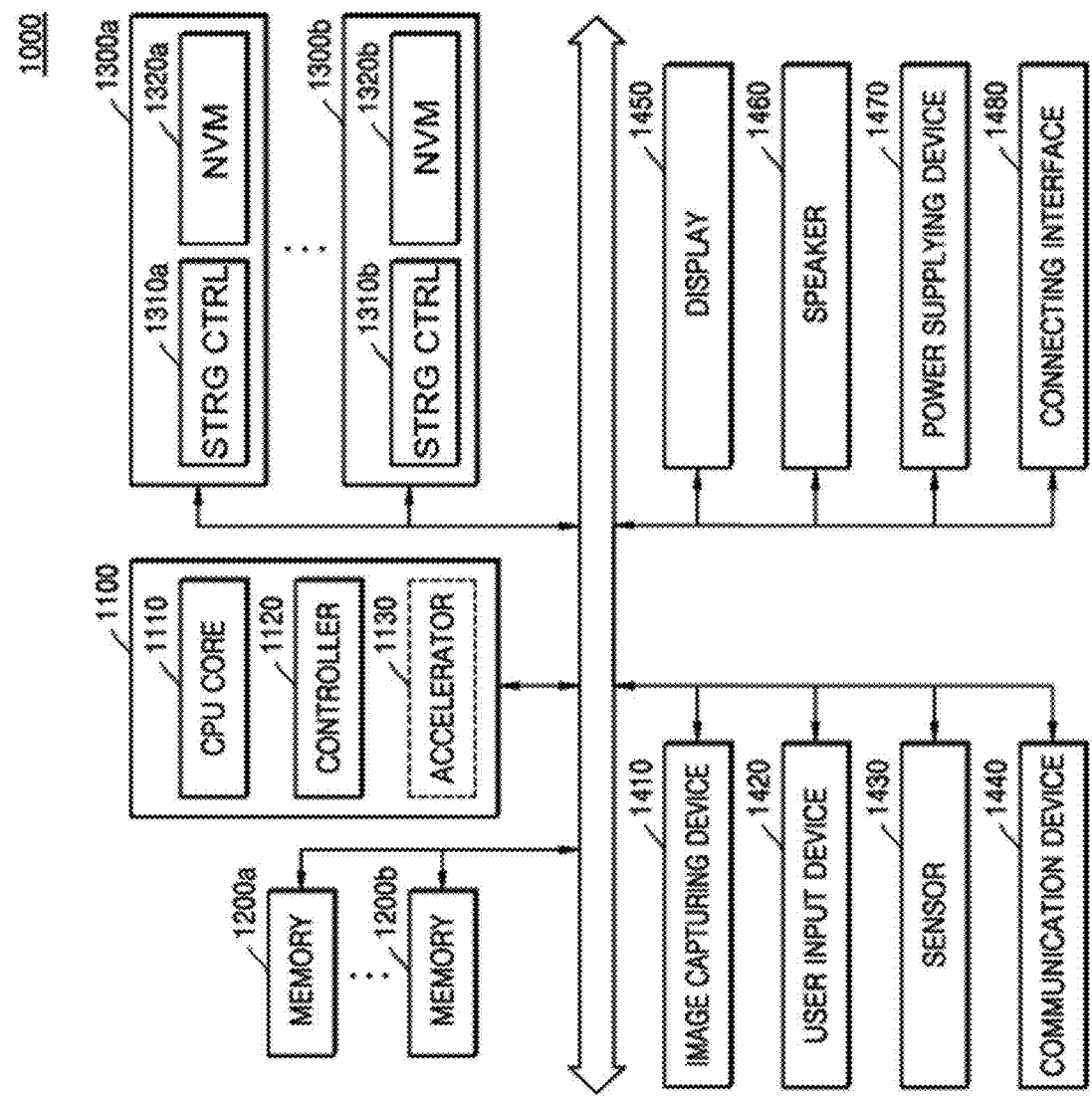
FIG. 1 is a block diagram of a computer system, according to embodiments.

In flash memory devices, data may be stored and read at a granularity of Random Access Unit (RAU). An error correction code (ECC) may be applied on the RAU data to provide fast read with high reliability.

Within the flash memory devices, some memory cells may have different behavior than others. For example, one or more memory cells may have higher error probability, and one or more other memory cells may have lower error probability.

Some ECCs which may be used in flash memory devices, for example generalized concatenated codes (GCC), may have a symmetric behavior, and may therefore provide the same protection for each bit (or symbol) in a code word. This behavior may be sub-optimal in real applications, such as flash memory devices, and may cause performance loss.

In information theory, various schemes may be used to compensate for a varying channel. One such scheme is the water filling scheme, in which it is possible to allocate to each channel bin a corresponding power, such that the total power is constrained to some value. In another scheme, which may be used for example in multiple-input multiple-output (MIMO) wireless communication, a different code rate may be allocated for each channel and encoded word. However, these schemes may not be applicable in flash memory devices. Therefore, there is a need for an ECC process which provides varying levels of protection which may be used in flash memory devices, and other similar devices for which the schemes discussed above may not be appropriate.

Accordingly, embodiments may relate to an Adaptive Generalized Concatenated Code (A-GCC), which may be suitable in various devices such as flash memory devices. In embodiments, an A-GCC code may be an extension of a GCC code, and may introduce a different protection for some chunks of bits (or symbols). According to embodiments, an A-GCC code word may be a single code word which may provide different local levels of protection in different parts of the code word. In embodiments, these different levels of protection may be provided without requiring changes such as power, or the use of several code words.

In embodiments, an A-GCC code may be an extension of a GCC code. An A-GCC code according to embodiments may include L constituent codes, each of length n, which may each be transmitted (or written in a flash memory device), on a set of channels, $$\{CH_i\}_{i=1}^{L}$$

having different channel quality ($Q(CH_i) \geq Q(CH_j) \forall i < j$). In embodiments, the constituent codes may be referred to as inner codes, and may include for example polar codes, Bose-Chaudhuri-Hocquenghem (BCH) codes, Reed-Solomon (RS) codes, other GCC codes, and other codes. In A-GCC codes according to embodiments, each constituent code word $c_i$ may have a different basic protection $\Delta_i$ suitable to the corresponding channel quality $Q(CH_i)$, and variable overhead that define the code dimension $k_{h(i)}$. For each constituent code word $c_i$ there may be a transform $P^i$ that may be used to generate a transform space. The additional overhead may constrain the transform space to include a set of M outer codes which may have variable protections, RS codes which may have variable protections $$\{F_t\}_{t=1}^{M},$$

or other codes such as polar codes and GCC codes.

Embodiments discussed below may relate to various constructions of an A-GCC code structure, and various methods of performing systematic encoding using A-GCC encoding algorithms. According to embodiments, the constituent codes and the code parameters of the A-GCC codes discussed herein may be selected according to different targets, for example correctability, complexity, power, etc. The A-GCC encoding and decoding algorithms discussed in below may include extensions of GCC systematic encoding and decoding algorithms, and may provide better protection with respect to different channel qualities while allowing tailored code parameters suitable for various channels and performance targets to be generated.

FIG. 1 is a diagram of a system 1000 to which embodiments may be applied. The system 1000 of FIG. 1 may be, for example, a mobile system, such as a portable communication terminal (e.g., a mobile phone), a smartphone, a tablet personal computer (PC), a wearable device, a healthcare device, or an Internet of things (IoT) device. However, the system 1000 of FIG. 1 is not necessarily limited to the mobile system and may be a PC, a laptop computer, a server, a media player, or an automotive device (e.g., a navigation device).

Referring to FIG. 1, the system 1000 may include a main processor 1100, memories (e.g., 1200*a* and 1200*b*), and storage devices (e.g., 1300*a* and 1300*b*). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and Non-Volatile Memories (NVMs) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, embodiments are not limited thereto, and the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of SSDs or memory cards, and may be removably combined with other components of the system 1000 through an interface, such as the connecting interface 1480 described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

Figure 2A:
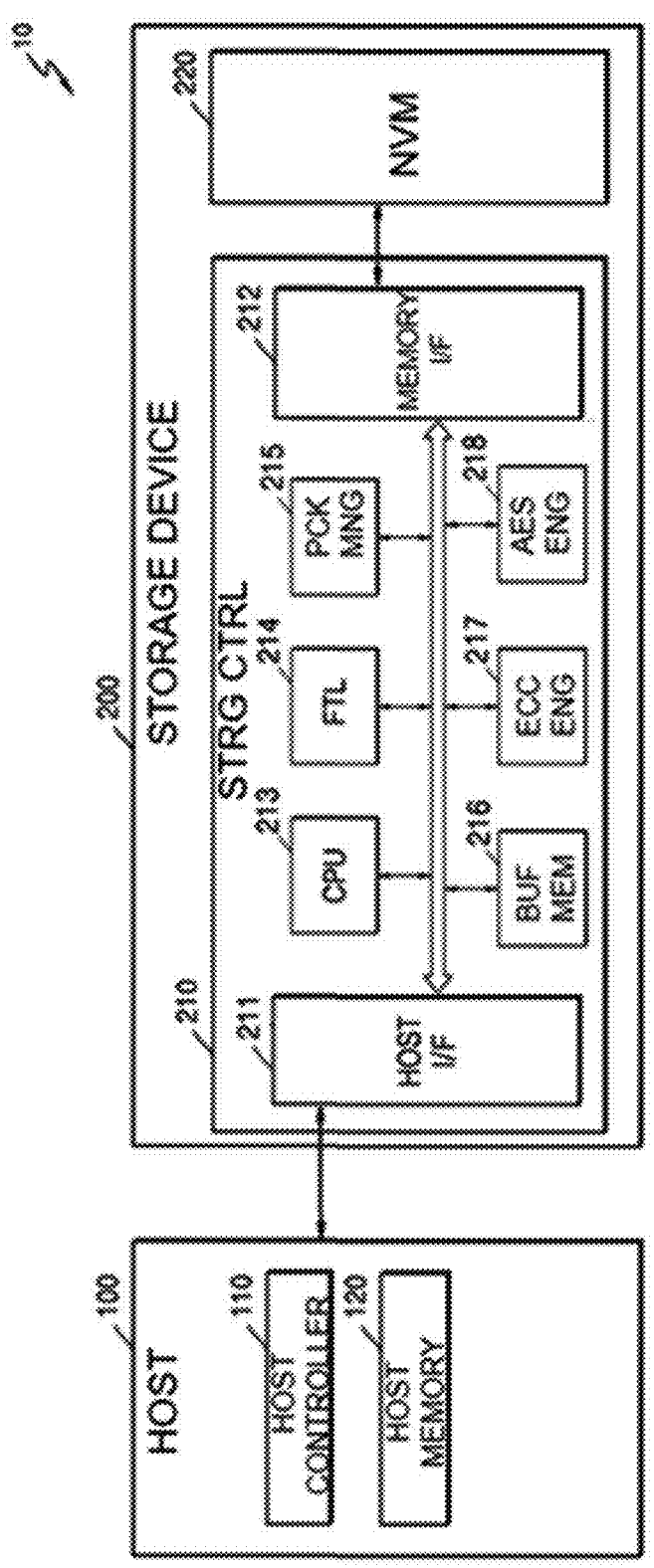
FIG. 2A is a block diagram of a host storage system, according to embodiments.

FIG. 2A is a block diagram of a host storage system 10 according to an example embodiment.

The host storage system 10 may include a host 100 and a storage device 200. Further, the storage device 200 may include a storage controller 210 and an NVM 220. According to an example embodiment, the host 100 may include a host controller 110 and a host memory 120. The host memory 120 may serve as a buffer memory configured to temporarily store data to be transmitted to the storage device 200 or data received from the storage device 200.

The storage device 200 may include storage media configured to store data in response to requests from the host 100. As an example, the storage device 200 may include at least one of an SSD, an embedded memory, and a removable external memory. When the storage device 200 is an SSD, the storage device 200 may be a device that conforms to an NVMe standard. When the storage device 200 is an embedded memory or an external memory, the storage device 200 may be a device that conforms to a UFS standard or an eMMC standard. Each of the host 100 and the storage device 200 may generate a packet according to an adopted standard protocol and transmit the packet.

When the NVM 220 of the storage device 200 includes a flash memory, the flash memory may include a 2D NAND memory array or a 3D (or vertical) NAND (VNAND) memory array. As another example, the storage device 200 may include various other kinds of NVMs. For example, the storage device 200 may include magnetic RAM (MRAM), spin-transfer torque MRAM, conductive bridging RAM (CBRAM), ferroelectric RAM (FRAM), PRAM, RRAM, and various other kinds of memories.

According to an embodiment, the host controller 110 and the host memory 120 may be implemented as separate semiconductor chips. Alternatively, in some embodiments, the host controller 110 and the host memory 120 may be integrated in the same semiconductor chip. As an example, the host controller 110 may be any one of a plurality of modules included in an application processor (AP). The AP may be implemented as a System on Chip (SoC). Further, the host memory 120 may be an embedded memory included in the AP or an NVM or memory module located outside the AP.

The host controller 110 may manage an operation of storing data (e.g., write data) of a buffer region of the host memory 120 in the NVM 220 or an operation of storing data (e.g., read data) of the NVM 220 in the buffer region.

The storage controller 210 may include a host interface 211, a memory interface 212, and a CPU 213. Further, the storage controller 210 may further include a flash translation layer (FTL) 214, a packet manager 215, a buffer memory 216, an ECC engine 217, and an advanced encryption standard (AES) engine 218. The storage controller 210 may further include a working memory in which the FTL 214 is loaded. The CPU 213 may execute the FTL 214 to control data write and read operations on the NVM 220.

The host interface 211 may transmit and receive packets to and from the host 100. A packet transmitted from the host 100 to the host interface 211 may include a command or data to be written to the NVM 220. A packet transmitted from the host interface 211 to the host 100 may include a response to the command or data read from the NVM 220. The memory interface 212 may transmit data to be written to the NVM 220 to the NVM 220 or receive data read from the NVM 220. The memory interface 212 may be configured to comply with a standard protocol, such as Toggle or open NAND flash interface (ONFI).

The FTL 214 may perform various functions, such as an address mapping operation, a wear-leveling operation, and a garbage collection operation. The address mapping operation may be an operation of converting a logical address received from the host 100 into a physical address used to actually store data in the NVM 220. The wear-leveling operation may be a technique for preventing excessive deterioration of a specific block by allowing blocks of the NVM 220 to be uniformly used. As an example, the wear-leveling operation may be implemented using a firmware technique that balances erase counts of physical blocks. The garbage collection operation may be a technique for ensuring usable capacity in the NVM 220 by erasing an existing block after copying valid data of the existing block to a new block.

The packet manager 215 may generate a packet according to a protocol of an interface, which consents to the host 100, or parse various types of information from the packet received from the host 100. In addition, the buffer memory 216 may temporarily store data to be written to the NVM 220 or data to be read from the NVM 220. Although the buffer memory 216 may be a component included in the storage controller 210, the buffer memory 216 may be outside the storage controller 210.

The ECC engine 217 may perform error detection and correction operations on read data read from the NVM 220. More specifically, the ECC engine 217 may generate parity bits for write data to be written to the NVM 220, and the generated parity bits may be stored in the NVM 220 together with write data. During the reading of data from the NVM 220, the ECC engine 217 may correct an error in the read data by using the parity bits read from the NVM 220 along with the read data, and output error-corrected read data.

The AES engine 218 may perform at least one of an encryption operation and a decryption operation on data input to the storage controller 210 by using a symmetric-key algorithm.

Figure 2B:
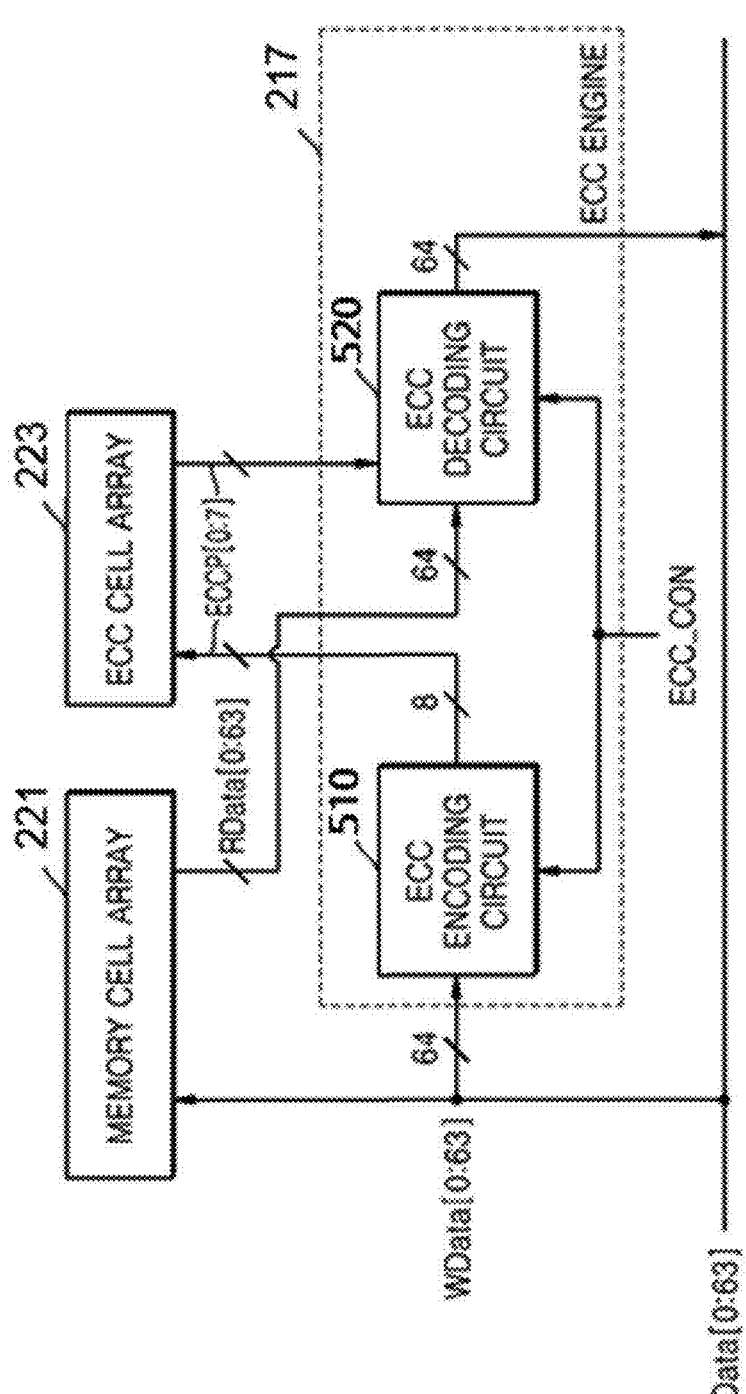
FIG. 2B is a block diagram of an ECC engine, according to embodiments.

FIG. 2B is a detailed diagram of the ECC engine 217 of FIG. 2A. Referring to FIG. 2B, the ECC engine 217 may include an ECC encoding circuit 510 and an ECC decoding circuit 520. In response to an ECC control signal ECC_CON, the ECC encoding circuit 510 may generate parity bits ECCP[0:7] for write data WData[0:63] to be written to memory cells of a memory cell array 221. The parity bits ECCP[0:7] may be stored in an ECC cell array 223. According to embodiments, in response to the ECC control signal ECC_CON, the ECC encoding circuit 510 may generate parity bits ECCP[0:7] for write data WData[0:63] to be written to memory cells including a defective cell of the memory cell array 221.

In response to the ECC control signal ECC_CON, the ECC decoding circuit 520 may correct error bit data by using read data RData[0:63] read from the memory cells of the memory cell array 221 and parity bits ECCP[0:7] read from the ECC cell array 223 and output error-corrected data Data[0:63]. According to embodiments, in response to the ECC control signal ECC_CON, the ECC decoding circuit 520 may correct error bit data by using read data RData[0:63] read from memory cells including a defective cell of the memory cell array 221 and parity bits ECCP[0:7] read from the ECC cell array 223, and output error-corrected data Data[0:63].

Figure 2C:
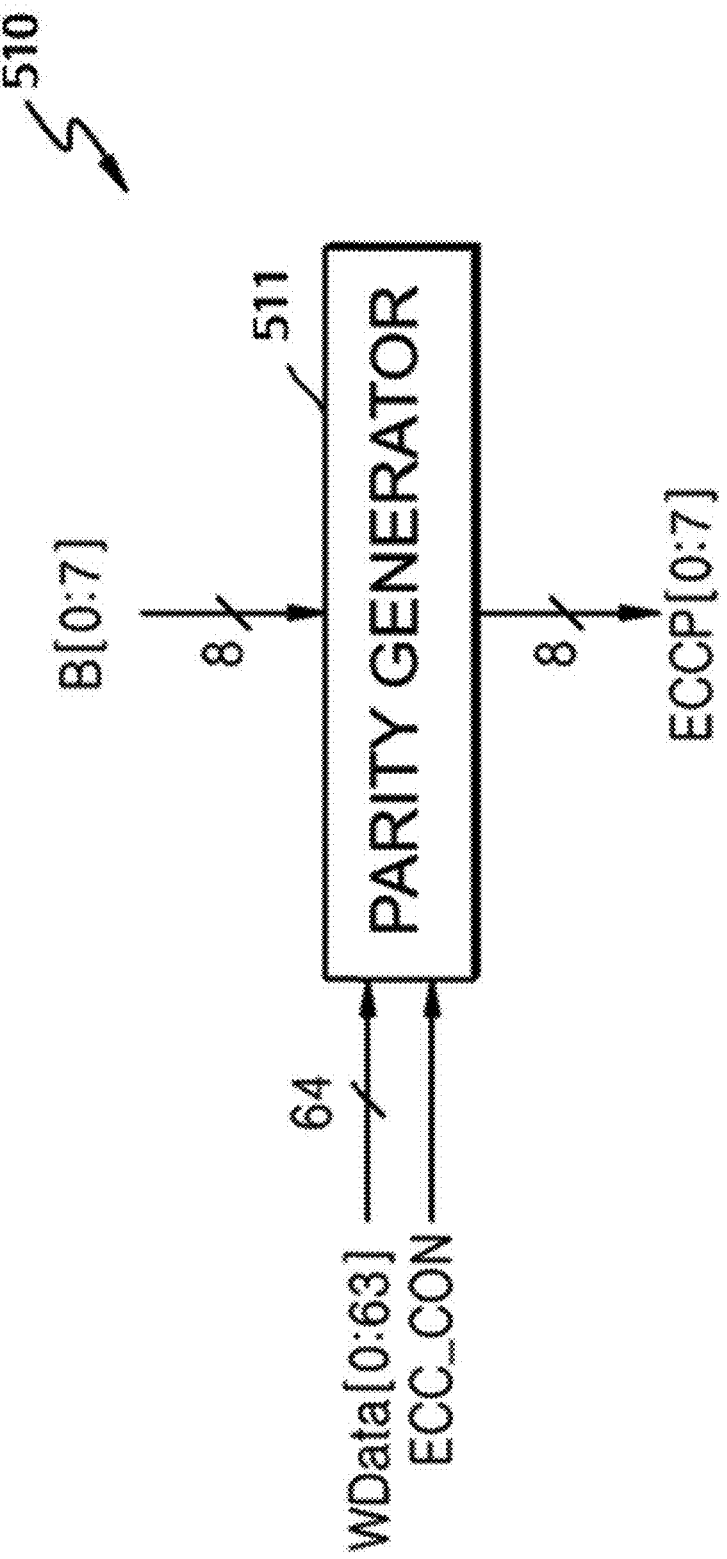
FIG. 2C is a block diagram of an ECC encoding circuit, according to embodiments.

FIG. 2C is a diagram of the ECC encoding circuit 510 of FIG. 2B.

Referring to FIG. 2C, the ECC encoding circuit 510 may include a parity generator 511, which receives 64-bit write data WData[0:63] and basis bits B[0:7] in response to an ECC control signal ECC_CON and generates parity bits ECCP[0:7] by using an XOR array operation. The basis bits B[0:7] may be bits for generating parity bits ECCP[0:7] for 64-bit write data WData[0:63], for example, b'00000000 bits. The basis bits B[0:7] may use other specific bits instead of b'00000000 bits.

Figure 3:
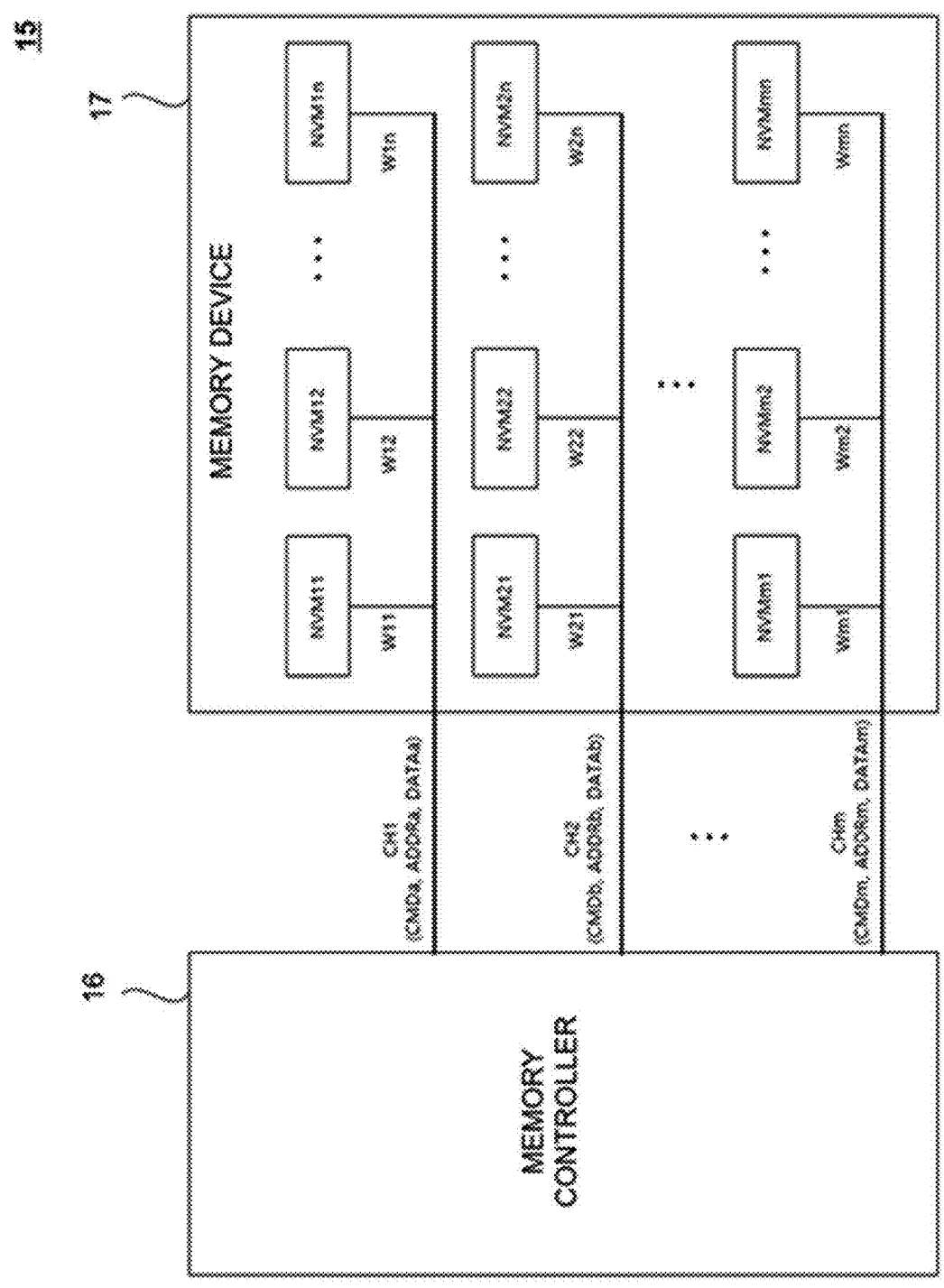
FIG. 3 is a block diagram of a memory system, according to embodiments.

FIG. 3 is a block diagram of a memory system 15 according embodiments. Referring to FIG. 3, the memory system 15 may include a memory device 17 and a memory controller 16. The memory system 15 may support a plurality of channels CH1 to CHm, and the memory device 17 may be connected to the memory controller 16 through the plurality of channels CH1 to CHm. For example, the memory system 15 may be implemented as a storage device, such as an SSD.

The memory device 17 may include a plurality of NVM devices NVM11 to NVMmn. Each of the NVM devices NVM11 to NVMmn may be connected to one of the plurality of channels CH1 to CHm through a way corresponding thereto. For instance, the NVM devices NVM11 to NVM1n may be connected to a first channel CH1 through ways W11 to W1n, and the NVM devices NVM21 to NVM2n may be connected to a second channel CH2 through ways W21 to W2n. In an example embodiment, each of the NVM devices NVM11 to NVMmn may be implemented as an arbitrary memory unit that may operate according to an individual command from the memory controller 16. For example, each of the NVM devices NVM11 to NVMmn may be implemented as a chip or a die, but the embodiments of the disclosure are not limited thereto.

The memory controller 16 may transmit and receive signals to and from the memory device 17 through the plurality of channels CH1 to CHm. For example, the memory controller 16 may transmit commands CMDa to CMDm, addresses ADDRa to ADDRm, and data DATAa to DATAm to the memory device 17 through the channels CH1 to CHm or receive the data DATAa to DATAm from the memory device 17.

The memory controller 16 may select one of the NVM devices NVM11 to NVMmn, which is connected to each of the channels CH1 to CHm, by using a corresponding one of the channels CH1 to CHm, and transmit and receive signals to and from the selected NVM device. For example, the memory controller 16 may select the NVM device NVM11 from the NVM devices NVM11 to NVM1*n* connected to the first channel CH1. The memory controller 16 may transmit the command CMDa, the address ADDRa, and the data DATAa to the selected NVM device NVM11 through the first channel CH1 or receive the data DATAa from the selected NVM device NVM11.

The memory controller 16 may transmit and receive signals to and from the memory device 17 in parallel through different channels. For example, the memory controller 16 may transmit a command CMDb to the memory device 17 through the second channel CH2 while transmitting a command CMDa to the memory device 17 through the first channel CH1. For example, the memory controller 16 may receive data DATAb from the memory device 17 through the second channel CH2 while receiving data DATAa from the memory device 17 through the first channel CH1.

The memory controller 16 may control all operations of the memory device 17. The memory controller 16 may transmit a signal to the channels CH1 to CHm and control each of the NVM devices NVM11 to NVMmn connected to the channels CH1 to CHm. For instance, the memory controller 16 may transmit the command CMDa and the address ADDRa to the first channel CH1 and control one selected from the NVM devices NVM11 to NVM1*n*.

Each of the NVM devices NVM11 to NVMmn may operate via the control of the memory controller 16. For example, the NVM device NVM11 may program the data DATAa based on the command CMDa, the address ADDRa, and the data DATAa provided to the first channel CH1. For example, the NVM device NVM21 may read the data DATAb based on the command CMDb and the address ADDb provided to the second channel CH2 and transmit the read data DATAb to the memory controller 16.

Although FIG. 3 illustrates an example in which the memory device 17 communicates with the memory controller 16 through m channels and includes n NVM devices corresponding to each of the channels, the number of channels and the number of NVM devices connected to one channel may be variously changed.

Figure 4:
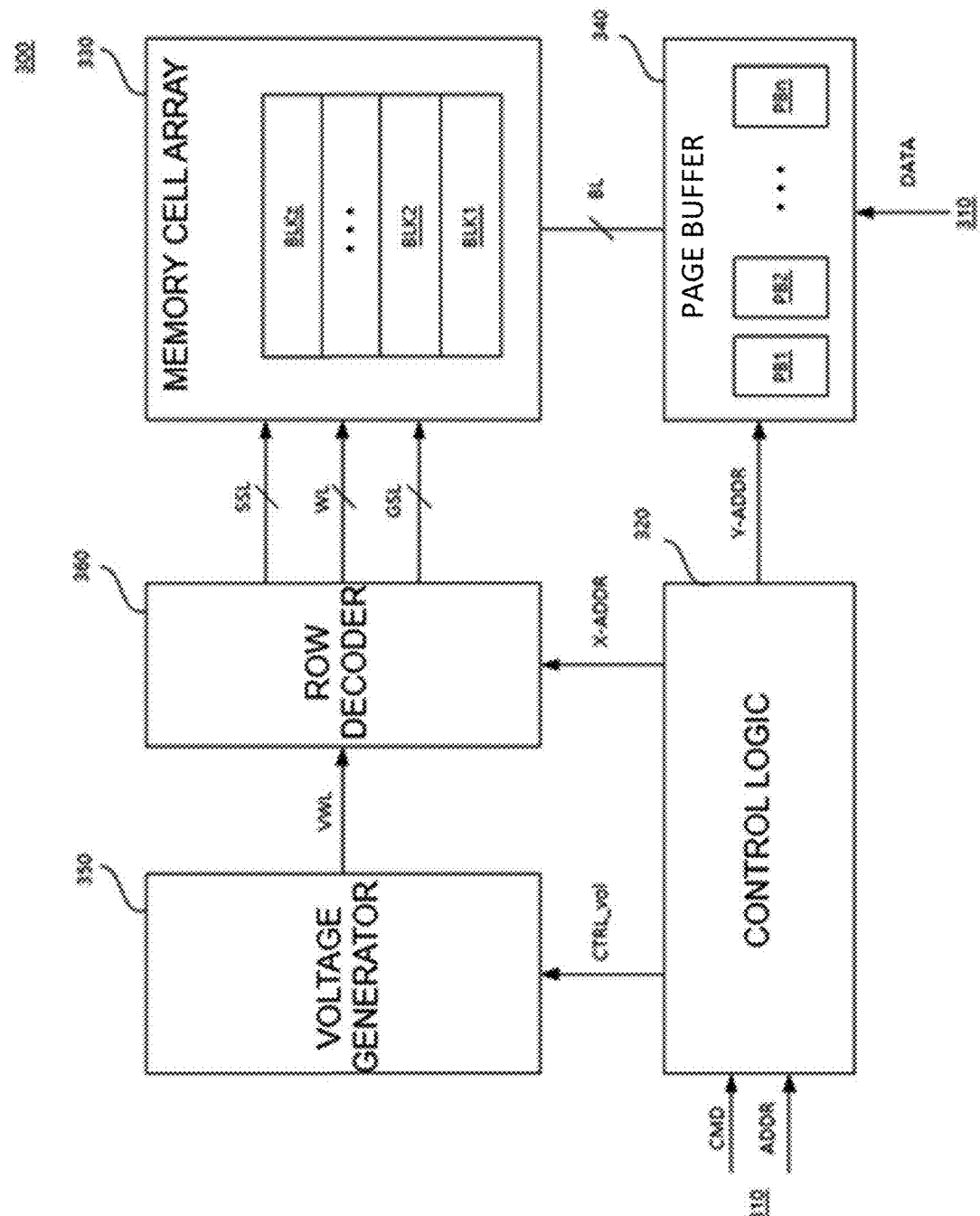
FIG. 4 is a block diagram of a memory device, according to embodiments.

FIG. 4 is a block diagram of a memory device 300 according to an example embodiment. Referring to FIG. 4, the memory device 300 may include a control logic circuitry 320, a memory cell array 330, a page buffer 340, a voltage generator 350, and a row decoder 360. The memory device 300 may further include a memory interface circuitry 310 shown in FIG. 6. In addition, the memory device 300 may further include a column logic, a pre-decoder, a temperature sensor, a command decoder, and/or an address decoder.

The control logic circuitry 320 may control all various operations of the memory device 300. The control logic circuitry 320 may output various control signals in response to commands CMD and/or addresses ADDR from the memory interface circuitry 310. For example, the control logic circuitry 320 may output a voltage control signal CTRL_vol, a row address X-ADDR, and a column address Y-ADDR.

The memory cell array 330 may include a plurality of memory blocks BLK1 to BLKz (here, z is a positive integer), each of which may include a plurality of memory cells. The memory cell array 330 may be connected to the page buffer 340 through bit lines BL and be connected to the row decoder 360 through word lines WL, string selection lines SSL, and ground selection lines GSL.

In an example embodiment, the memory cell array 330 may include a 3D memory cell array, which includes a plurality of NAND strings. Each of the NAND strings may include memory cells respectively connected to word lines vertically stacked on a substrate. The disclosures of U.S. Pat. Nos. 7,679,133; 8,553,466; 8,654,587; 8,559,235; and US Pat. Pub. No. 2011/0233648 are hereby incorporated by reference. In an example embodiment, the memory cell array 330 may include a 2D memory cell array, which includes a plurality of NAND strings arranged in a row direction and a column direction.

The page buffer 340 may include a plurality of page buffers PB1 to PBn (here, n is an integer greater than or equal to 3), which may be respectively connected to the memory cells through a plurality of bit lines BL. The page buffer 340 may select at least one of the bit lines BL in response to the column address Y-ADDR. The page buffer 340 may operate as a write driver or a sense amplifier according to an operation mode. For example, during a program operation, the page buffer 340 may apply a bit line voltage corresponding to data to be programmed, to the selected bit line. During a read operation, the page buffer 340 may sense current or a voltage of the selected bit line BL and sense data stored in the memory cell.

The voltage generator 350 may generate various kinds of voltages for program, read, and erase operations based on the voltage control signal CTRL_vol. For example, the voltage generator 350 may generate a program voltage, a read voltage, a program verification voltage, and an erase voltage as a word line voltage VWL.

The row decoder 360 may select one of a plurality of word lines WL and select one of a plurality of string selection lines SSL in response to the row address X-ADDR. For example, the row decoder 360 may apply the program voltage and the program verification voltage to the selected word line WL during a program operation and apply the read voltage to the selected word line WL during a read operation.

Figure 5:
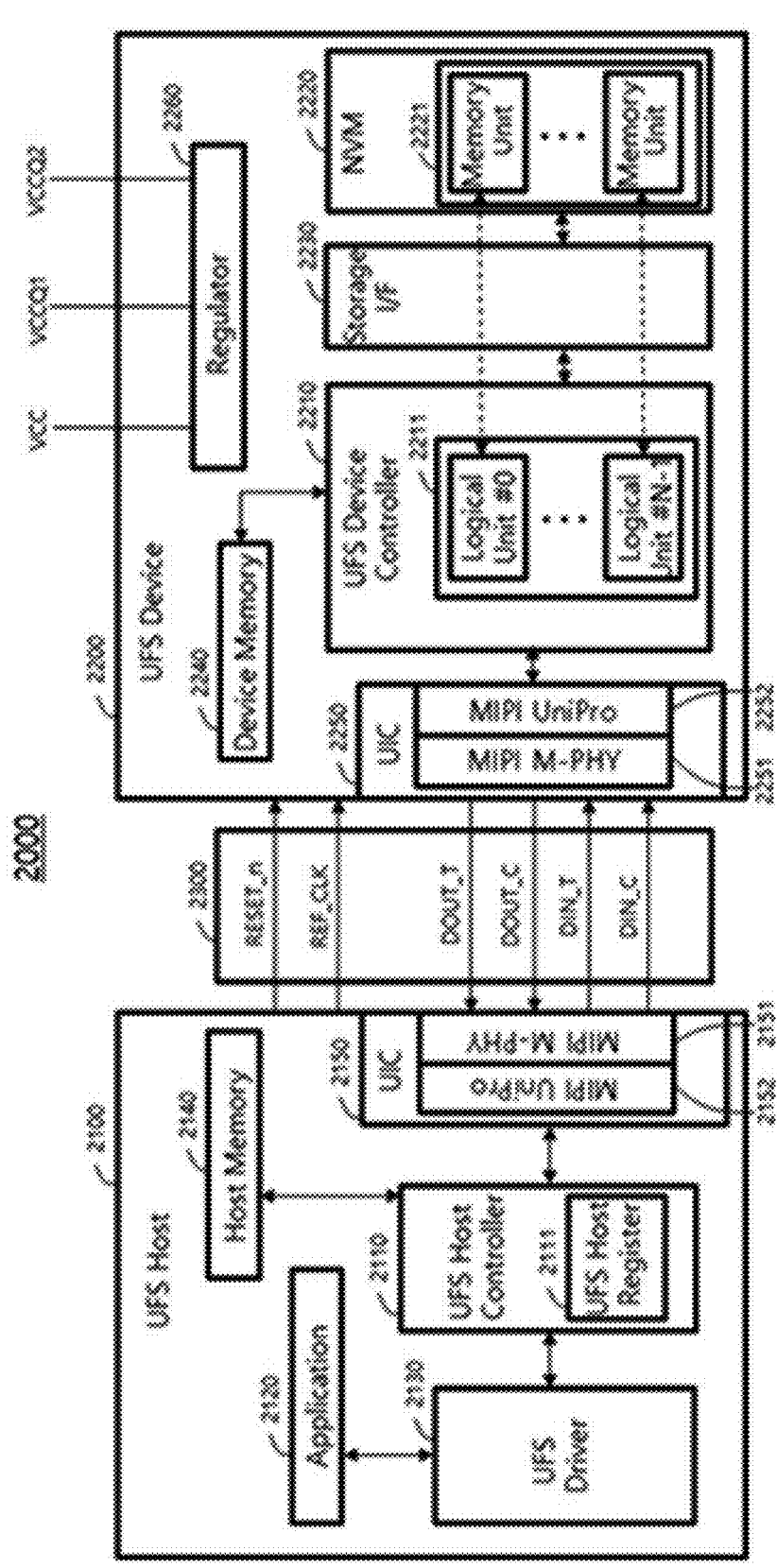
FIG. 5 is a block diagram of a UFS system, according to embodiments.

FIG. 5 is a diagram of a UFS system 2000 according to embodiments. The UFS system 2000 may be a system conforming to a UFS standard announced by Joint Electron Device Engineering Council (JEDEC) and include a UFS host 2100, a UFS device 2200, and a UFS interface 2300. The above description of the system 1000 of FIG. 1 may also be applied to the UFS system 2000 of FIG. 5 within a range that does not conflict with the following description of FIG. 5.

Referring to FIG. 5, the UFS host 2100 may be connected to the UFS device 2200 through the UFS interface 2300. When the main processor 1100 of FIG. 1 is an AP, the UFS host 2100 may be implemented as a portion of the AP. The UFS host controller 2110 and the host memory 2140 may respectively correspond to the controller 1120 of the main processor 1100 and the memories 1200*a* and 1200*b* of FIG. 1. The UFS device 2200 may correspond to the storage device 1300*a* and 1300*b* of FIG. 1, and a UFS device controller 2210 and an NVM 2220 may respectively correspond to the storage controllers 1310*a* and 1310*b* and the NVMs 1320*a* and 1320*b* of FIG. 1.

The UFS host 2100 may include a UFS host controller 2110, an application 2120, a UFS driver 2130, a host memory 2140, and a UFS interconnect (UIC) layer 2150. The UFS device 2200 may include the UFS device controller 2210, the NVM 2220, a storage interface 2230, a device memory 2240, a UIC layer 2250, and a regulator 2260. The NVM 2220 may include a plurality of memory units 2221. Although each of the memory units 2221 may include a V-NAND flash memory having a 2D structure or a 3D structure, each of the memory units 2221 may include another kind of NVM, such as PRAM and/or RRAM. The UFS device controller 2210 may be connected to the NVM 2220 through the storage interface 2230. The storage interface 2230 may be configured to comply with a standard protocol, such as Toggle or ONFI.

The application 2120 may refer to a program that wants to communicate with the UFS device 2200 to use functions of the UFS device 2200. The application 2120 may transmit input-output requests (IORs) to the UFS driver 2130 for input/output (I/O) operations on the UFS device 2200. The IORs may refer to a data read request, a data storage (or write) request, and/or a data erase (or discard) request, without being limited thereto.

The UFS driver 2130 may manage the UFS host controller 2110 through a UFS-host controller interface (UFS-HCI). The UFS driver 2130 may convert the IOR generated by the application 2120 into a UFS command defined by the UFS standard and transmit the UFS command to the UFS host controller 2110. One IOR may be converted into a plurality of UFS commands. Although the UFS command may basically be defined by an SCSI standard, the UFS command may be a command dedicated to the UFS standard.

The UFS host controller 2110 may transmit the UFS command converted by the UFS driver 2130 to the UIC layer 2250 of the UFS device 2200 through the UIC layer 2150 and the UFS interface 2300. During the transmission of the UFS command, a UFS host register 2111 of the UFS host controller 2110 may serve as a command queue (CQ).

The UIC layer 2150 on the side of the UFS host 2100 may include a mobile industry processor interface (MIPI) M-PHY 2151 and an MIPI UniPro 2152, and the UIC layer 2250 on the side of the UFS device 2200 may also include an MIPI M-PHY 2251 and an MIPI UniPro 2252.

The UFS interface 2300 may include a line configured to transmit a reference clock signal REF_CLK, a line configured to transmit a hardware reset signal RESET_n for the UFS device 2200, a pair of lines configured to transmit a pair of differential input signals DIN_t and DIN_c, and a pair of lines configured to transmit a pair of differential output signals DOUT_t and DOUT_c.

A frequency of a reference clock signal REF_CLK provided from the UFS host 2100 to the UFS device 2200 may be one of 19.2 MHz, 26 MHz, 38.4 MHz, and 52 MHz, without being limited thereto. The UFS host 2100 may change the frequency of the reference clock signal REF_CLK during an operation, that is, during data transmission/receiving operations between the UFS host 2100 and the UFS device 2200. The UFS device 2200 may generate cock signals having various frequencies from the reference clock signal REF_CLK provided from the UFS host 2100, by using a phase-locked loop (PLL). Also, the UFS host 2100 may set a data rate between the UFS host 2100 and the UFS device 2200 by using the frequency of the reference clock signal REF_CLK. That is, the data rate may be determined depending on the frequency of the reference clock signal REF_CLK.

The UFS interface 2300 may support a plurality of lanes, each of which may be implemented as a pair of differential lines. For example, the UFS interface 2300 may include at least one receiving lane and at least one transmission lane. In FIG. 5, a pair of lines configured to transmit a pair of differential input signals DIN_T and DIN_C may constitute a receiving lane, and a pair of lines configured to transmit a pair of differential output signals DOUT_T and DOUT_C may constitute a transmission lane. Although one transmission lane and one receiving lane are illustrated in FIG. 5, the number of transmission lanes and the number of receiving lanes may be changed.

The receiving lane and the transmission lane may transmit data based on a serial communication scheme. Full-duplex communications between the UFS host 2100 and the UFS device 2200 may be enabled due to a structure in which the receiving lane is separated from the transmission lane. That is, while receiving data from the UFS host 2100 through the receiving lane, the UFS device 2200 may transmit data to the UFS host 2100 through the transmission lane. In addition, control data (e.g., a command) from the UFS host 2100 to the UFS device 2200 and user data to be stored in or read from the NVM 2220 of the UFS device 2200 by the UFS host 2100 may be transmitted through the same lane. Accordingly, between the UFS host 2100 and the UFS device 2200, there may be no need to further provide a separate lane for data transmission in addition to a pair of receiving lanes and a pair of transmission lanes.

The UFS device controller 2210 of the UFS device 2200 may control all operations of the UFS device 2200. The UFS device controller 2210 may manage the NVM 2220 by using a logical unit (LU) 2211, which is a logical data storage unit. The number of LUs 2211 may be 8, without being limited thereto. The UFS device controller 2210 may include an FTL and convert a logical data address (e.g., a logical block address (LBA)) received from the UFS host 2100 into a physical data address (e.g., a physical block address (PBA)) by using address mapping information of the FTL. A logical block configured to store user data in the UFS system 2000 may have a size in a predetermined range. For example, a minimum size of the logical block may be set to 4 Kbyte.

When a command from the UFS host 2100 is applied through the UIC layer 2250 to the UFS device 2200, the UFS device controller 2210 may perform an operation in response to the command and transmit a completion response to the UFS host 2100 when the operation is completed.

As an example, when the UFS host 2100 intends to store user data in the UFS device 2200, the UFS host 2100 may transmit a data storage command to the UFS device 2200. When a response (a 'ready-to-transfer' response) indicating that the UFS host 2100 is ready to receive user data (ready-to-transfer) is received from the UFS device 2200, the UFS host 2100 may transmit user data to the UFS device 2200. The UFS device controller 2210 may temporarily store the received user data in the device memory 2240 and store the user data, which is temporarily stored in the device memory 2240, at a selected position of the NVM 2220 based on the address mapping information of the FTL.

As another example, when the UFS host 2100 intends to read the user data stored in the UFS device 2200, the UFS host 2100 may transmit a data read command to the UFS device 2200. The UFS device controller 2210, which has received the command, may read the user data from the NVM 2220 based on the data read command and temporarily store the read user data in the device memory 2240. During the read operation, the UFS device controller 2210 may detect and correct an error in the read user data by using an ECC engine embedded therein. More specifically, the ECC engine may generate parity bits for write data to be written to the NVM 2220, and the generated parity bits may be stored in the NVM 2220 along with the write data. During the reading of data from the NVM 2220, the ECC engine may correct an error in read data by using the parity bits read from the NVM 2220 along with the read data, and output error-corrected read data.

In addition, the UFS device controller 2210 may transmit user data, which is temporarily stored in the device memory 2240, to the UFS host 2100. In addition, the UFS device controller 2210 may further include an AES engine. The AES engine may perform at least of an encryption operation and a decryption operation on data transmitted to the UFS device controller 2210 by using a symmetric-key algorithm.

The UFS host 2100 may sequentially store commands, which are to be transmitted to the UFS device 2200, in the UFS host register 2111, which may serve as a common queue, and sequentially transmit the commands to the UFS device 2200. In this case, even while a previously transmitted command is still being processed by the UFS device 2200, that is, even before receiving a notification that the previously transmitted command has been processed by the UFS device 2200, the UFS host 2100 may transmit a next command, which is on standby in the CQ, to the UFS device 2200. Thus, the UFS device 2200 may also receive a next command from the UFS host 2100 during the processing of the previously transmitted command. A maximum number (or queue depth) of commands that may be stored in the CQ may be, for example, 32. Also, the CQ may be implemented as a circular queue in which a start and an end of a command line stored in a queue are indicated by a head pointer and a tail pointer.

Each of the plurality of memory units 2221 may include a memory cell array and a control circuit configured to control an operation of the memory cell array. The memory cell array may include a 2D memory cell array or a 3D memory cell array. The memory cell array may include a plurality of memory cells. Although each of the memory cells is a single-level cell (SLC) configured to store 1-bit information, each of the memory cells may be a cell configured to store information of 2 bits or more, such as a multi-level cell (MLC), a triple-level cell (TLC), and a quadruple-level cell (QLC). The 3D memory cell array may include a vertical NAND string in which at least one memory cell is vertically oriented and located on another memory cell.

Voltages VCC, VCCQ, and VCCQ2 may be applied as power supply voltages to the UFS device 2200. The voltage VCC may be a main power supply voltage for the UFS device 2200 and be in a range of 2.4 V to 3.6 V. The voltage VCCQ may be a power supply voltage for supplying a low voltage mainly to the UFS device controller 2210 and be in a range of 1.14 V to 1.26 V. The voltage VCCQ2 may be a power supply voltage for supplying a voltage, which is lower than the voltage VCC and higher than the voltage VCCQ, mainly to an I/O interface, such as the MIPI M-PHY 2251, and be in a range of 1.7 V to 1.95 V. The power supply voltages may be supplied through the regulator 2260 to respective components of the UFS device 2200. The regulator 2260 may be implemented as a set of unit regulators respectively connected to different ones of the power supply voltages described above.

Figure 6:
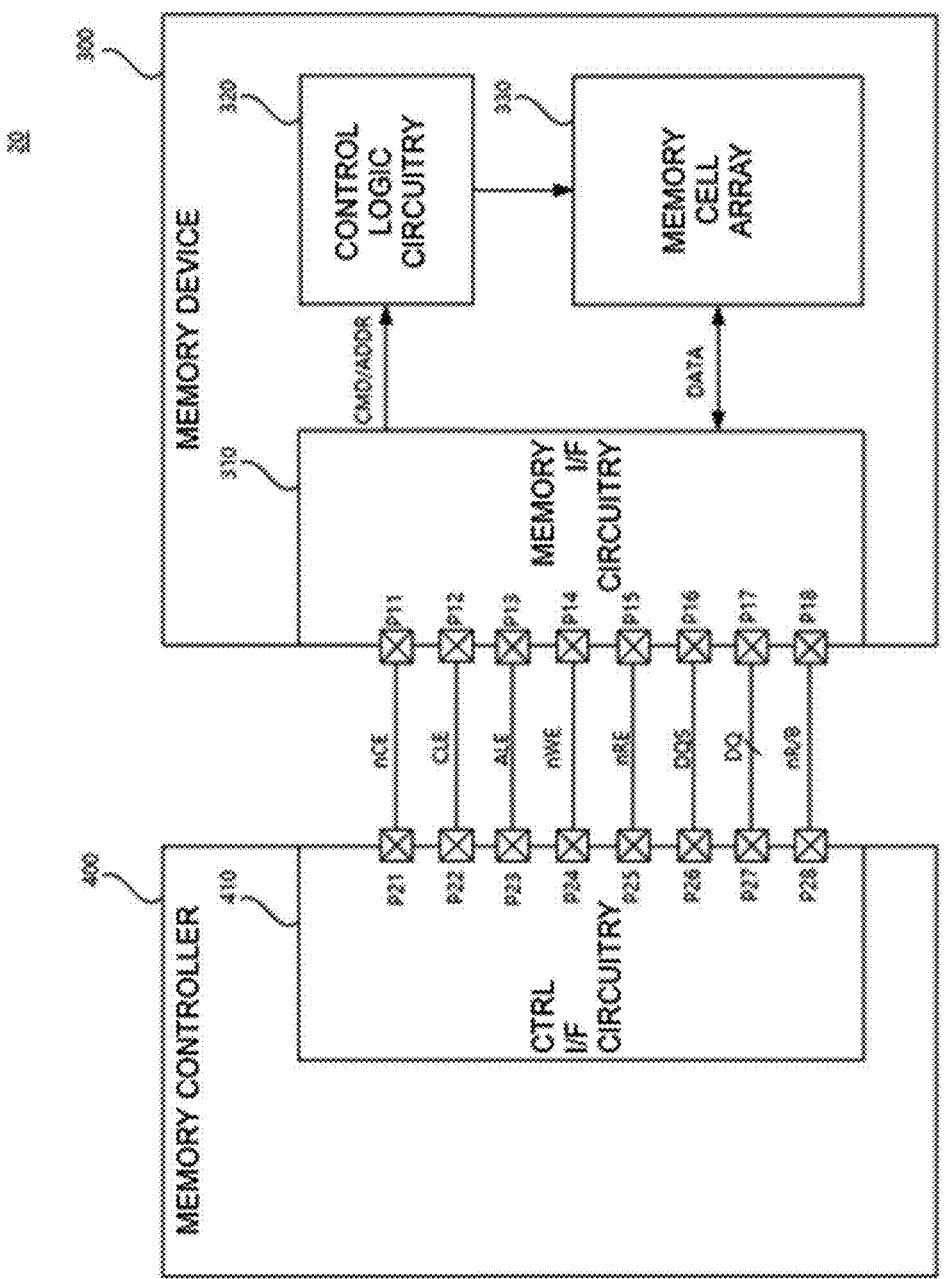
FIG. 6 is a block diagram of a memory system according to embodiments.

FIG. 6 is a block diagram of a memory system 20 according to an embodiment. Referring to FIG. 6, the memory system 20 may include a memory device 300 and a memory controller 400. The memory device 300 may correspond to one of NVM devices NVM11 to NVMmn, which communicate with a memory controller 400 based on one of the plurality of channels CH1 to CHm of FIG. 3. The memory controller 400 may correspond to the storage controller 210 of FIG. 2A.

The memory device 300 may include first to eighth pins P11 to P18, a memory interface circuitry 310, a control logic circuitry 320, and a memory cell array 330.

The memory interface circuitry 310 may receive a chip enable signal nCE from the memory controller 400 through the first pin P11. The memory interface circuitry 310 may transmit and receive signals to and from the memory controller 400 through the second to eighth pins P12 to P18 in response to the chip enable signal nCE. For example, when the chip enable signal nCE is in an enable state (e.g., a low level), the memory interface circuitry 310 may transmit and receive signals to and from the memory controller 400 through the second to eighth pins P12 to P18.

The memory interface circuitry 310 may receive a command latch enable signal CLE, an address latch enable signal ALE, and a write enable signal nWE from the memory controller 400 through the second to fourth pins P12 to P14. The memory interface circuitry 310 may receive a data signal DQ from the memory controller 400 through the seventh pin P17 or transmit the data signal DQ to the memory controller 400. A command CMD, an address ADDR, and data may be transmitted via the data signal DQ. For example, the data signal DQ may be transmitted through a plurality of data signal lines. In this case, the seventh pin P17 may include a plurality of pins respectively corresponding to a plurality of data signals DQ(s).

The memory interface circuitry 310 may obtain the command CMD from the data signal DQ, which is received in an enable section (e.g., a high-level state) of the command latch enable signal CLE based on toggle time points of the write enable signal nWE. The memory interface circuitry 310 may obtain the address ADDR from the data signal DQ, which is received in an enable section (e.g., a high-level state) of the address latch enable signal ALE based on the toggle time points of the write enable signal nWE.

In an example embodiment, the write enable signal nWE may be maintained at a static state (e.g., a high level or a low level) and toggle between the high level and the low level. For example, the write enable signal nWE may toggle in a section in which the command CMD or the address ADDR is transmitted. Thus, the memory interface circuitry 310 may obtain the command CMD or the address ADDR based on toggle time points of the write enable signal nWE.

The memory interface circuitry 310 may receive a read enable signal nRE from the memory controller 400 through the fifth pin P15. The memory interface circuitry 310 may receive a data strobe signal DQS from the memory controller 400 through the sixth pin P16 or transmit the data strobe signal DQS to the memory controller 400.

In a data (DATA) output operation of the memory device 300, the memory interface circuitry 310 may receive the read enable signal nRE, which toggles through the fifth pin P15, before outputting the data DATA. The memory interface circuitry 310 may generate the data strobe signal DQS, which toggles based on the toggling of the read enable signal nRE. For example, the memory interface circuitry 310 may generate a data strobe signal DQS, which starts toggling after a predetermined delay (e.g., tDQSRE), based on a toggling start time of the read enable signal nRE. The memory interface circuitry 310 may transmit the data signal DQ including the data DATA based on a toggle time point of the data strobe signal DQS. Thus, the data DATA may be aligned with the toggle time point of the data strobe signal DQS and transmitted to the memory controller 400.

In a data (DATA) input operation of the memory device 300, when the data signal DQ including the data DATA is received from the memory controller 400, the memory interface circuitry 310 may receive the data strobe signal DQS, which toggles, along with the data DATA from the memory controller 400. The memory interface circuitry 310 may obtain the data DATA from the data signal DQ based on toggle time points of the data strobe signal DQS. For example, the memory interface circuitry 310 may sample the data signal DQ at rising and falling edges of the data strobe signal DQS and obtain the data DATA.

The memory interface circuitry 310 may transmit a ready/busy output signal nR/B to the memory controller 400 through the eighth pin P18. The memory interface circuitry 310 may transmit state information of the memory device 300 through the ready/busy output signal nR/B to the memory controller 400. When the memory device 300 is in a busy state (i.e., when operations are being performed in the memory device 300), the memory interface circuitry 310 may transmit a ready/busy output signal nR/B indicating the busy state to the memory controller 400. When the memory device 300 is in a ready state (i.e., when operations are not performed or completed in the memory device 300), the memory interface circuitry 310 may transmit a ready/busy output signal nR/B indicating the ready state to the memory controller 400. For example, while the memory device 300 is reading data DATA from the memory cell array 330 in response to a page read command, the memory interface circuitry 310 may transmit a ready/busy output signal nR/B indicating a busy state (e.g., a low level) to the memory controller 400. For example, while the memory device 300 is programming data DATA to the memory cell array 330 in response to a program command, the memory interface circuitry 310 may transmit a ready/busy output signal nR/B indicating the busy state to the memory controller 400.

The control logic circuitry 320 may control all operations of the memory device 300. The control logic circuitry 320 may receive the command/address CMD/ADDR obtained from the memory interface circuitry 310. The control logic circuitry 320 may generate control signals for controlling other components of the memory device 300 in response to the received command/address CMD/ADDR. For example, the control logic circuitry 320 may generate various control signals for programming data DATA to the memory cell array 330 or reading the data DATA from the memory cell array 330.

The memory cell array 330 may store the data DATA obtained from the memory interface circuitry 310, via the control of the control logic circuitry 320. The memory cell array 330 may output the stored data DATA to the memory interface circuitry 310 via the control of the control logic circuitry 320.

The memory cell array 330 may include a plurality of memory cells. For example, the plurality of memory cells may be flash memory cells. However, the inventive concept is not limited thereto, and the memory cells may be RRAM cells, FRAM cells, PRAM cells, thyristor RAM (TRAM) cells, or MRAM cells. Hereinafter, an embodiment in which the memory cells are NAND flash memory cells will mainly be described.

The memory controller 400 may include first to eighth pins P21 to P28 and a controller interface circuitry 410. The first to eighth pins P21 to P28 may respectively correspond to the first to eighth pins P11 to P18 of the memory device 300.

The controller interface circuitry 410 may transmit a chip enable signal nCE to the memory device 300 through the first pin P21. The controller interface circuitry 410 may transmit and receive signals to and from the memory device 300, which is selected by the chip enable signal nCE, through the second to eighth pins P22 to P28.

The controller interface circuitry 410 may transmit the command latch enable signal CLE, the address latch enable signal ALE, and the write enable signal nWE to the memory device 300 through the second to fourth pins P22 to P24. The controller interface circuitry 410 may transmit or receive the data signal DQ to and from the memory device 300 through the seventh pin P27.

The controller interface circuitry 410 may transmit the data signal DQ including the command CMD or the address ADDR to the memory device 300 along with the write enable signal nWE, which toggles. The controller interface circuitry 410 may transmit the data signal DQ including the command CMD to the memory device 300 by transmitting a command latch enable signal CLE having an enable state. Also, the controller interface circuitry 410 may transmit the data signal DQ including the address ADDR to the memory device 300 by transmitting an address latch enable signal ALE having an enable state.

The controller interface circuitry 410 may transmit the read enable signal nRE to the memory device 300 through the fifth pin P25. The controller interface circuitry 410 may receive or transmit the data strobe signal DQS from or to the memory device 300 through the sixth pin P26.

In a data (DATA) output operation of the memory device 300, the controller interface circuitry 410 may generate a read enable signal nRE, which toggles, and transmit the read enable signal nRE to the memory device 300. For example, before outputting data DATA, the controller interface circuitry 410 may generate a read enable signal nRE, which is changed from a static state (e.g., a high level or a low level) to a toggling state. Thus, the memory device 300 may generate a data strobe signal DQS, which toggles, based on the read enable signal nRE. The controller interface circuitry 410 may receive the data signal DQ including the data DATA along with the data strobe signal DQS, which toggles, from the memory device 300. The controller interface circuitry 410 may obtain the data DATA from the data signal DQ based on a toggle time point of the data strobe signal DQS.

In a data (DATA) input operation of the memory device 300, the controller interface circuitry 410 may generate a data strobe signal DQS, which toggles. For example, before transmitting data DATA, the controller interface circuitry 410 may generate a data strobe signal DQS, which is changed from a static state (e.g., a high level or a low level) to a toggling state. The controller interface circuitry 410 may transmit the data signal DQ including the data DATA to the memory device 300 based on toggle time points of the data strobe signal DQS.

The controller interface circuitry 410 may receive a ready/busy output signal nR/B from the memory device 300 through the eighth pin P28. The controller interface circuitry 410 may determine state information of the memory device 300 based on the ready/busy output signal nR/B.

Figure 7:
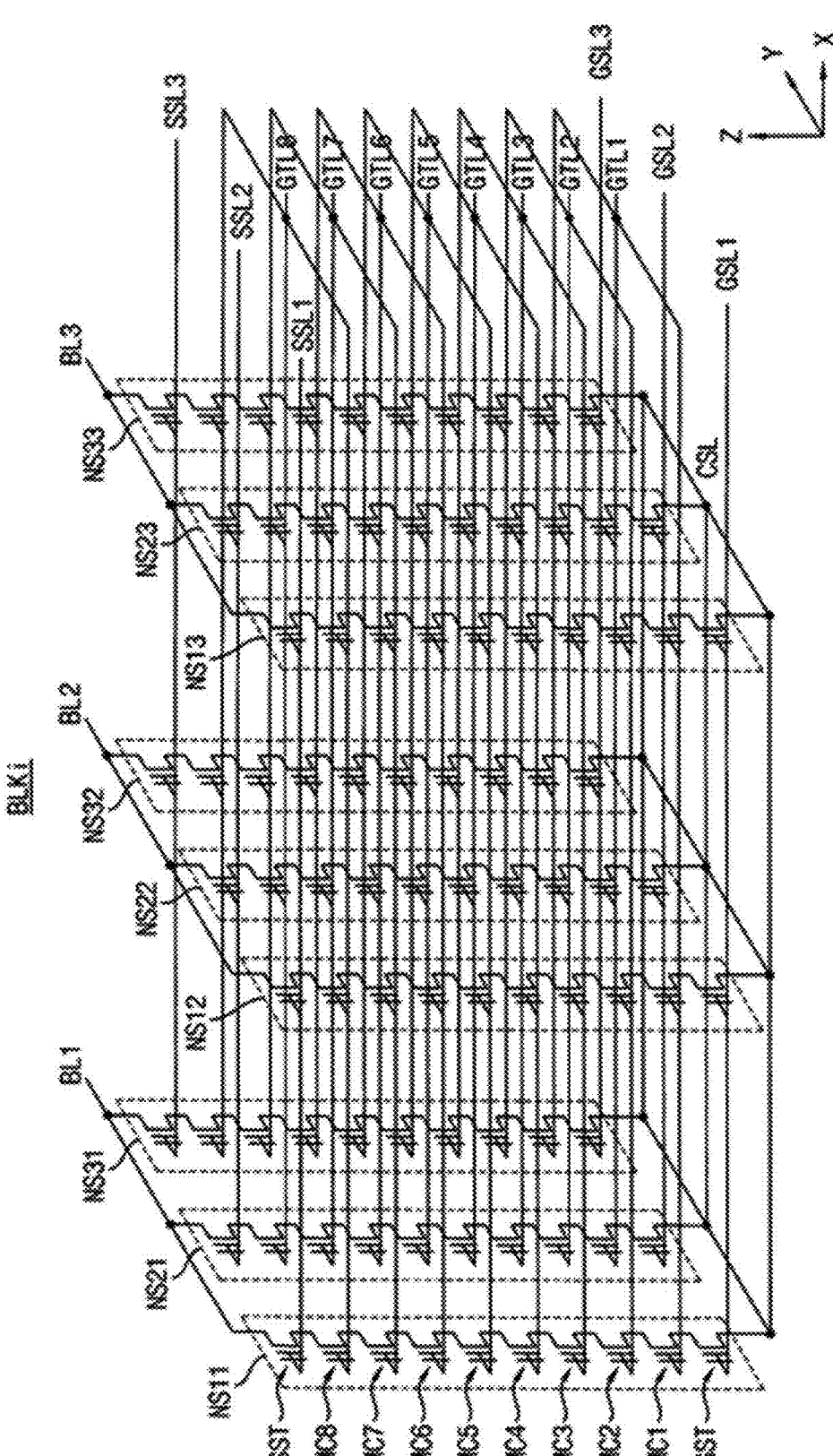
FIG. 7 is a diagram of a 3D V-NAND structure applicable to a UFS device according to embodiments.

FIG. 7 is a diagram of a 3D V-NAND structure applicable to a UFS device according to an embodiment. When a storage module of the UFS device is implemented as a 3D V-NAND flash memory, each of a plurality of memory blocks included in the storage module may be represented by an equivalent circuit shown in FIG. 7.

A memory block BLKi shown in FIG. 7 may refer to a 3D memory block having a 3D structure formed on a substrate. For example, a plurality of memory NAND strings included in the memory block BLKi may be formed in a vertical direction to the substrate.

Referring to FIG. 7, the memory block BLKi may include a plurality of memory NAND strings (e.g., NS11 to NS33), which are connected between bit lines BL1, BL2, and BL3 and a common source line CSL. Each of the memory NAND strings NS11 to NS33 may include a string selection transistor SST, a plurality of memory cells (e.g., MC1, MC2, . . . , and MC8), and a ground selection transistor GST. Each of the memory NAND strings NS11 to NS33 is illustrated as including eight memory cells MC1, MC2, . . . , and MC8 in FIG. 7, without being limited thereto.

The string selection transistor SST may be connected to string selection lines SSL1, SSL2, and SSL3 corresponding thereto. Each of the memory cells MC1, MC2, . . . , and MC8 may be connected to a corresponding one of gate lines GTL1, GTL2, . . . , and GTL8. The gate lines GTL1, GTL2, . . . , and GTL8 may respectively correspond to word lines, and some of the gate lines GTL1, GTL2, . . . , and GTL8 may correspond to dummy word lines. The ground selection transistor GST may be connected to ground selection lines GSL1, GSL2, and GSL3 corresponding thereto. The string selection transistor SST may be connected to the bit lines BL1, BL2, and BL3 corresponding thereto, and the ground selection transistor GST may be connected to the common source line CSL.

Word lines (e.g., WL1) at the same level may be connected in common, and the ground selection lines GSL1, GSL2, and GSL3 and the string selection lines SSL1, SSL2, and SSL3 may be separated from each other. FIG. 7 illustrates a case in which a memory block BLK is connected to eight gate lines GTL1, GTL2, . . . , and GTL8 and three bit lines BL1, BL2, and BL3, without being limited thereto.

Figure 8:
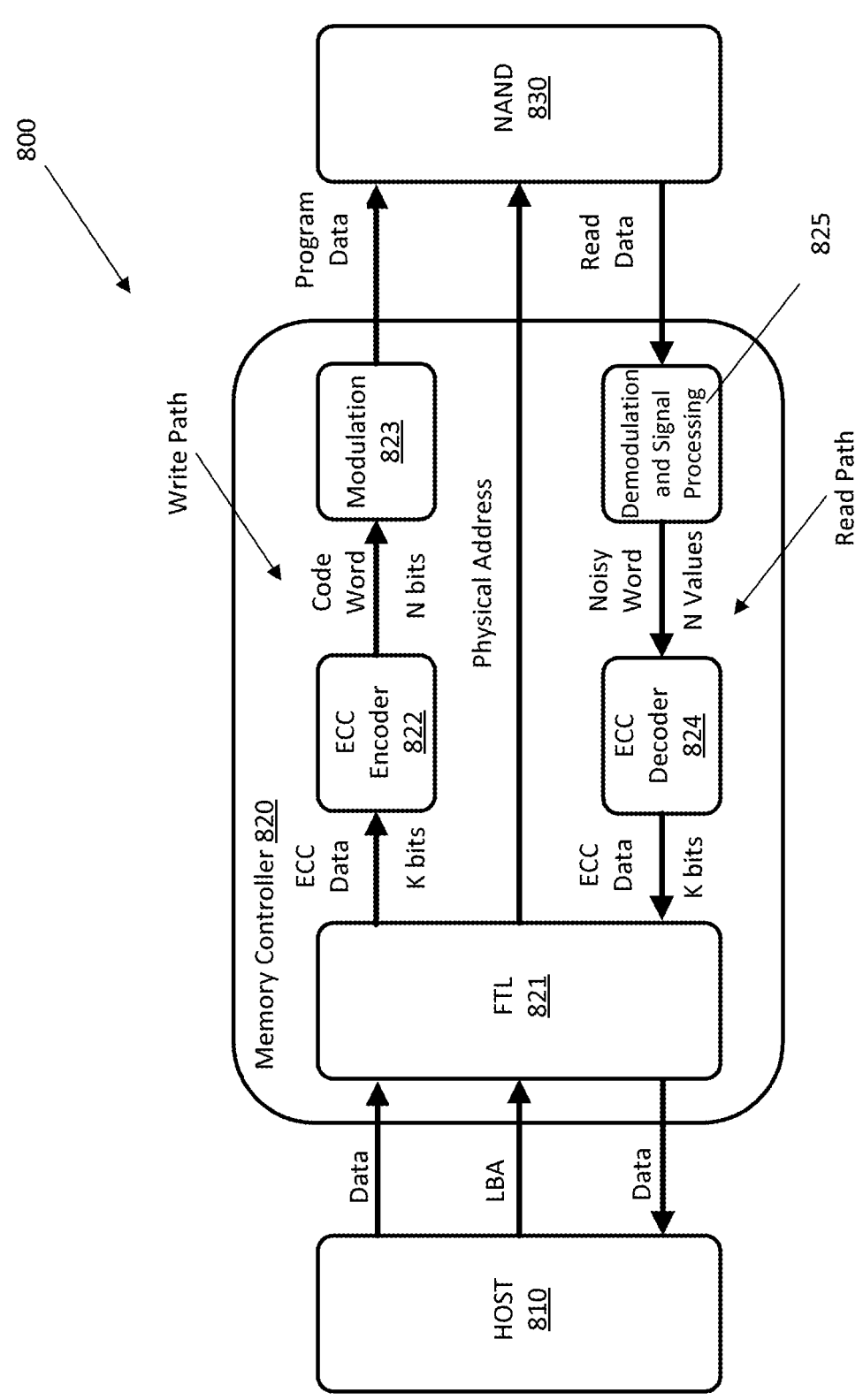
FIG. 8 is a block diagram of a memory system according to embodiments.

FIG. 8 is a block diagram of a memory system according to embodiments. As shown in FIG. 8, the memory system 800 may include a host 810, a memory controller 820, and a NAND device 830. The memory controller 820 may include a flash-translation layer (FTL) 821, an ECC encoder module 822, a modulation module 823, a demodulation and signal processing module 825, and an ECC decoder module 824. In embodiments, the ECC encoder module 822 and the modulation module 823 may be referred to as a write path, and the demodulation and signal processing module 825 and the ECC decoder module 824 may be referred to as a read path. In embodiments, the memory system 800 may correspond to one or more elements discussed above, for example the host storage system 10, but embodiments are not limited thereto.

In order to write data to the NAND device 830, the host 810 may pass to the memory controller 820 a logical address, for example a logic block address (LBA), and may transfer the data corresponding to the LBA to the memory controller 820. Using the FTL 821, the memory controller 820 may break the data into ECC data words, and may set corresponding physical addresses for the NAND device 830.

An ECC data word may have a length K. In some embodiments, the length K may have a value of four kilobits (kb), however embodiments are not limited thereto. The ECC encoder module 822 may receive K bits of ECC data, and may add redundancy bits to generate ECC code words of length N. The ECC code rate may be represented as $$R = \frac{K}{N}.$$

In some embodiments, the value of R may be for example 0.9, however embodiments are not limited thereto.

In embodiments, N-bit code words may be merged together and programmed or written to the NAND device 830 by the modulation module, 823, which may use modulations such as a single-level cell (SLC) modulation, a multi-level cell (MLC) modulation, a triple-level cell (TLC)

modulation, and a quad-level cell (QLC) modulation, however embodiments are not limited thereto.

In order to read the data from the NAND device 830, the host 810 may request to read the LBA from the memory controller 820, which in turn is translated by the FTL 821 to physical addresses. The NAND device 830 may transfer the corresponding read data, which may be demodulated and processed by the demodulation and signal processing module 825 to generate ECC noisy words having length N. In embodiments, an ECC noisy word may refer to the ECC code word with some errors.

The basic mode of operation may be a fast read from the NAND device 830, in which the memory controller 820 may receive N bits from the NAND, the ECC decoder module 824 may decode the N bits with errors and reconstruct or generate the stored K bits of ECC data. This mode may be referred to as hard decision (HD) mode.

In case of failure, it may be possible to receive additional measurements from the NAND device 830. For example, ECC decoder module 824 may receive a vector of N "soft" values representing the ECC code word, and may perform deciding with higher quality. This mode may be referred to as soft decision (SD) mode, and may be associated with higher latency than HD mode because of the read time from the NAND and also because different signal processing or ECC mode of operations may be performed with higher complexity.

Figure 9:
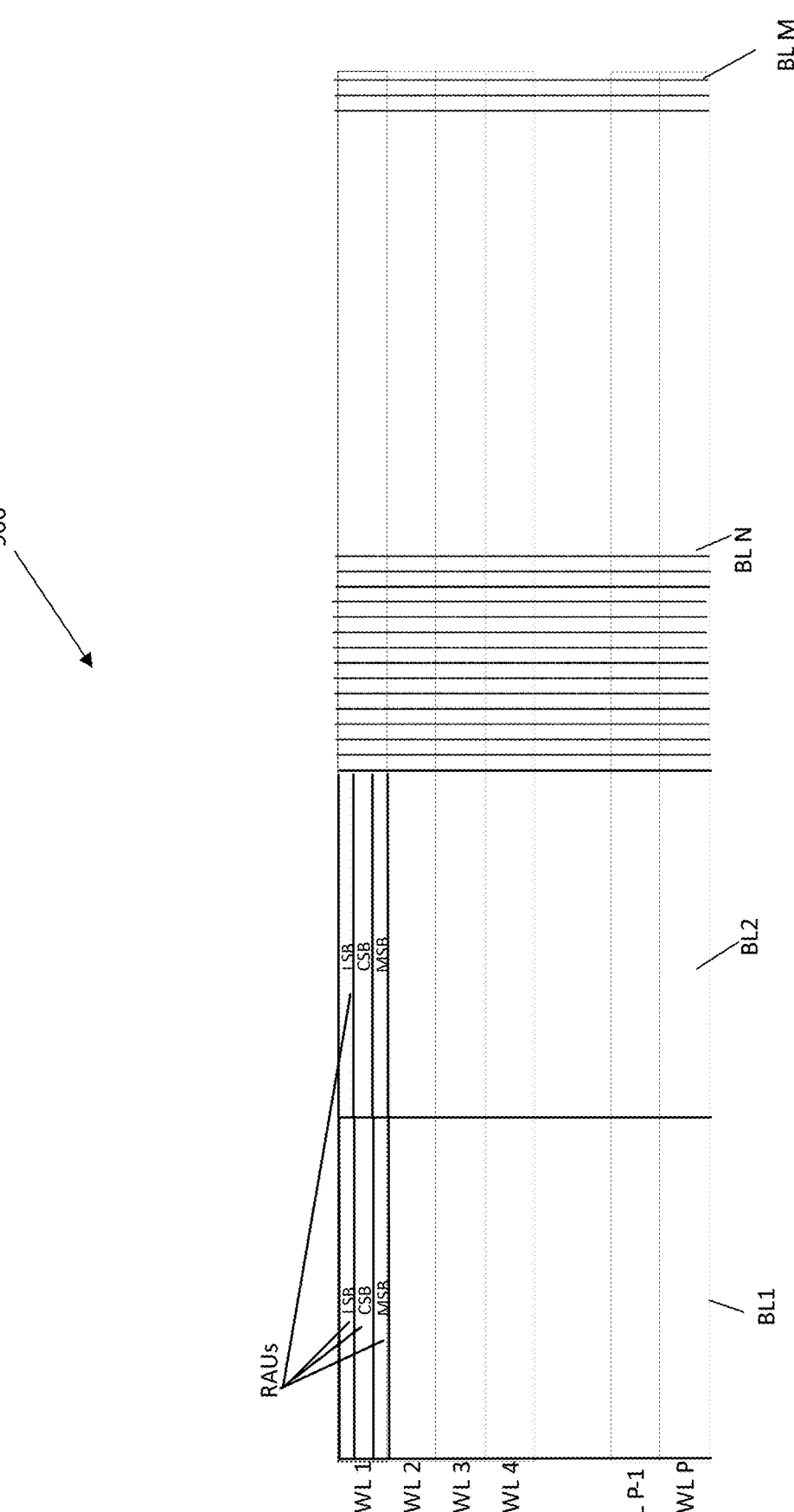
FIG. 9 illustrates an example of a NAND memory block, according to embodiments.

FIG. 9 illustrates an example of a NAND memory block, according to embodiments. In general, a NAND cell may store T bits, where T depends on the particular type of NAND memory cell. For example, a flash memory device which stores one bit per cell (BPC) may be referred to as a single-level cell (SLC), a flash memory device which stores two BPC may be referred to as a multi-level cell (MLC), a flash memory device which stores three BPC may be referred to as a triple-level cell (TLC), a flash memory device which stores four BPC may be referred to as a quadruple-level cell (QLC), and a flash memory device which stores five BPC may be referred to as a penta-level cell (PLC). For example, memory block 900 may be a TLC NAND memory block. As discussed above, a NAND chip may have a structure which includes Z blocks of word lines (WLs), where each WL includes M bit lines (BLs).

To allow fast NAND access, each WL of a NAND memory device may be divided into random access units (RAUs). Generally, if the number of bits to be stored in an RAU is N, the WL may be divided to M/N sectors, where each sector will includes T RAUs, of N BLs, representing one bit out of T, which may be for for example as a least significant bit (LSB), a center significant bit (CSB), or a most significant bit (MSB). Accordingly, the number of RAUs in such a block will be Z*T*M/N. To allow high reliability access, each RAU may be protected with an ECC. For example, the ECC code length for an RAU may be of length N and may accommodate K<N information bits.

According to embodiments, the notation shown in Equation 1 and Equation 2 below may be used herein:

$$[n] \triangleq [1, 2, \ldots n] \qquad \text{(Equation 1)}$$

$$[n]^* = [0, 1, 2, \ldots n] \qquad \text{(Equation 2)}$$

Vectors may be represented as lower-case bold letters (for example v) and matrices may be represented as upper-case bold letters (for example A).

An N×N identity matrix may be denoted as $I_N$. In addition, $u_\phi$ may denote the indices $\phi \subseteq [n]$ from a vector u of size n.

According to embodiments, G may denote a polar generator matrix, $\phi_t$ may denote a polar static frozen set at stage t, $P_t$ may denote a polar transform corresponding to $\phi_t$, P(n, k, $\phi$) may denote a polar code of length n, dimension k, and static frozen set $\phi$, and $\phi_i^j$ may denote a union of polar static frozen set up to stage j, as shown in Equation 3 below:

$$\phi_i^j \triangleq \bigcup_{t=i}^j \phi_t \qquad \text{(Equation 3)}$$

According to embodiments, $\alpha$ may denote a Galois Field primitive element, BCH(n, k, t) may denote a Bose-Chaudhuri-Hocquenghem (BCH) code of length n, dimension k, and error correction capability t. In addition, $B_t$ may denote a BCH transform corresponding to stage t.

According to embodiments, RS(n, F) may denote an RS code of length n (symbols), where $F = d_{min} - 1$. In addition, Rt may denote an RS transform corresponding to stage t.

According to embodiments, Ps(n, k, $\alpha$) may denote a polar subcode code of length n, dimension k, and static and dynamic frozen set $\alpha$. In addition, $\delta_t$ may denote a polar subcode dynamic frozen set at stage t, $\alpha_t$ may denote a polar subcode static and dynamic frozen set at stage t according to Equation 4 below:

$$\alpha_t = \phi_t \cup \delta_t \qquad \text{(Equation 4)}$$

In addition, $Z_t$ may denote a polar subcode transform corresponding to $\alpha_t$.

According to embodiments, nested codes may be used as constituent codes. Nested codes may be codes from the same family: $\mathbb{Q}_M \subset \mathbb{Q}_{M-1} \subset \ldots \subset \mathbb{Q}_1$ of length n and dimension $k_j$, where $k_{j_1} \geq k_{j_2}$ for $j_1 < j_2$ and $j_1, j_2 \in [M]$ A code word $c \in \mathbb{Q}_{j_2}$ may also be a code word $c \in \mathbb{Q}_{j_1}$ ($j_1 < j_2$) but with some linear constraint $$T_{j_1 \to j_2} \cdot c = s_{j_1 \to j_2}, \text{ where } T_{j_1 \to j_2} \in \{0, 1\}^{(k_{j_1} - k_{j_2}) \times n} \text{ and } s \in \{0, 1\}^{k_{j_1} - k_{j_2}},$$

such that the effective dimension of the code $\mathbb{Q}_j$ is reduced from $k_{j_1}$ to $k_{j_2}$.

A transform may refer to a linear operation T applied on a constituent code word $c_i$, $i \in [L]$, $c_i \in \{0,1\}^n$ and returning the side information of code word i, $s^i \in \{0,1\}^{k_0 - K_{M-1}}$ which may be referred to as the transform space, and may be represented according to Equation 5 and Equation 6 below:

$$s^i = T \cdot c_i \qquad \text{(Equation 5)}$$

$$T \triangleq \begin{bmatrix} T_{1\to2} \\ T_{2\to3} \\ \ldots \\ \ldots \\ T_{M-1\to M} \end{bmatrix} \qquad \text{(Equation 6)}$$

According to embodiments, a polar code word $c \in \{0,1\}^n$ may be represented using an invertible polar transform matrix G and frozen space $u \in \{0,1\}^n$ according to Equation 7 and Equation 8 below:

$$c = G \cdot u \qquad \text{(Equation 7)}$$

$$u = G^{-1} \cdot c \qquad \text{(Equation 8)}$$

Some of the bits, at locations $\phi \subset [n]$ in u may be known, and may be referred to as frozen bits. The number of frozen bits, $|\phi|$ may represent the code overhead, such that the dimension of the polar code may be $k = n - |\phi|$. A polar code of length n, and dimension k may be represented as P(n, k, $\phi$), where $c \in P(n, k, \phi)$.

The disjoint sets of frozen bits may be represented as $\phi_t \subset [n]$, $t \in [M]^*$, $\phi_{t_1} \cap \phi_{t_2} = \emptyset \forall t_1 \neq t_2$ and the frozen set may be represented as $$\phi_0^j \triangleq \bigcup_{t=0}^j \phi_t.$$

Corresponding nested polar codes may be represented as $$P\left(n, k_j, \phi_0^j\right), j \in [M]^*,$$

with their corresponding dimension $$k_j = n - \left|\phi_0^j\right|.$$

This family of nested codes may be denoted $$P\left(n, k_{0 \to M}, \phi_0^{0 \to M}\right),$$

according to Equation 9 below:

$$P\left(n, k_M, \phi_0^M\right) \subset P\left(n, k_{M-1}, \phi_0^{M-1}\right) \subset \qquad \text{(Equation 9)}$$
$$\cdots \subset P\left(n, k_1, \phi_0^1\right) \subset P\left(n, k_0, \phi_0^0\right)$$

The matrix $U_\phi$ may be a $|\phi|$ over n matrix, that may select from a vector of length n the locations $\phi \subset [n]$ and the corresponding transform $P_\phi$ as shown in Equation 10 below:

$$P_\phi \triangleq U_\phi \cdot G^{-1} \qquad \text{(Equation 10)}$$

The transform of the nested code may be represented using the matrices $P_{\phi_t}$, which may be denoted as $$P_t \triangleq P_{\phi_t}$$

for convenience expressions. The transform space may include the $|\phi_t|$ bits, and symbols $s_t$ as shown in Equation 11 below:

$$s_t = P_t \cdot c, t \in [M] \qquad \text{Equation 11}$$

The transform space symbols of the polar code word c may be defined according to Equation 12 below:

$$s \triangleq \begin{bmatrix} P_1 \\ P_2 \\ \ldots \\ P_M \end{bmatrix} \cdot c \triangleq P \cdot c \qquad \text{(Equation 12)}$$

According to embodiments, a code BCH(n, k, t) may be a BCH code of length n, dimension k, and error correction capability t. The parity check matrix of such a BCH code may be defined using the primitive element $\alpha$ as shown in Equation 13 below:

$$H_t \triangleq \begin{bmatrix} 1 & \alpha & \alpha^2 & \alpha^3 & \dots & \alpha^{n-1} \\ 1 & \alpha^3 & \alpha^6 & \alpha^9 & \dots & \alpha^{3\cdot(n-1)} \\ 1 & \alpha^5 & \alpha^{10} & \alpha^{15} & \dots & \alpha^{5\cdot(n-1)} \\ \dots & \dots & \dots & \dots & & \dots \\ 1 & \alpha^{2t-3} & \alpha^{4t-6} & \alpha^{6t-9} & \dots & \alpha^{(2t-3)\cdot(n-1)} \\ 1 & \alpha^{2t-1} & \alpha^{4t-2} & \alpha^{6t-3} & \dots & \alpha^{(2t-1)\cdot(n-1)} \end{bmatrix} \quad \text{(Equation 13)}$$

For a set of error corrections parameters $t_j$, $j \in [M]^*$ such that $t_j \leq t_r \forall j < r$, with the corresponding dimension $k_j$, a family of BCH nested codes may be denoted BCH(n, $k_{0 \to M}$, $t_{0 \to M}$), and may be represented according to Equation 14 below:

$$\text{BCH}(n, k_M, t_M) \subset \text{BCH}(n, k_{M-1}, t_{M-1}) \subset \dots \subset \text{BCH}(n, k_0, t_0) \quad \text{(Equation 14)}$$

For some j, the BCH code $t_{j-1} \to t_j$ coset may be denoted $H_{t_{j-1} \to t_j}$, which may be defined according to Equation 15 below:

$$H_{t_{j-1} \to t_j} \triangleq \quad \text{(Equation 15)}$$

$$\begin{bmatrix} 1 & \alpha^{2t_{j-1}+1} & \alpha^{2(2t_{j-1}-1)} & \alpha^{3\cdot(2t_{j-1}-1)} & \dots & \alpha^{(n-1)\cdot(2t_{j-1}+1)} \\ 1 & \alpha^{2t_{j-1}+3} & \alpha^{2(2t_{j-1}+3)} & \alpha^{3\cdot(2t_{j-1}+3)} & \dots & \alpha^{(n-1)\cdot(2t_{j-1}+3)} \\ \dots & \dots & \dots & \dots & \dots & \dots \\ 1 & \alpha^{2t_j-1} & \alpha^{2(2t_j-1)} & \alpha^{3\cdot(2t_j-1)} & \dots & \alpha^{(n-1)\cdot(2t_j-1)} \end{bmatrix}$$

The BCH transform may then be defined according to Equation 16, with the corresponding transform space symbol represented according to Equation 17, and the transform space defined according to Equation 18 below:

$$B_j \triangleq H_{t_{j-1} \to t_j}, j \in [M] \quad \text{(Equation 16)}$$

$$s_j = B_j \cdot c \quad \text{(Equation 17)}$$

$$s \triangleq \begin{bmatrix} B_1 \\ B_2 \\ \dots \\ B_M \end{bmatrix} \cdot c \triangleq P \cdot c \quad \text{(Equation 18)}$$

According to embodiments, a code RS(n, F) may be an RS code of length n and minimum distance F+1.

The parity check matrix of such an RS code may be represented using the primitive element $\alpha$ as shown in Equation 19 below:

$$H_F = \begin{bmatrix} 1 & 1 & 1 & 1 & \dots & 1 \\ 1 & \alpha & \alpha^2 & \alpha^3 & \dots & \alpha^{(n-1)} \\ 1 & \alpha^2 & \alpha^4 & \alpha^6 & \dots & \alpha^{2\cdot(n-1)} \\ \dots & \dots & \dots & \dots & \dots & \dots \\ 1 & \alpha^{F-2} & \alpha^{2\cdot(F-2)} & \alpha^{3\cdot(F-2)} & \dots & \alpha^{(F-2)\cdot(n-1)} \\ 1 & \alpha^{F-1} & \alpha^{2\cdot(F-1)} & \alpha^{3\cdot(F-1)} & \dots & \alpha^{(F-1)\cdot(n-1)} \end{bmatrix} \quad \text{(Equation 19)}$$

A set of error corrections parameters may be denoted $F_t$, t=0, 1, 2, . . . M such that $F_t \leq F_r \forall t < r$ The family of RS nested codes may be denoted RS(n, $F_{0 \to M}$), and may be represented using Equation 20 below:

$$RS(n, F_M) \subset RS(n, F_{M-1}) \subset \dots \subset RS(n, F_0) \quad \text{(Equation 20)}$$

The RS code $F_t \to F_r$, $F_t \leq F_r$, coset may be denoted $H_{F_t \to F_r}$, and may be represented using Equation 21 below:

$$\text{(Equation 21)}$$

$$H_{F_t \to F_r} \triangleq \begin{bmatrix} 1 & \alpha^{F_t} & \alpha^{F_t} & \alpha^{F_t} & \dots & \alpha^{F_t \cdot (n-1)} \\ \dots & \dots & \dots & \dots & \dots & \dots \\ 1 & \alpha^{F_r-2} & \alpha^{2\cdot(F_r-2)} & \alpha^{3\cdot(F_r-2)} & \dots & \alpha^{(F_r-2)\cdot(n-1)} \\ 1 & \alpha^{F_r-1} & \alpha^{2\cdot(F_r-1)} & \alpha^{3\cdot(F_r-1)} & \dots & \alpha^{(F_r-1)\cdot(n-1)} \end{bmatrix}$$

The RS transform may then be defined according to Equation 22, with the corresponding transform space symbol represented according to Equation 23, and the transform space defined according to Equation 24 below:

$$R_t \triangleq H_{F_t \to F_{t+1}}, t \in [M] \quad \text{(Equation 22)}$$

$$s_t = R_t \cdot c \quad \text{(Equation 23)}$$

$$s \triangleq \begin{bmatrix} R_1 \\ R_2 \\ \dots \\ R_M \end{bmatrix} \cdot c \triangleq R \cdot c \quad \text{(Equation 24)}$$

According to embodiments, polar subcodes may be understood as an extension of polar codes. Polar subcodes may include static and dynamic frozen bits, both of which may be defined on the frozen space and generated using the polar transform matrix G.

The static frozen bits may be located as indices $\phi \subset [n]$ and the dynamic frozen bits may be located at indices $\delta \subset [n]$, where $\delta \cap \phi = \emptyset$.

The static frozen bits may be represented as $u_i = f_i$, $i \in \phi$, where $f_i \in \{0,1\}$. For a set of indices $J_i \subset [n]$, with the constraint that $j < i$, $\forall j \in J_i$, the dynamic frozen bit, $u_i$, $i \in \delta$ may satisfy Equation 25 below:

$$\Sigma_{j \in J_i} u_j + u_i = f_i \quad \text{(Equation 25)}$$

For disjoint sets $\alpha_t \subset [n]$, $t \in [M]$, $\alpha_t$ may represent a union of static and dynamic frozen sets, and may be expressed according to Equation 26 below:

$$\alpha_t = \phi_t \cup \delta_t. \quad \text{(Equation 26)}$$

In Equation 26, $\phi_{t_1} \cap \phi_{t_2} = \emptyset$, $\delta_{t_1} \cap \delta_{t_2} = \emptyset \forall t_1 \neq t_2$, and $\phi_{t_1} \cap \delta_{t_2} = \emptyset \forall t_1$, $t_2$.

A polar sub code $$Ps(n, k_j, \alpha_0^j), j \in [M]^*,$$

may be defined with the frozen set $$\alpha_0^j = \bigcup_{t=1}^{j} \alpha_t,$$

and the corresponding dimension $$k_j = n - |\alpha_0^j|.$$

The family or polar subcode nested codes may be denoted $$Ps(n, k_{0 \to M^r}, \alpha_0^{0 \to M},$$

and may be represented according to Equation 27 below:

$$Ps(n, k_M, \alpha_0^M) \subset Ps(n, k_{M-1}, \alpha_0^{M-1}) \subset \ldots \subset Ps(n, k_1, \alpha_0^1) \subset Ps(n, k_0, \alpha_0^0) \quad \text{(Equation 27)}$$

The corresponding transform may be denoted $Z_{\alpha_t}$, and the notation $Z_t = Z_{\alpha_t}$ may be used for convenience. The transform space may include the $|\alpha_t|$ bits, and symbols $s_t$ may be represented according to Equation 28, with the transform space symbols of code word i defined according to Equation 29 below:

$$s_t = Z_t \cdot c, \, t \in [M] \quad \text{(Equation 28)}$$

$$s \triangleq \begin{bmatrix} Z_1 \\ \ldots \\ Z_2 \\ Z_M \end{bmatrix} \cdot c \triangleq Z \cdot c \quad \text{(Equation 29)}$$

According to embodiments, a GCC may be a code which includes several constituent codes belonging to a nested codes family, a transform to a transform space, and a list of codes in the transform space, with a mapping between the code words and the transform symbols.

Figure 10:
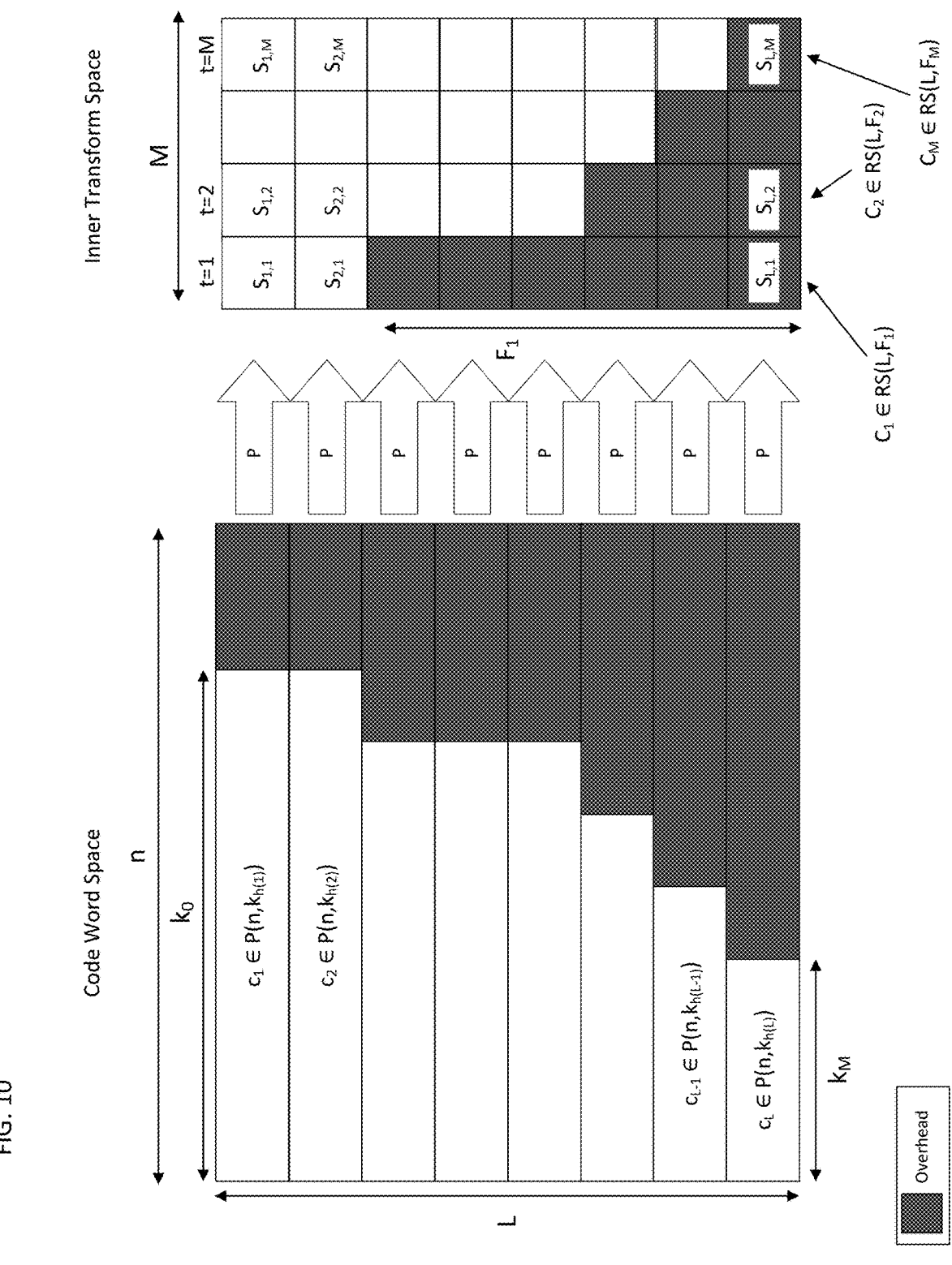
FIG. 10 shows an example code structure of a GCC S-Polar code, according to embodiments.

FIG. 10 shows an example code structure of a GCC S-Polar code, according to embodiments. As shown in FIG. 10, a GCC S-Polar code may refer to a concatenation of polar codes with RS codes. For example, a GCC S-Polar code may relate to a set of nested polar codes as shown in Equation 9, with the corresponding disjoint sets of frozen bits locations $$\phi_t \subset [n], \, t \in [M], \, \text{and} \, \phi_{t_1} \cap \phi_{t_2} = \emptyset \, \forall \, t_1 \ne t_2$$

and the frozen set $$\phi_0^j \triangleq \bigcup_{t=0}^{j} \phi_t.$$

A constraint may be added according to Equation 30 and Equation 31

$$|\phi_{i-1}^i| = m \forall \, i \in [M] \quad \text{(Equation 30)}$$

$$|\phi_0| = n - k_0 \quad \text{(Equation 31)}$$

Accordingly, the GCC S-Polar code may satisfy Equation 32 below:

$$|\phi_I^M| = M \cdot m \quad \text{(Equation 32)}$$

For example, L polar codes may each belong to one of the nested codes of Equation 9, where $$c_i \in P(n, k_{h(i)}, \phi_0^{h(i)}),$$

$i \in [L]$, of length n and dimension $k_{h(i)}$, where $k_{h(1)} \ge \ldots \ge k_{h(L)}$. A function h(i) may map a code word i to the corresponding polar nested code, such that h(1)=0 and h(L)=M. According to embodiments, L≥M, because several polar code words may belong to the same polar code. For the set of static bits $\phi_0 \subset [n]$, define $u_{\phi_0} = 0$, and an [m·M]×[n] transform matrix P may be defined according to Equation 33 below:

$$P \triangleq U_{\phi_1^M} \cdot G^{-1} = \begin{bmatrix} U_{\phi_0^1} \\ U_{\phi_1^2} \\ \ldots \\ U_{\phi_{M-1}^M} \end{bmatrix} \cdot G^{-1} \triangleq \begin{bmatrix} P_1 \\ P_2 \\ \ldots \\ P_M \end{bmatrix} \quad \text{(Equation 33)}$$

The corresponding transform space symbols $s_{i,t}$ may be represented according to Equation 34 below:

$$s_{i,t} = P_t \cdot c_i \text{ for } \forall t \in [M] \text{ and } \forall i \in [L] \quad \text{(Equation 34)}$$

Next, for all $t \in [M]$, the vector of symbols $[s_{i=1,t}, s_{i=2,t}, \ldots s_{i=L,t}]$ may be defined as an RS code word $C_t \in RS(L, F_t)$ of length L and dimension $K_t$, where $K_1 \le K_2 \ldots \le K_M$, or equivalently with $F_1 \ge F_2 \ldots \ge F_M$, where $0 \le F_t \le L$.

According to embodiments, there may be a direct relation between $$\{k_{h(i)}\}_{i=1}^{L}$$

and $$\{F_t\}_{t=1}^{M},$$

where $F_t$ is equal to the number of rows with dimension smaller than $k_0 - t \cdot m$. This relation may be represented according to Equation 35 below:

$$F_t = |\{i | k_{h(i)} < k_0 - t \cdot m\}| \quad \text{(Equation 35)}$$

The GCC S-Polar code may be denoted according to Equation 36 below:

$$GCC(L, M, n, k_0, \{F_t\}_{t=1}^{M}, P(n, k_{0 \to M}, \phi_0^{0 \to M})) \quad \text{(Equation 36)}$$

The GCC S-Polar code is described above using polar codes as constituent codes, but embodiments are not limited thereto. For example, in embodiments, other constituent codes may be used, for example BCH codes or polar sub-codes.

Figure 11:
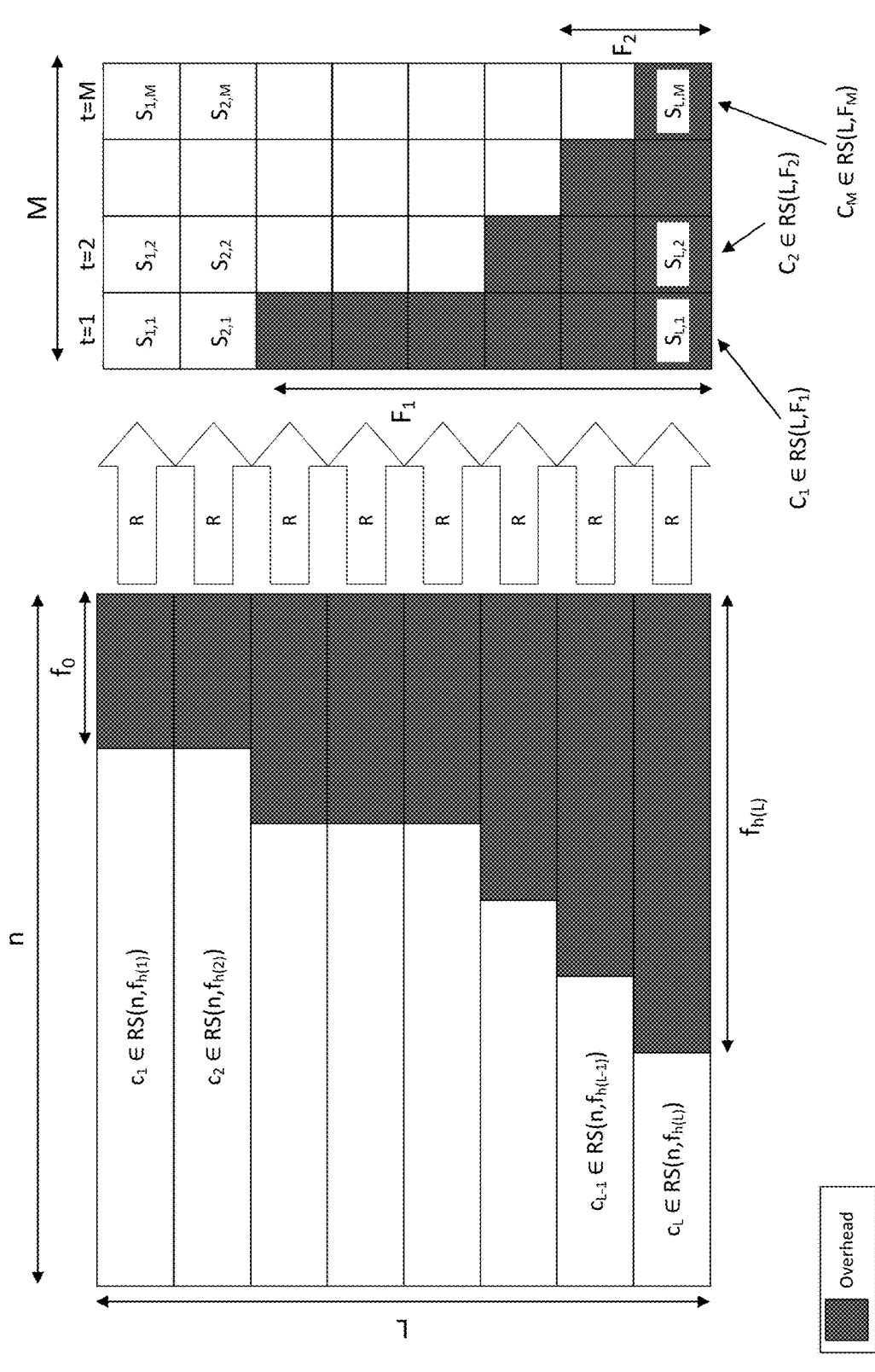
FIG. 11 shows an example code structure of a GCC S-RS code, according to embodiments.

FIG. 11 shows an example code structure of a GCC S-RS code, according to embodiments. As shown in FIG. 11, a GCC S-RS code may refer to a concatenation of RS codes with RS codes.

For example, a GCC S-RS code may relate to a set of nested RS codes, defined over $GF(2^m)$ as shown in Equation 20. A constraint may be added according to Equation 37 (the overhead difference divide m) and Equation 38:

$$f_{h(i)} - f_{h(i-1)} | m \forall i \in [L] \qquad \text{(Equation 37)}$$

$$|f_0| = n - k_0 \qquad \text{(Equation 38)}$$

Accordingly, the GCC S-RS code may satisfy Equation 39 below:

$$f_M - f_0 = M \cdot m \qquad \text{(Equation 39)}$$

For example, L RS codes may each belong to one of the nested codes, where $c_i \in RS(n, f_{h(i)})$, $i \in [L]$, of length n and dimension $k_{h(i)}$, where $f_{h(1)} \leq \ldots \leq f_{h(L)}$. The function h(i) may map a code word i to the corresponding RS nested code, such that h(1)=0 and h(L)=M. An $[m \cdot M] \times [n]$ transform matrix R may be defined according to Equation 40 below:

$$R \triangleq \begin{bmatrix} R_1 \\ R_2 \\ \ldots \\ R_M \end{bmatrix} \qquad \text{(Equation 40)}$$

The corresponding transform space symbols $s_{i,t}$ may be represented according to Equation 41 below for $\forall t \in [M]$ and $\forall i \in [L]$:

$$s_{i,t} = R_t c_i \qquad \text{(Equation 41)}$$

Next, for all $t \in [M]$, the vector of symbols $[s_{i=1,t}, s_{i=2,t}, \ldots s_{i=L,t}]^T$ may be defined as an RS code word $C_t \in RS(L, F_t)$ of length L and dimension $K_t$, where $K_1 \leq K_2 \ldots \leq K_M$, or equivalently, $F_1 \geq F_2 \ldots \geq F_M$.

The GCC S-RS code may be denoted according to Equation 42 below:

$$GCC(L, M, n, f_0, \{F_t\}_{t=1}^M, RS(n, f_{0 \to M})) \qquad \text{(Equation 42)}$$

Figure 12B:
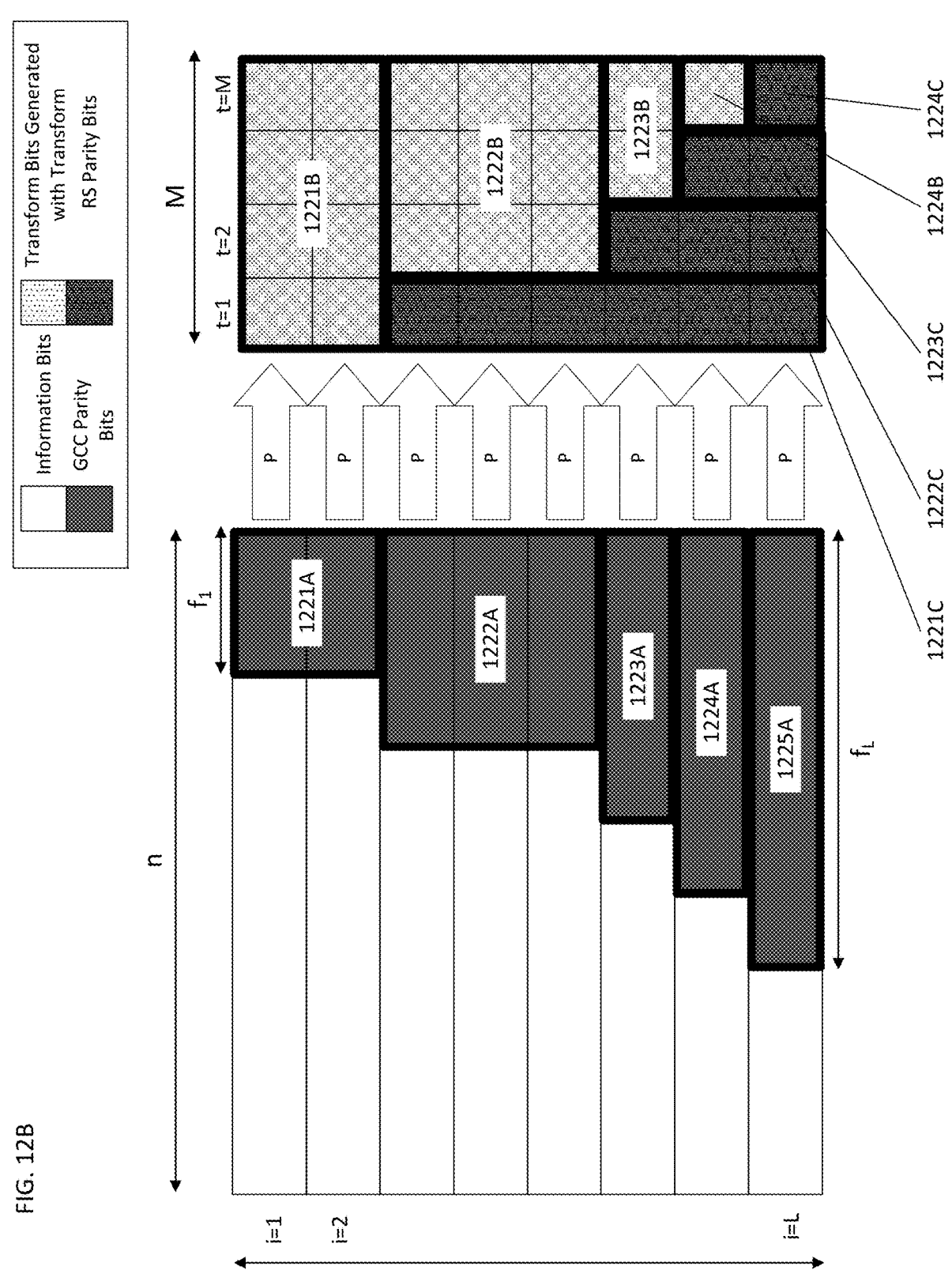
FIG. 12B illustrates an example encoding order, according to embodiments.

FIGS. 12A-12C relate to examples of encoding processes for GCC codes, for example the GCC codes discussed above. According to embodiments, the GCC encoding processes may be performed using any element described above, for example the storage device 200 discussed above with respect to FIG. 2A, the ECC encoding circuit 510 discussed above with respect to FIG. 2B, the ECC encoder module 822 discussed above with respect to FIG. 8, or any other element.

FIG. 12A illustrates an example of a sequential encoding algorithm which may be used to perform GCC encoding, presented in pseudo-code as Algorithm 1. According to embodiments, a GCC systematic encoder may be applied for any GCC code parameters. For example, according to embodiments, a GCC systematic encoder may perform an encoding operation corresponding to Algorithm 1 on a GCC code word according to Equation 43 below:

$$w_p \in GCC(L, M, n, k_0, \{F_t\}_{t=1}^M, P(n, k_{0 \to M}, \phi_0^{0 \to M})) \qquad \text{(Equation 43)}$$

The GCC encoding algorithm may include criss-cross activations of a coset systematic polar encoder and RS systematic encoder. In embodiments, the coset polar encoder may be represented according to Equation 44 below:

$$c = ENC_{Polar}(r, u_\phi) \qquad \text{(Equation 44)}$$

The coset polar encoder according to Equation 44 may receive information bits r and frozen values $u_\phi$ at locations $\phi$, and may return a systematic encoded word c, where $|u_\phi| = |\phi|$ and $|i| = n - |\phi|$. According to embodiments, the information bits may be located in the first bits $[n - |\phi|]$.

The RS systematic encoder may be represented according to Equation 45 below:

$$v = ENC_{RS}(u, F) \qquad \text{(Equation 45)}$$

The RS systematic encoder according to Equation 45 may receive information symbols u and return RS code word symbols v to generate an RS code word with $d_{min} = F + 1$, where $|u| = L - F$ and $|v| = L$.

FIG. 12B illustrates an example encoding order which may correspond to the GCC encoding algorithm discussed above. As shown in FIG. 12B, the code number of information bits is $$\sum_{i=1}^L k_{h(i)}$$

and the code number of overhead bits is $$L \cdot n - \sum_{i=1}^L k_{h(i)}.$$

The information bits locations may be provided by Equation 46 below:

$$\gamma = \bigcup_{i=1}^L [(i-1) \cdot n + 1, (i-1) \cdot n + k_{h(i)}] \qquad \text{(Equation 46)}$$

As shown in FIG. 12B, at operation 1221A, GCC parity bits for polar code words at i=[1,2] may be determined using a polar encoder. At operation 1221B, the transform space for the polar code words at i=[1,2] may be determined using a transform, for example as shown in Equation 34. At operation 1221C, RS parity bits for the RS code word at t=1 may be determined using an RS encoder.

As further shown in FIG. 12B, at operation 1222A, GCC parity bits for polar code words at i=[3,4,5] may be determined using the polar coset encoder based on the transform space symbols of t=1, generated in operation 1221C. At operation 1222B, the transform space for the polar code words at i=[3,4,5] may be determined using the transform. At operation 1222C, RS parity bits for an RS code word at t=2 may be determined using the RS encoder.

As further shown in FIG. 12B, at operation 1223A, GCC parity bits for a polar code word at i=[6] may be determined using the polar coset encoder based on the transform space symbols of t=[1,2], generated in operations 1221C and 1222C. At operation 1223B, the transform space for the polar code word at i=[6] may be determined using the transform. At operation 1223C, RS parity bits for an RS code word at t=3 may be determined using the RS encoder.

As further shown in FIG. 12B, at operation 1224A, GCC parity bits for a polar code word at i=[7] may be determined using the polar coset encoder based on the transform space symbols of t=[1,2], generated in operations 1221C, 1222C, and 1223C. At operation 1224B, the transform space for the polar code word at i=[7] may be determined using the transform. At operation 1224C, RS parity bits for an RS code word at t=3 may be determined using the RS encoder.

As further shown in FIG. 12B, at operation 1225A, GCC parity bits for a polar code word at i=[8] may be determined using the polar coset encoder based on the transform space symbols of t=[1,2], generated in operations 1221C, 1222C, 1223C, and 1224C.

According to embodiments, operations 1221A, 122A, 1223A, 1224A, and 1225A may correspond to "Step A" of Algorithm 1, operations 1221B, 122B, 1223B, and 1224B may correspond to "Step B" of Algorithm 1, and operations 1221C, 1222C, 1223C, and 1224C may correspond to "Step C" of Algorithm 1.

FIG. 12C is a flowchart of an encoding process, according to embodiments. For example, process 1200 as shown in FIG. 12C may correspond to some or all of Algorithm 1 discussed above. In embodiments, some or all of process 1200 may be performed using a polar coset encoder, for example the polar coset encoder discussed above. For example, at operation 1231, the process 1200 may include encoding a next polar code word. At operation 1232, the process 1200 may include updating the transform space corresponding to the encoded polar code word. At operation 1233, the process 1200 may include determining whether the last polar code word has been reached. Based on determining that the last polar code word has been reached (YES at operation 1233), the process 1200 may proceed to operation 1234, and output the GCC code word. Based on determining that the last polar code word has not been reached (NO at operation 1233), the process 1200 may proceed to operation 1235, which may include determining whether the next polar code word has a same degree as the polar code word encoded in operation 1231. Based on determining that the next polar code word does have the same degree (YES at operation 1235), the process 1200 may return to operation 1231. Based on determining that the next polar code word does not have the same degree (NO at operation 1235), the process 1200 may proceed to operation 1236.

At operation 1236, the process 1200 may include encoding a next RS code word. At operation 1237, the process 1200 may include determining whether the last RS code word has been reached. Based on determining that the last RS code word has been reached (YES at operation 1237), the process 1200 may proceed to operation 1238, which may include updating the polar code words based on results of encoding the RS code words, and then returning to operation 1231. Based on determining that the last RS code word has not been reached, the process 1200 may proceed to operation 1239, which may include determining whether the next RS code word has a same degree. Based on determining that the next RS code word does have the same degree (YES at operation 1235), the process 1200 may return to operation 1236. Based on determining that the next RS code word does not have the same degree (NO at operation 1235), the process 1200 may proceed to operation 1238.

According to embodiments, the GCC encoding processes discussed above may be performed using any element described herein, for example the storage device 200 discussed above with respect to FIG. 2A, the ECC encoding circuit 510 discussed above with respect to FIG. 2B, the ECC encoder module 822 discussed above with respect to FIG. 8, or any other element.

According to embodiments, the GCC code could instead be defined with at least one of a polar sub-code, a BCH code, and a GCC code as a constituent code, and different systematic encoders may be used.

Figure 13B:
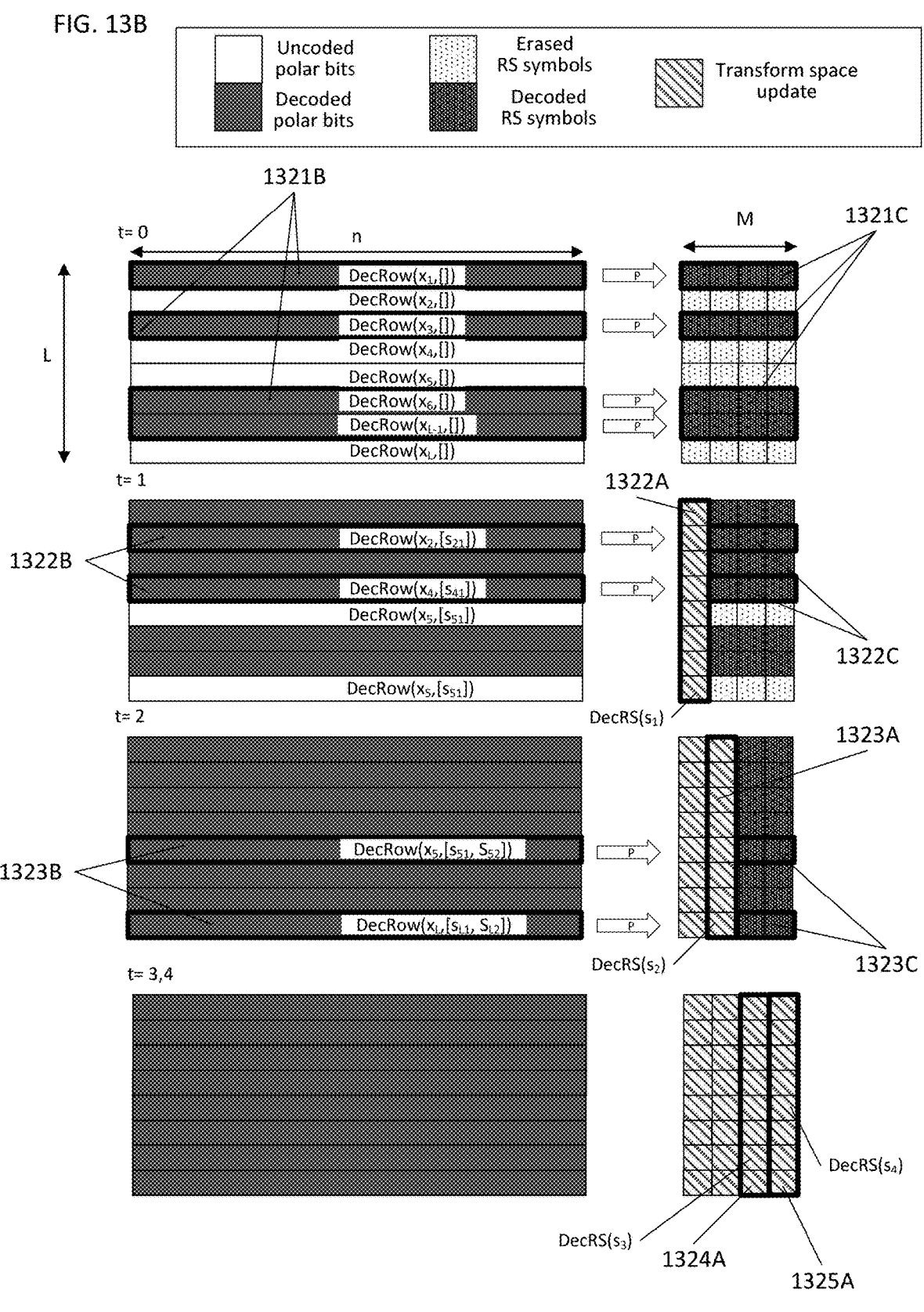
FIG. 13B illustrates an example decoding order, according to embodiments.
Figure 13C:
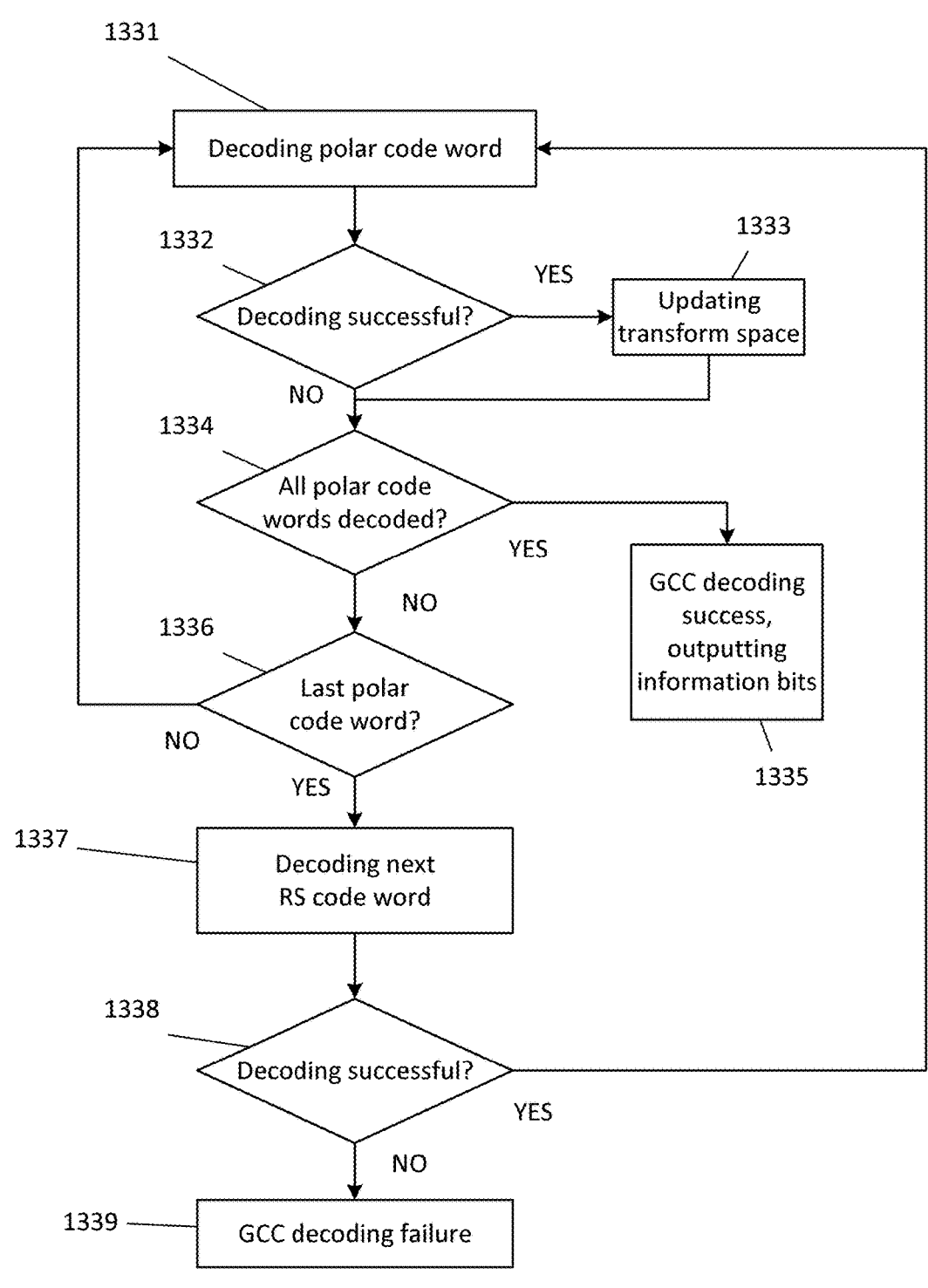
FIG. 13C is a flowchart of a decoding process, according to embodiments.

FIGS. 13A-13C relate to examples of decoding processes for GCC codes, for example the GCC codes discussed above. According to embodiments, the GCC decoding processes may be performed using any element described above, for example the storage device 200 discussed above with respect to FIG. 2A, the ECC decoding circuit 520 discussed above with respect to FIG. 2B, the ECC decoder module 824 discussed above with respect to FIG. 8, or any other element.

FIG. 13A illustrates an example of a sequential decoding algorithm which may be used to perform GCC decoding, presented in pseudo-code as Algorithm 2.

The GCC decoding algorithm may include sequential activations of coset polar decoders followed by activation of an RS decoder, until the entire GCC code word is decoded.

The GCC decoding algorithm may include a coset polar decoder which may be represented according to Equation 47 below:

$$[u, c] = DecRow\left(x, \{s_{i,q}\}_{q=1}^t, k_0\right) \qquad \text{(Equation 47)}$$

The coset polar decoder according to Equation 47 may receive the word measurements (x) and the coset $$\left(\{s_{i,q}\}_{q=1}^t\right),$$

and may return the decoder success status (u) and the decoded code word (c). The polar code basic correction may depend on the dimension $k_0$.

The RS decoder may be represented according to Equation 48 below:

$$\left[u, \{s_{i,t}\}_{i=1}^L, \{u_i\}_{i=1}^L\right] = DecRS\left(\{s_{i,t}\}_{i=1}^L, \{u_i\}_{i=1}^L\right) \qquad \text{(Equation 48)}$$

The RS decoder may receive the input symbols $$\left(\{s_{i,t}\}_{i=1}^L\right)$$

(which may be erased) and the symbol status $$\left(\{u_i\}_{i=1}^L\right),$$

and may return the decoder success status (u), the corrected symbols $$\left(\{s_{i,t}\}_{i=1}^L\right)$$

and the updated symbol status $$\left(\{u_i\}_{i=1}^L\right).$$

In case a symbol status was correct, but the RS decoder found an error, the symbol status may become failure.

FIG. 13B illustrates an example decoding order which may correspond to the GCC decoding algorithm discussed above.

As shown in FIG. 13B, at t=0, the RS decoder may not be applied, and the row decoder may be applied without coset values. In the example shown in FIG. 13B, four rows are decoded successfully at operation 1321B, and the corresponding transform space is updated at operation 1321C.

For t=1, the RS decoder may correct the missing symbols at operation 1322A, the row decoder may be applied on the four remaining rows with one coset symbol at operation 1322B. In the example shown in FIG. 13B, two rows are decoded successfully at operation 1322A, and the corresponding transform space is updated at operation 1322C.

For t=2, the RS decoder may correct the missing symbols at operation 1323A, the row decoder may be applied on the two remaining rows with two coset symbols at operation 1323B. In the example shown in FIG. 13B, the two remaining rows are decoded successfully at operation 1323B, and the corresponding transform space is updated at operation 1323C.

For t=3, the RS decoder may correct the missing symbols at operation 1324A. In the example shown in FIG. 13B, this may include simply validating that the symbols are valid, because there are no erased symbols remaining, and therefore no need to apply steps B and C of the GCC decoding algorithm.

For t=4, the RS decoder may correct the missing symbols at operation 1325A. In the example shown in FIG. 13B, this may include simply validating that the symbols are valid, because there are no erased symbols remaining, and therefore no need to apply steps B and C of the GCC decoding algorithm.

FIG. 13C is a flowchart of an encoding process, according to embodiments. For example, process 1300 as shown in FIG. 13C may correspond to some or all of Algorithm 2 discussed above. In embodiments, some or all of process 1300 may be performed using a polar coset decoder, for example the polar coset decoder discussed above. For example, at operation 1331, the process 1300 may include decoding a next polar code word. At operation 1332, the process 1300 may include determining whether decoding was successful. Based on determining that decoding was successful (YES at operation 1332), the process 1300 may proceed to operation 1333, and update the transform space based on the decoded polar code word. Based on determining that decoding was not successful (NO at operation 1332), the process 1300 may proceed to operation 1334, which may include determining whether all polar code words have been decoded. Based on determining that all polar code words have been decoded (YES at operation 1334), the process 1300 proceed to operation 1335, at which GCC decoding is successful, and the information bits may be output. Based on determining that all polar code words have not been decoded (NO at operation 1335), the process 1300 may proceed to operation 1336, which may include determining whether the last polar code word has been reached. Based on determining that the last polar code word has been reached (YES at operation 1336), the process 1300 may proceed to operation 1337. Based on determining that the last polar code word has not been reached (NO at operation 1336), the process 1300 may return to operation 1331, and decode the next polar code word.

At operation 1337, the process 1300 may include decoding a next RS code word. At operation 1338, the process 1300 may include determining whether decoding was successful. Based on determining that decoding was successful (YES at operation 1338), the process 1300 may return to operation 1331, and begin the next round of the decoding algorithm. Based on determining that decoding was not successful (NO at operation 1338), the process 1300 may proceed to operation 1339, at which the GCC decoding may be determined to be a failure.

According to embodiments, the GCC decoding processes discussed above may be performed using any element described herein, for example the storage device 200 discussed above with respect to FIG. 2A, the ECC decoding circuit 520 discussed above with respect to FIG. 2B, the ECC decoder module 824 discussed above with respect to FIG. 8, or any other element.

As discussed above, according to embodiments, the GCC could instead be defined with at least one of a polar sub-code, a BCH code, and a GCC code as a constituent code, and different systematic encoders may be used.

In some embodiments, $N=n \cdot L$ bits may be transmitted on L different channels, each with different quality, defined as $CH_i$, $i \in [L]$. According to embodiments, channel quality may refer to the number of erasures in binary erasure channel (BEC) channel, the number of errors in a binary symmetric channel (BSC) channel, the SNR in an additive white Gaussian noise (AWGN) channel, or mutual information or capacity for a general channels.

In embodiments, the channel quality, which may be denoted by $Q(\ )$, may be ordered in descending order from the best to the worst, such that Equation 49 below holds:

$$Q(CH_i) \geq Q(CH_j) \forall i < j \qquad \text{(Equation 49)}$$

A GCC code, such as the GCC code discussed above, does not depend on, or vary based on, the bit index or symbol index, and therefore provides similar protection for each channel. In some devices, for example flash storage devices, the channels may vary, and therefore GCC codes such as the GCC codes discussed above may have low performance.

Accordingly, embodiments may relate to an A-GCC code structure, which may be an extension to the GCC code structure. In embodiments, the A-GCC code structure may provide different error protection levels for each channel $CH_i$ by defining different basic protection for each constituent code $c_i$.

According to embodiments, nested codes may be used as constituent codes, for example nested codes from the same family: $\mathbb{Q}_{M+\Delta} \subset \mathbb{Q}_{M+\Delta-1} \subset \ldots \subset \mathbb{Q}_0$ of length n and dimension $k_j$, where $k_{j_1} \geq k_{j_2}$ for $j_1 < j_2$ and $j_1, j_2 \in [M+\Delta]$, where $M \geq 0$ and $\Delta \geq 0$.

In embodiments, Equation 50 and Equation 51 below may hold:

$$k_{j_1} - k_{j_1+1} = m \qquad \text{(Equation 50)}$$

$$m > 0 \qquad \text{(Equation 51)}$$

The codes may be nested because every word c in $\mathbb{Q}_{j_2}$, ($c \in \mathbb{Q}_{j_2}$) may also be a code word in codes with higher dimension $\mathbb{Q}_{j_1}$, $c \in \mathbb{Q}_{j_1}$ ($j_1 < j_2$).

For the matrix $$T_{j_1 \to j_2} \in \{0, 1\}^{(k_{j_1} - k_{j_2}) \times n}$$

and a vector $$s \in \{0, 1\}^{k_{j_1} - k_{j_2}},$$

only code words in $\mathbb{Q}_{j_1}$, $c \in \mathbb{Q}_{j_1}$, meeting the linear constrain $$T_{j_1 \to j_2} \cdot c = s_{j_1 \to j_2},$$

may also be code words in $\mathbb{Q}_{j_2} (c \in \mathbb{Q}_{j_2})$. Therefore, the effective dimension of the code $\mathbb{Q}_{j_2}$ may be reduced from $k_{j_1}$ to $k_{j_2}$.

Unlike GCC codes, for example the GCC codes discussed above, each code word $c_i$ in an A-GCC code according to embodiments may have a different basic protection, such that the dimension of a code word i, without side information from the transform space, may be $k_0 - \Delta_i \cdot m$, where $0 \leq \Delta_i \leq \Delta$.

According to embodiments, $Q(CH_i) \geq Q(CH_j) \forall_{i < j}$. Therefore, the basic protection of code word i may be $\Delta_i$, and Equation 52, Equation 53, and Equation 54 below may hold:

$$\Delta_1 = 0 \qquad \text{(Equation 52)}$$

$$\Delta_i \leq \Delta_j \forall i < j \qquad \text{(Equation 53)}$$

$$\Delta_L = \Delta \qquad \text{(Equation 54)}$$

According to embodiments, a different transform may be defined for each code word i, as a linear operation $T^i$ applied on a constituent code word $c_i$, $i \in [L]$, $c_i \in \{0,1\}^n$, returning the side information of code word i, $s^i \in \{0,1\}^{M \cdot m}$, which may be referred to as the transform space, and may be represented according to Equation 55 and Equation 56 below:

$$s^i = T^i \cdot c_i \qquad \text{(Equation 55)}$$

$$T^i \triangleq \begin{bmatrix} T_{1+\Delta_i \to 2+\Delta_i} \\ T_{2+\Delta_i \to 3+\Delta_i} \\ \cdots \\ \cdots \\ T_{M-1+\Delta_i \to M+\Delta_i} \end{bmatrix} \qquad \text{(Equation 56)}$$

The transform space of code word i may be defined by a vector of M symbols, each of size m, according to Equation 57 below:

$$s^i = [s_{i,t=1}, s_{i,t=2}, \ldots s_{i,t=M}]^T \qquad \text{(Equation 57)}$$

As can be seen above, the transform space may be defined differently for each code word, according to Equations 55 and 56, and the parameter $\Delta_i$.

In embodiments, for all $t \in [M]$, the vector of symbols $[s_{i=1,t}, s_{i=2,t}, \ldots s_{i=L,t}]^T$, may be a code word $C_t$ of length L and dimension $K_t$, where $K_1 \leq K_2 \ldots \leq K_M$.

Figure 14:
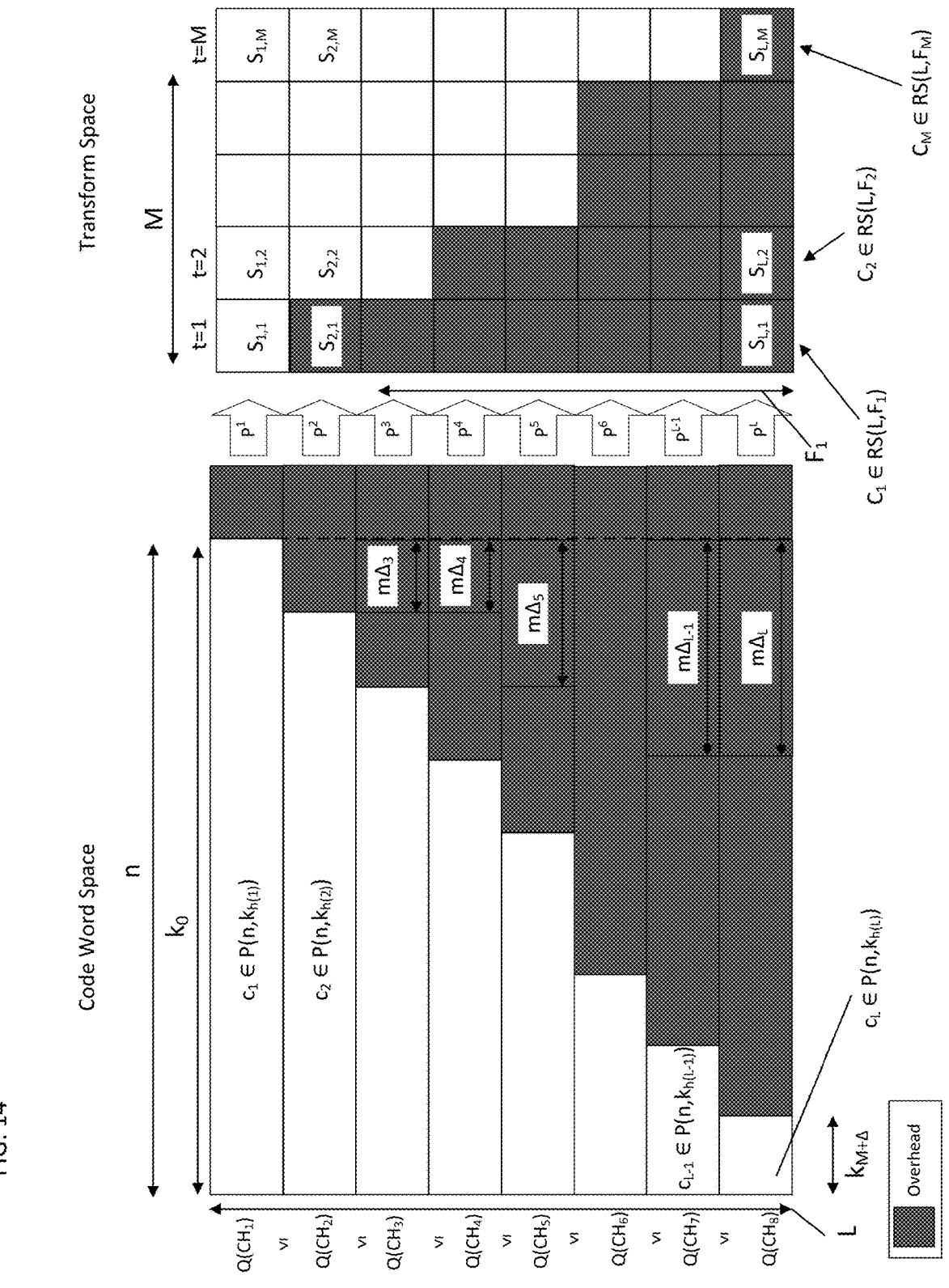
FIG. 14 illustrates an example of a code structure for an A-GCC code, according to embodiments.

FIG. 14 shows an example code structure of a GCC S-Polar code, according to embodiments. As shown in FIG. 14, an A-GCC S-Polar code may refer to a concatenation of polar codes with RS codes. For example, an A-GCC S-Polar code according to embodiments may include nested polar codes as defined in Equation 9 above, with the corresponding disjoint sets of frozen bits locations $\phi_t \subset [n]$, $t \in [M+\Delta]$, and $\phi_{t_1} \cap \phi_{t_2} = \emptyset \forall t_1 \neq t_2$ and the frozen set $$\phi_0^j \triangleq \bigcup_{t=0}^{j} \phi_t.$$

According to embodiments, a constraint may be added according to Equation 57 and Equation 58 below:

$$|\phi_i| = m \forall i \in [M+\Delta] \qquad \text{(Equation 57)}$$

$$|\phi_0| = n - k_0 \qquad \text{(Equation 58)}$$

Accordingly, the A-GCC S-Polar code may satisfy Equation 59 below:

$$\left| \phi_j^{j+M} \right| = M \cdot m \ \forall \ 1 \leq j < \Delta \qquad \text{(Equation 59)}$$

For example, L polar code words may each belong to one of the nested codes, where $$c_i \in P\left(n, k_{h(i)}, \phi_0^{h(i)}\right),$$

$i \in [L]$, of length n and dimension $k_{h(i)}$, where $k_{h(1)} \geq \ldots \geq k_{h(L)}$. A function h(i) may map the code word i to the corresponding polar nested code, and Equation 60 and Equation 61 below may hold:

$$h(1) = 0 \qquad \text{(Equation 60)}$$

$$h(L) = M + \Delta \qquad \text{(Equation 61)}$$

Each polar code word $c_i$ may have a corresponding basic protection $\Delta_i$ such that for the set of static bits $$\phi_0^{\Delta_i} \subset [n],$$

Equation 62 and the Equivalent Equation 63 below may hold:

$$u_{\phi_0^{\Delta_i}} = 0 \qquad \text{(Equation 62)}$$

$$U_{\phi_0^{\Delta_i}} \cdot G^{-1} \cdot c_i = 0 \qquad \text{(Equation 63)}$$

An [m·M]×[n] transform matrix $P^i$ may be defined according to Equation 64 below:

$$P^i = \Delta U_{\phi_{1+\Delta_i}^{M+\Delta_i}} \cdot G^{-1} = \begin{bmatrix} U_{\phi_{1+\Delta_i}^{1+\Delta_i}} \\ U_{\phi_{2+\Delta_i}^{2+\Delta_i}} \\ \cdots \\ U_{\phi_{M+\Delta_i}^{M+\Delta_i}} \end{bmatrix} \cdot G^{-1} \triangleq \begin{bmatrix} P_1^i \\ P_2^i \\ \cdots \\ P_M^i \end{bmatrix} \qquad \text{(Equation 64)}$$

The corresponding transform space symbols $s_{i,t}$ may be represented according to Equation 65 below:

$$s_{i,t} = P_t^i \cdot c_i \text{ for } \forall \ t \in [M] \text{ and } \forall \ i \in [L] \qquad \text{(Equation 64)}$$

Next, for all $t \in [M]$, the vector of symbols $[s_{i=1,t}, s_{i=2,t}, \ldots s_{i=L,t}]^T$ may be defined as an RS code word $C_t \in RS(L, F_t)$ of length L and dimension $K_t$, where $K_1 \leq K_2 \ldots \leq K_M$, or equivalently with $F_1 \geq F_2 \ldots \geq F_M$, where $0 \leq F_t \leq L$ According to embodiments, there may be a direct relation between $$\{k_{h(i)}\}_{i=1}^{L} \text{ and } \{F_t\}_{t=1}^{M}.$$

This relation may be represented according to Equation 65 below:

$$F_t + |\{i | k_{h(i)} < k_0 + \Delta_i - t \cdot m\}| \qquad \text{(Equation 65)}$$

The A-GCC S-Polar code may be denoted according to Equation 66 below:

$$AGCC\big(L, M, n, k_0, \{F_t\}_{t=1}^{M}, P(n, k_{0 \to M}, \phi_0^{0 \to M}), \{\Delta_i\}_{i=1}^{L}\big) \qquad \text{(Equation 64)}$$

The A-GCC S-Polar code is described above using polar codes as constituent codes, but embodiments are not limited thereto. For example, in embodiments, other constituent codes may be used, for example BCH codes or polar sub-codes. As another example, an A-GCC code according to embodiments may be implemented as a concatenation of RS codes, and may be referred to as an A-GCC S-RS code.

Figure 15B:
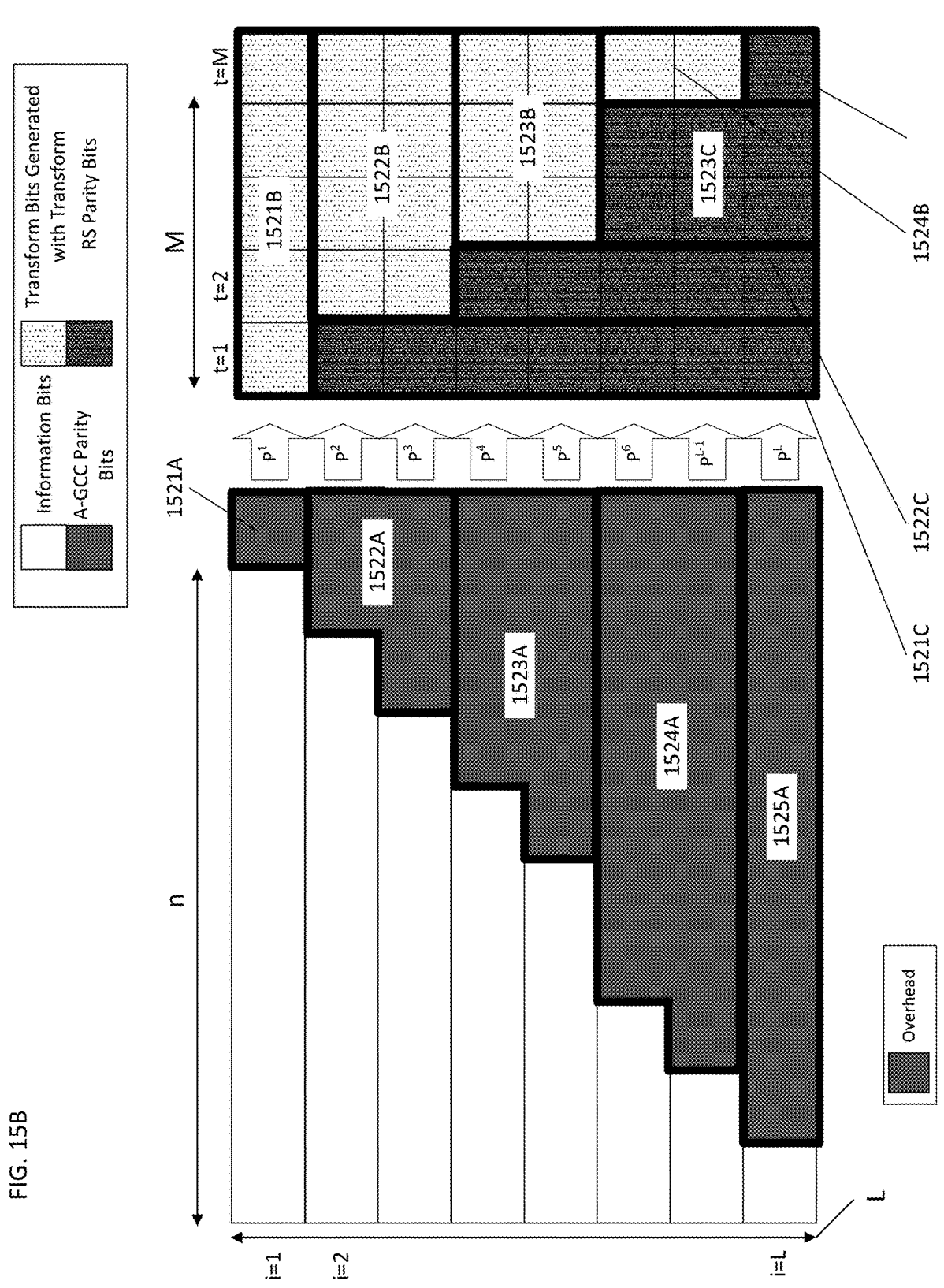
FIG. 15B illustrates an example encoding order, according to embodiments.
Figure 15C:
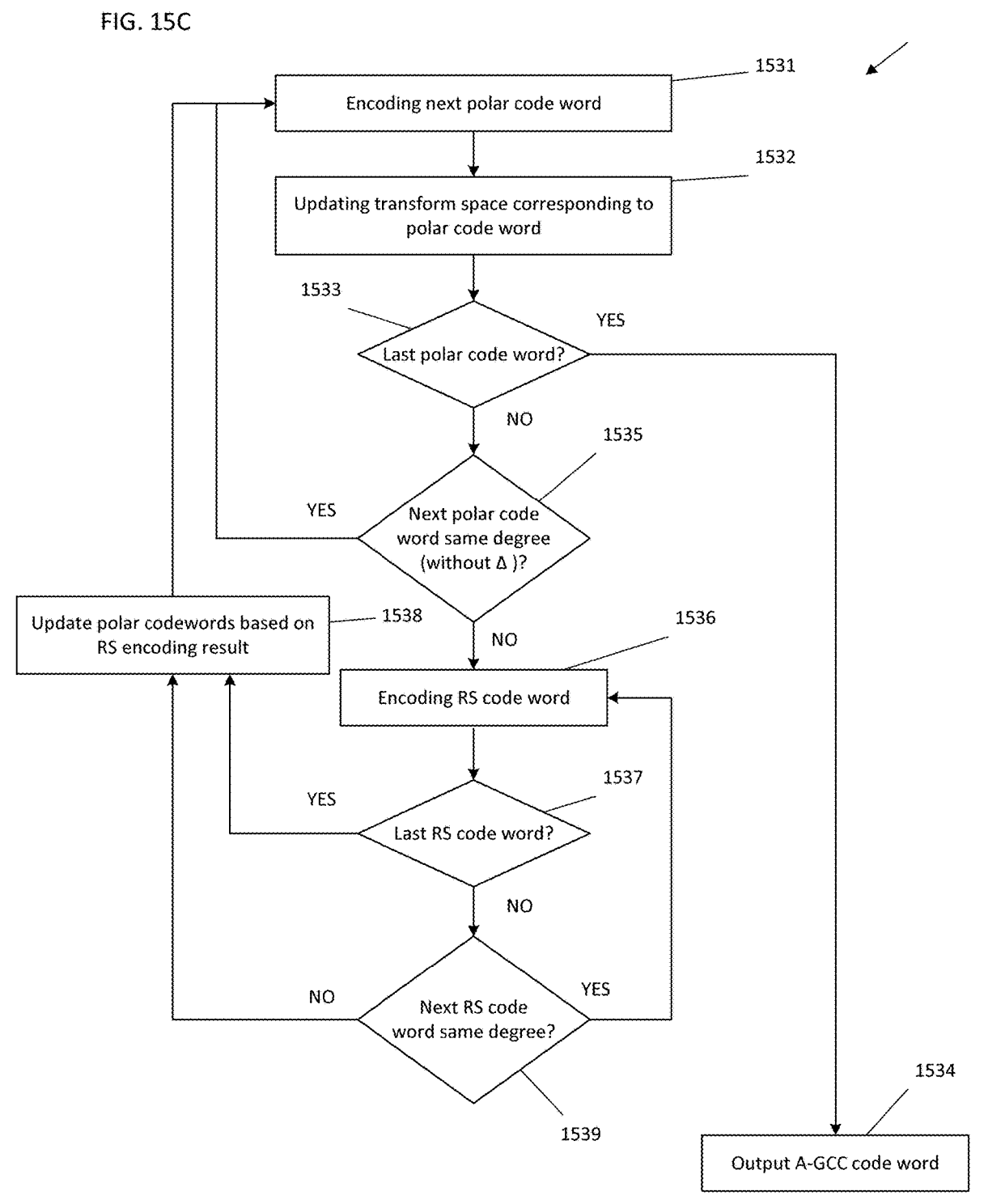

FIGS. 15A-15C relate to examples of encoding processes for A-GCC codes, for example the A-GCC codes discussed above. According to embodiments, the A-GCC encoding processes may be performed using any element described above, for example the storage device 200 discussed above with respect to FIG. 2A, the ECC encoding circuit 510 discussed above with respect to FIG. 2B, the ECC encoder module 822 discussed above with respect to FIG. 8, or any other element.

FIG. 15A illustrates an example of a sequential encoding algorithm which may be used to perform A-GCC encoding, presented in pseudo-code as Algorithm 3. According to embodiments, an A-GCC systematic encoder may be applied for any A-GCC code parameters. For example, according to embodiments, an A-GCC systematic encoder may perform an encoding operation corresponding to Algorithm 3 on an A-GCC S-Polar code word according to Equation 65 below:

$$w \in \qquad \text{(Equation 65)}$$

$$AGCC\big(L, M, n, k_0, \{F_t\}_{t=1}^{M}, P(n, k_{0 \to M + \Delta}, \phi_0^{0 \to M + \Delta}), \{\Delta_i\}_{i=1}^{L}\big)$$

As can be seen in FIG. 15A, Algorithm 3 may be similar to Algorithm 1 discussed above, except that the A-GCC systematic encoder of Algorithm 3 may be operate in consideration of $\Delta_i$. For example, the A-GCC systematic encoder of Algorithm 3 may use a different basic protection of the row encoder ($k_0 - \Delta_i \cdot m$ instead of $k_0$), and may use a different transform for each row ($P^i$ instead of $P$).

FIG. 15B illustrates an example encoding order which may correspond to the GCC encoding algorithm discussed above.

As shown in FIG. 15B, at operation 1521A, A-GCC parity bits for polar code words at i=[1] may be determined using a polar encoder. At operation 1521B, the transform space for the polar code words at i=[1] may be determined using a transform P1 corresponding to the polar code word. At operation 1521C, RS parity bits for the RS code word at t=1 may be determined using an RS encoder.

As further shown in FIG. 15B, at operation 1522A, A-GCC parity bits for polar code words at i=[2,3] may be determined using the polar coset encoder based on the transform space symbols of t=1, generated in operation 1521C. At operation 1522B, the transform space for the polar code words at i=[2,3] may be determined using the transforms P2 and P3. At operation 1522C, RS parity bits for an RS code word at t=2 may be determined using the RS encoder.

As further shown in FIG. 15B, at operation 1523A, A-GCC parity bits for a polar code word at i=[4,5] may be determined using the polar coset encoder based on the transform space symbols of t=[1,2], generated in operations 1521C and 1522C. At operation 1523B, the transform space for polar code words at i=[4,5] may be determined using the transforms P4 and P5. At operation 1523C, RS parity bits for an RS code word at t=3 and t=4 may be determined using the RS encoder.

As further shown in FIG. 15B, at operation 1524A, A-GCC parity bits for polar code words at i=[6,7] may be determined using the polar coset encoder based on the transform space symbols of t=[1,2,3,4], generated in operations 1521C, 1522C, and 1523C. At operation 1524B, the transform space for the polar code word at i=[6,7] may be determined using the transforms P6 and P7. At operation 1524C, RS parity bits for an RS code word at t=5 may be determined using the RS encoder.

As further shown in FIG. 15B, at operation 1525A, A-GCC parity bits for a polar code word at i=[8] may be determined using the polar coset encoder based on the transform space symbols of t=[1,2,3,4,5], generated in operations 1521C, 1522C, 1523C, and 1524C.

According to embodiments, operations 1521A, 152A, 1523A, 1524A, and 1525A may correspond to "Step A" of Algorithm 3, operations 1521B, 152B, 1523B, and 1524B may correspond to "Step B" of Algorithm 3, and operations 1521C, 1522C, 1523C, and 1524C may correspond to "Step C" of Algorithm 3.

Similar to the example discussed above with respect to FIGS. 15A-12C, the code number of information bits is $$K = \sum_{i=1}^{L} k_{h(i)},$$

and the code length is $N = L \cdot n$, resulting in a code rate of $$R = \frac{K}{N}.$$

FIG. 15C is a flowchart of an encoding process, according to embodiments. For example, process 1500 as shown in FIG. 15C may correspond to some or all of Algorithm 3 discussed above. In embodiments, some or all of process 1500 may be performed using a polar coset encoder, for example the polar coset encoder discussed above. For example, at operation 1531, the process 1500 may include encoding a next polar code word. At operation 1532, the process 1500 may include updating the transform space corresponding to the encoded polar code word. In embodiments, operation 1532 may differ from operation 1232 discussed above in that the transform used in operation 1532 may be a transform that is specific to the polar code word that is encoded at operation 1531.

At operation 1533, the process 1500 may include determining whether the last polar code word has been reached. Based on determining that the last polar code word has been reached (YES at operation 1533), the process 1500 may proceed to operation 1534, and output the A-GCC code word. Based on determining that the last polar code word has not been reached (NO at operation 1533), the process 1500 may proceed to operation 1535, which may include determining whether the next polar code word has a same degree as the polar code word encoded in operation 1531. In embodiments, operation 1535 may differ from operation 1235 discussed above in that the degrees may be determined in operation 1535 may be determined by excluding $\Delta_i$.

Based on determining that the next polar code word does have the same degree (YES at operation 1535), the process 1500 may return to operation 1531. Based on determining that the next polar code word does not have the same degree (NO at operation 1535), the process 1500 may proceed to operation 1536.

At operation 1536, the process 1500 may include encoding a next RS code word. At operation 1537, the process 1500 may include determining whether the last RS code word has been reached. Based on determining that the last RS code word has been reached (YES at operation 1537), the process 1500 may proceed to operation 1538, which may include updating the polar code words based on results of encoding the RS code words, and then returning to operation 1531. Based on determining that the last RS code word has not been reached, the process 1500 may proceed to operation 1539, which may include determining whether the next RS code word has a same degree. Based on determining that the next RS code word does have the same degree (YES at operation 1535), the process 1500 may return to operation 1536. Based on determining that the next RS code word does not have the same degree (NO at operation 1535), the process 1500 may proceed to operation 1538.

According to embodiments, the A-GCC encoding processes discussed above may be performed using any element described herein, for example the storage device 200 discussed above with respect to FIG. 2A, the ECC encoding circuit 510 discussed above with respect to FIG. 2B, the ECC encoder module 822 discussed above with respect to FIG. 8, or any other element.

According to embodiments, the A-GCC code could instead be defined with at least one of a polar sub-code, a BCH code, and a GCC code as a constituent code, and different systematic encoders may be used.

FIG. 16 relates to examples of decoding processes for A-GCC codes, for example the A-GCC codes discussed above. According to embodiments, the A-GCC decoding processes may be performed using any element described above, for example the storage device 200 discussed above with respect to FIG. 2A, the ECC decoding circuit 520 discussed above with respect to FIG. 2B, the ECC decoder module 824 discussed above with respect to FIG. 8, or any other element.

FIG. 16 illustrates an example of a sequential decoding algorithm which may be used to perform A-GCC decoding, presented in pseudo-code as Algorithm 4. As can be seen in FIG. 16, Algorithm 4 may be similar to Algorithm 2 discussed above, except that the A-GCC systematic decoder of Algorithm 4 may be operate in consideration of $\Delta_i$. For example, the A-GCC systematic decoder of Algorithm 4 may use a different basic protection of the row decoder ($k_0 - \Delta_i \cdot m$ instead of $k_0$), and may use a different transform for each row ($P^i$ instead of P). Accordingly, an A-GCC decoding process may be similar to the GCC decoding process 1300 discussed above with respect to FIGS. 13A-13C, except that the A-GCC decoding process may be performed in consideration of $\Delta_i$.

FIG. 17 is a flowchart of a process for controlling a storage system, according to embodiments. According to embodiments, the process 1700 may be performed using any element described above, for example the storage device 200 discussed above with respect to FIG. 2A, the ECC encoding circuit 510 discussed above with respect to FIG. 2B, the ECC encoder module 822 discussed above with respect to FIG. 8, or any other element.

As shown in FIG. 17, at operation 1701, the process 1700 may include obtaining information bits. In embodiments, in embodiments, the information bits may be, for example, bits which are to be encoded using an A-GCC code.

As further shown in FIG. 17, at operation 1702, the process 1700 may include encoding the information bits using a first code to obtain a first plurality of code words. In embodiments, the first code may be a polar code, and the first plurality of code words may correspond to the polar code words discussed above with respect to FIGS. 15A-15C, but embodiments are not limited thereto. In embodiments, each code word of the first plurality of code words may be encoded using a different error protection level. In embodiments, the error protection level may correspond to the basic protection discussed above.

As further shown in FIG. 17, at operation 1703, the process 1700 may include transforming the first plurality of code words using a plurality of transformations. In embodiments, each code word of the first plurality of code words may be transformed using a different transform.

As further shown in FIG. 17, at operation 1704, the process 1700 may include encoding the transformed first plurality of code words using a second code to generate a second plurality of code words. In embodiments, the second code may be an RS code, and the second plurality of code words may correspond to the RS code words discussed above with respect to FIGS. 15A-15C, but embodiments are not limited thereto.

As further shown in FIG. 17, at operation 1705, the process 1700 may include updating the first plurality of code words based on the second plurality of code words to generate an A-GCC code word.

As further shown in FIG. 17, at operation 1706, the process 1700 may include controlling a memory interface to transmit the A-GCC code word to a storage device. In embodiments, the memory interface may correspond to the modulation module 823 discussed above with respect to FIG. 8, but embodiments are not limited thereto.

In embodiments, each code word of the updated first plurality of code words may be stored in a corresponding RAU included in the storage device.

In embodiments, the first plurality of code words may include a first code word and a second code word. The first code word may be encoded using a first error protection level (or basic protection), and may be stored in a first RAU having a first error probability. The second code word may be encoded using a second error protection level (or basic protection), and may be stored in a second RAU having a second error probability. In embodiments, the first error probability may be lower than the second error probability, and the first error protection level may be lower than the second error protection level.

In embodiments, the process 1700 may further include decoding the A-GCC code word. For example, in embodiments the process 1700 may further include obtaining the A-GCC code word from the storage device; obtaining a third plurality of code words from the A-GCC code word, wherein the third plurality of code words correspond to the first plurality of code words; transforming the third plurality of code words to obtain a fourth plurality of code words; decoding at least one code word of the third plurality of code words using the first code; updating the fourth plurality of code words based on the at least one code word; decoding the updated fourth plurality of code words using the second code; updating the third plurality of code words based on the decoded fourth plurality of code words; and obtaining the information bits based on the updated third plurality of code words. In embodiments, the third plurality of code words may correspond to the ECC noisy word (e.g., the ECC code word with errors) discussed above with respect to FIG. 8, and the A-GCC noisy code word discussed above with respect to FIG. 16 (e.g., the polar code words included in the A-GCC noisy code word). In embodiments, the fourth plurality of code words may correspond to the RS code words discussed above with respect to FIG. 16.

Figure 18:
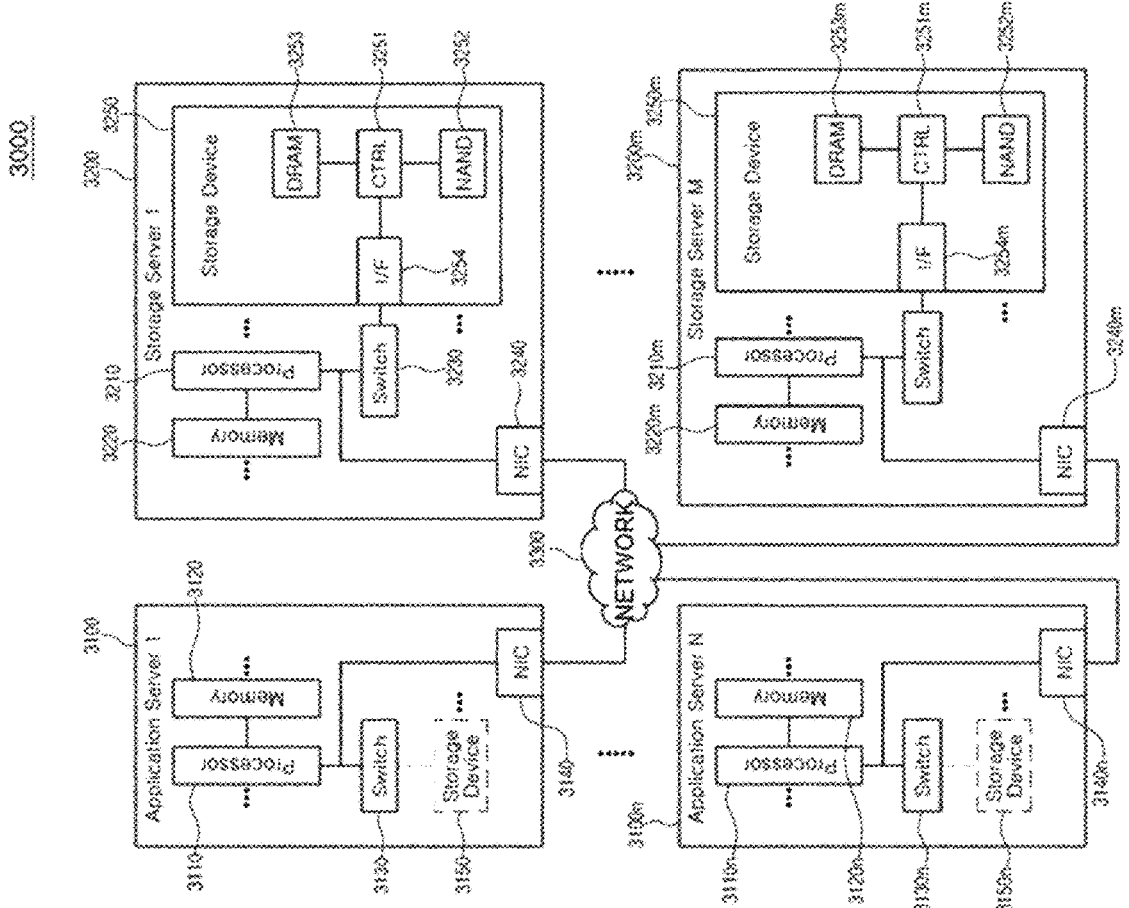
FIG. 18 is a block diagram of data center, according to embodiments.

FIG. 18 is a diagram of a data center 3000 to which a memory device is applied, according to embodiments.

Referring to FIG. 22, the data center 3000 may be a facility that collects various types of pieces of data and provides services and be referred to as a data storage center. The data center 3000 may be a system for operating a search engine and a database, and may be a computing system used by companies, such as banks, or government agencies. The data center 3000 may include application servers 3100 to 3100n and storage servers 3200 to 3200m. The number of application servers 3100 to 3100n and the number of storage servers 3200 to 3200m may be variously selected according to embodiments. The number of application servers 3100 to 3100n may be different from the number of storage servers 3200 to 3200m.

The application server 3100 or the storage server 3200 may include at least one of processors 3110 and 3210 and memories 3120 and 3220. The storage server 3200 will now be described as an example. The processor 3210 may control all operations of the storage server 3200, access the memory 3220, and execute instructions and/or data loaded in the memory 3220. The memory 3220 may be a double-data-rate synchronous DRAM (DDR SDRAM), a high-bandwidth memory (HBM), a hybrid memory cube (HMC), a dual in-line memory module (DIMM), Optane DIMM, and/or a non-volatile DIMM (NVMDIMM). In some embodiments, the numbers of processors 3210 and memories 3220 included in the storage server 3200 may be variously selected. In embodiments, the processor 3210 and the memory 3220 may provide a processor-memory pair. In embodiments, the number of processors 3210 may be different from the number of memories 3220. The processor 3210 may include a single-core processor or a multi-core processor. The above description of the storage server 3200 may be similarly applied to the application server 3100. In some embodiments, the application server 3100 may not include a storage device 3150. The storage server 3200 may include at least one storage device 3250. The number of storage devices 3250 included in the storage server 3200 may be variously selected according to embodiments.

The application servers 3100 to 3100n may communicate with the storage servers 3200 to 3200m through a network 3300. The network 3300 may be implemented by using a fiber channel (FC) or Ethernet. In this case, the FC may be a medium used for relatively high-speed data transmission and use an optical switch with high performance and high availability. The storage servers 3200 to 3200m may be provided as file storages, block storages, or object storages according to an access method of the network 3300.

In embodiments, the network 3300 may be a storage-dedicated network, such as a storage area network (SAN). For example, the SAN may be an FC-SAN, which uses an FC network and is implemented according to an FC protocol (FCP). As another example, the SAN may be an Internet protocol (IP)-SAN, which uses a transmission control protocol (TCP)/IP network and is implemented according to a SCSI over TCP/IP or Internet SCSI (iSCSI) protocol. In another embodiment, the network 3300 may be a general network, such as a TCP/IP network. For example, the network 3300 may be implemented according to a protocol, such as FC over Ethernet (FCOE), network attached storage (NAS), and NVMe over Fabrics (NVMe-oF).

Hereinafter, the application server 3100 and the storage server 3200 will mainly be described. A description of the application server 3100 may be applied to another application server 3100n, and a description of the storage server 3200 may be applied to another storage server 3200m.

The application server 3100 may store data, which is requested by a user or a client to be stored, in one of the storage servers 3200 to 3200m through the network 3300. Also, the application server 3100 may obtain data, which is requested by the user or the client to be read, from one of the storage servers 3200 to 3200m through the network 3300. For example, the application server 3100 may be implemented as a web server or a database management system (DBMS).

The application server 3100 may access a memory 3120n or a storage device 3150n, which is included in another application server 3100n, through the network 3300. Alternatively, the application server 3100 may access memories 3220 to 3220m or storage devices 3250 to 3250m, which are included in the storage servers 3200 to 3200m, through the network 3300. Thus, the application server 3100 may perform various operations on data stored in application servers 3100 to 3100n and/or the storage servers 3200 to 3200m. For example, the application server 3100 may execute an instruction for moving or copying data between the application servers 3100 to 3100n and/or the storage servers 3200 to 3200m. In this case, the data may be moved from the storage devices 3250 to 3250m of the storage servers 3200 to 3200m to the memories 3120 to 3120n of the application servers 3100 to 3100n directly or through the memories 3220 to 3220m of the storage servers 3200 to 3200m. The data moved through the network 3300 may be data encrypted for security or privacy.

The storage server 3200 will now be described as an example. An interface 3254 may provide physical connection between a processor 3210 and a controller 3251 and a physical connection between a network interface card (NIC) 3240 and the controller 3251. For example, the interface 3254 may be implemented using a direct attached storage (DAS) scheme in which the storage device 3250 is directly connected with a dedicated cable. For example, the interface 3254 may be implemented by using various interface schemes, such as ATA, SATA, e-SATA, an SCSI, SAS, PCI, PCIe, NVMe, IEEE 1394, a USB interface, an SD card interface, an MMC interface, an eMMC interface, a UFS interface, an eUFS interface, and/or a CF card interface.

The storage server 3200 may further include a switch 3230 and the NIC (Network InterConnect) 3240. The switch 3230 may selectively connect the processor 3210 to the storage device 3250 or selectively connect the NIC 3240 to the storage device 3250 via the control of the processor 3210.

In embodiments, the NIC 3240 may include a network interface card and a network adaptor. The NIC 3240 may be connected to the network 3300 by a wired interface, a wireless interface, a Bluetooth interface, or an optical interface. The NIC 3240 may include an internal memory, a digital signal processor (DSP), and a host bus interface and be connected to the processor 3210 and/or the switch 3230 through the host bus interface. The host bus interface may be implemented as one of the above-described examples of the interface 3254. In embodiments, the NIC 3240 may be integrated with at least one of the processor 3210, the switch 3230, and the storage device 3250.

In the storage servers 3200 to 3200*m* or the application servers 3100 to 3100*n*, a processor may transmit a command to storage devices 3150 to 3150*n* and 3250 to 3250*m* or the memories 3120 to 3120*n* and 3220 to 3220*m* and program or read data. In this case, the data may be data of which an error is corrected by an ECC engine. The data may be data on which a data bus inversion (DBI) operation or a data masking (DM) operation is performed, and may include cyclic redundancy code (CRC) information. The data may be data encrypted for security or privacy.

Storage devices 3150 to 3150*n* and 3250 to 3250*m* may transmit a control signal and a command/address signal to NAND flash memory devices 3252 to 3252*m* in response to a read command received from the processor. Thus, when data is read from the NAND flash memory devices 3252 to 3252*m*, a read enable (RE) signal may be input as a data output control signal, and thus, the data may be output to a DQ bus. A data strobe signal DQS may be generated using the RE signal. The command and the address signal may be latched in a page buffer depending on a rising edge or falling edge of a write enable (WE) signal.

The controller 3251 may control all operations of the storage device 3250. In embodiments, the controller 3251 may include SRAM. The controller 3251 may write data to the NAND flash memory device 3252 in response to a write command or read data from the NAND flash memory device 3252 in response to a read command. For example, the write command and/or the read command may be provided from the processor 3210 of the storage server 3200, the processor 3210*m* of another storage server 3200*m*, or the processors 3110 and 3110*n* of the application servers 3100 and 3100*n*. DRAM 3253 may temporarily store (or buffer) data to be written to the NAND flash memory device 3252 or data read from the NAND flash memory device 3252. Also, the DRAM 3253 may store metadata. Here, the metadata may be user data or data generated by the controller 3251 to manage the NAND flash memory device 3252. The storage device 3250 may include a secure element (SE) for security or privacy.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of example embodiments and is not to be construed as limiting thereof. Although a few example embodiments have been described, those skilled in the art will readily appreciate that many modifications are possible in the embodiments without materially departing from the present scope.

What is claimed is:

1. A storage system, comprising:
a storage device configured to store a plurality of code words; and
at least one processor configured to:
obtain information bits;
encode the information bits using a first code to obtain a first plurality of code words;
encode the first plurality of code words using a second code to generate a second plurality of code words;
update the first plurality of code words based on the second plurality of code words to generate an adaptive generalized concatenated code (A-GCC) code word; and
store the A-GCC code word in the storage device,
wherein each code word of the first plurality of code words is encoded using a different error protection level.

2. The storage system of claim 1, wherein each code word of the updated first plurality of code words is stored in a corresponding random access unit (RAU) included in a storage device.

3. The storage system of claim 2, wherein the first plurality of code words comprises a first code word and a second code word,
wherein the first code word is encoded using a first error protection level, and is stored in a first RAU having a first error probability,
wherein the second code word is encoded using a second error protection level, and is stored in a second RAU having a second error probability, and
wherein the first error probability is lower than the second error probability, and the first error protection level is lower than the second error protection level.

4. The storage system of claim 1, wherein the first plurality of code words are transformed to generate the second plurality of code words.

5. The storage system of claim 4, wherein a different transform is applied to each of the first plurality of code words.

6. The storage system of claim 1, wherein the at least one processor is further configured to:
obtain the A-GCC code word from the storage device;
obtain a third plurality of code words from the A-GCC code word, wherein the third plurality of code words correspond to the first plurality of code words;

transform the third plurality of code words to obtain a fourth plurality of code words;
decode at least one code word of the third plurality of code words using the first code;
update the fourth plurality of code words based on the at least one code word;
decode the updated fourth plurality of code words using the second code;
update the third plurality of code words based on the decoded fourth plurality of code words; and
obtain the information bits based on the updated third plurality of code words.

7. The storage system of claim 1, wherein at least one of the first code and the second code comprises at least one of a polar code, a polar sub-code, a Reed-Solomon (RS) code, a Bose-Chaudhuri-Hocquenghem (BCH) code, and a generalized concatenated code (GCC).

8. The storage system of claim 1, wherein the first code comprises a polar code and the second code comprises a Reed-Solomon (RS) code, and
wherein to encode the information bits, the at least one processor is further configured to:
apply the polar code to the information bits to generate first parity bits; and
place the first parity bits in the first plurality of code words, and
wherein to encode the first plurality of code words using the second code, the at least one processor is further configured to:
apply a plurality of transforms to the first plurality of code words to generate a plurality of symbols in a transform space;
group the plurality of symbols into the second plurality of code words;
apply the RS code to the second plurality of code words to generate second parity bits;
transform the second parity bits; and
place the transformed second parity bits in the first plurality of code words to generate the updated first plurality of code words.

9. A device for encoding information bits for storage in a storage device, the device comprising:
a memory interface configured to communicate with the storage device; and
at least one processor configured to:
obtain the information bits;
encode the information bits using a first code to obtain a first plurality of code words;
transform the first plurality of code words using a plurality of transformations, wherein each code word from among the first plurality of code words is transformed using a different transformation from among the plurality of transformations;
encode the transformed first plurality of code words using a second code to generate a second plurality of code words;
update the first plurality of code words based on the second plurality of code words to generate an adaptive generalized concatenated code (A-GCC) code word; and
control the memory interface to transmit the A-GCC code word to the storage device.

10. The device of claim 9, wherein each code word of the updated first plurality of code words is stored in a corresponding random access unit (RAU) included in the storage device.

11. The device of claim 10, wherein the first plurality of code words comprises a first code word and a second code word, wherein the first code word is encoded using a first error protection level, and is stored in a first RAU having a first error probability, wherein the second code word is encoded using a second error protection level, and is stored in a second RAU having a second error probability, and wherein the first error probability is lower than the second error probability, and the first error protection level is lower than the second error protection level.

12. The device of claim 9, wherein the at least one processor is further configured to:

obtain the A-GCC code word from the storage device;

obtain a third plurality of code words from the A-GCC code word, wherein the third plurality of code words correspond to the first plurality of code words;

transform the third plurality of code words to obtain a fourth plurality of code words;

decode at least one code word of the third plurality of code words using the first code;

update the fourth plurality of code words based on the at least one code word;

decode the updated fourth plurality of code words using the second code;

update the third plurality of code words based on the decoded fourth plurality of code words; and obtain the information bits based on the updated third plurality of code words.

13. The device of claim 9, wherein at least one of the first code and the second code comprises at least one of a polar code, a polar sub-code, a Reed-Solomon (RS) code, a Bose-Chaudhuri-Hocquenghem (BCH) code, and a generalized concatenated code (GCC).

14. The device of claim 9, wherein the first code comprises a polar code and the second code comprises a Reed-Solomon (RS) code, and wherein to encode the information bits, the at least one processor is further configured to:

apply the polar code to the information bits to generate first parity bits; and place the first parity bits in the first plurality of code words, and wherein to encode the first plurality of code words using the second code, the at least one processor is further configured to:

apply a plurality of transforms to the first plurality of code words to generate a plurality of symbols in a transform space;

group the plurality of symbols into the second plurality of code words;

apply the RS code to the second plurality of code words to generate second parity bits;

transform the second parity bits; and place the transformed second parity bits in the first plurality of code words to generate the updated first plurality of code words.

15. A method for encoding information bits for storage in a storage device, the method being executed by at least one processor and comprising:

obtaining the information bits;

encoding the information bits using a first code to obtain a first plurality of code words;

transforming the first plurality of code words using a plurality of transformations, wherein each code word from among the first plurality of code words is transformed using a different transformation from among the plurality of transformations;

encoding the transformed first plurality of code words using a second code to generate a second plurality of code words;

updating the first plurality of code words based on the second plurality of code words to generate an adaptive generalized concatenated code (A-GCC) code word; and controlling a memory interface to transmit the A-GCC code word to a storage device.

16. The method of claim 15, wherein each code word of the updated first plurality of code words is stored in a corresponding random access unit (RAU) included in the storage device.

17. The method of claim 16, wherein the first plurality of code words comprises a first code word and a second code word, wherein the first code word is encoded using a first error protection level, and is stored in a first RAU having a first error probability, wherein the second code word is encoded using a second error protection level, and is stored in a second RAU having a second error probability, and wherein the first error probability is lower than the second error probability, and the first error protection level is lower than the second error protection level.

18. The method of claim 15, further comprising:

obtaining the A-GCC code word from the storage device;

obtaining a third plurality of code words from the A-GCC code word, wherein the third plurality of code words correspond to the first plurality of code words;

transforming the third plurality of code words to obtain a fourth plurality of code words;

decoding at least one code word of the third plurality of code words using the first code;

updating the fourth plurality of code words based on the at least one code word;

decoding the updated fourth plurality of code words using the second code;

updating the third plurality of code words based on the decoded fourth plurality of code words; and obtaining the information bits based on the updated third plurality of code words.

19. The method of claim 15, wherein at least one of the first code and the second code comprises at least one of a polar code, a polar sub-code, a Reed-Solomon (RS) code, a Bose-Chaudhuri-Hocquenghem (BCH) code, and a generalized concatenated code (GCC).

20. The method of claim 15, wherein the first code comprises a polar code and the second code comprises a Reed-Solomon (RS) code, and wherein the encoding the information bits comprises:

applying the polar code to the information bits to generate first parity bits; and placing the first parity bits in the first plurality of code words, and wherein the encoding the first plurality of code words using the second code comprises:

applying a plurality of transforms to the first plurality of code words to generate a plurality of symbols in a transform space;

grouping the plurality of symbols into the second plurality of code words;

applying the RS code to the second plurality of code words to generate second parity bits;

transforming the second parity bits; and placing the transformed second parity bits in the first plurality of code words to generate the updated first plurality of code words.

\* \* \* \* \*